United States Patent
Choi et al.

(10) Patent No.: US 12,444,725 B2
(45) Date of Patent: Oct. 14, 2025

(54) DISPLAY DEVICE AND METHOD OF FABRICATING THE SAME

(71) Applicant: Samsung Display Co., LTD., Yongin-si (KR)

(72) Inventors: Jin Woo Choi, Seoul (KR); Sung Kook Park, Suwon-si (KR); Sung Eun Baek, Suwon-si (KR); Byeong Hwa Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 460 days.

(21) Appl. No.: 17/827,159

(22) Filed: May 27, 2022

(65) Prior Publication Data

US 2023/0049315 A1 Feb. 16, 2023

(30) Foreign Application Priority Data

Aug. 10, 2021 (KR) .......................... 10-2021-0105373

(51) Int. Cl.
*H01L 25/18* (2023.01)
*H01L 23/00* (2006.01)
*H10H 29/14* (2025.01)

(52) U.S. Cl.
CPC .............. *H01L 25/18* (2013.01); *H01L 24/05* (2013.01); *H01L 24/08* (2013.01); *H01L 24/13* (2013.01); *H01L 24/16* (2013.01); *H10H 29/142* (2025.01); *H01L 24/06* (2013.01); *H01L 24/80* (2013.01); *H01L 24/81* (2013.01); *H01L 2224/05073* (2013.01); *H01L 2224/05561* (2013.01); *H01L 2224/05573* (2013.01); *H01L 2224/05611* (2013.01); *H01L 2224/05639* (2013.01); *H01L 2224/05644* (2013.01); *H01L 2224/05647* (2013.01); *H01L 2224/05666* (2013.01); *H01L 2224/05669* (2013.01);

(Continued)

(58) Field of Classification Search
None
See application file for complete search history.

(56) References Cited

U.S. PATENT DOCUMENTS 9,431,469 B2 8/2016 Park et al.
9,818,803 B2 11/2017 Lee
(Continued)

FOREIGN PATENT DOCUMENTS

CN 113506539 A * 10/2021
KR 2017-0084139 A 7/2017
(Continued)

*Primary Examiner* — Hung K Vu
(74) *Attorney, Agent, or Firm* — Womble Bond Dickinson (US) LLP

(57) ABSTRACT

A display device includes first pixel circuit unit, second pixel circuit unit, third pixel circuit unit, and fourth pixel circuit unit spaced from one another, first pixel electrode on the first pixel circuit unit, second pixel electrode on the second pixel circuit unit, third pixel electrode on the third pixel circuit unit, fourth pixel electrode on the fourth pixel circuit unit, first light-emitting element electrically connected to the first pixel electrode, the first light-emitting element configured to emit first light, second light-emitting element electrically connected to the second pixel electrode, the second light-emitting element configured to emit second light, and third light-emitting element electrically connected to the third pixel electrode, the third light-emitting element configured to emit third light. A length of the first light-emitting element in a first direction is greater than each of a length of the second and third light-emitting elements in the first direction.

12 Claims, 32 Drawing Sheets

(52) U.S. Cl.
CPC ............... *H01L 2224/06163* (2013.01); *H01L 2224/08123* (2013.01); *H01L 2224/08148* (2013.01); *H01L 2224/13082* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13166* (2013.01); *H01L 2224/13169* (2013.01); *H01L 2224/16148* (2013.01); *H01L 2224/8013* (2013.01); *H01L 2224/80801* (2013.01); *H01L 2224/8113* (2013.01); *H01L 2224/81801* (2013.01); *H01L 2924/0132* (2013.01)

(56) References Cited

U.S. PATENT DOCUMENTS

| | | | |
|---|---|---|---|
| 10,622,343 | B2 | 4/2020 | Zhang et al. |
| 10,734,458 | B2 | 8/2020 | Kang et al. |
| 10,832,616 | B2 | 11/2020 | Lee |
| 10,854,683 | B2 | 12/2020 | Lee |
| 11,287,911 | B2 | 3/2022 | Kang et al. |
| 11,871,635 | B2 | 1/2024 | Kim et al. |
| 12,124,645 | B2 | 10/2024 | Kang et al. |
| 12,144,223 | B2 | 11/2024 | Kim et al. |
| 2018/0175123 | A1 | 6/2018 | Yoon et al. |
| 2019/0244941 | A1 | 8/2019 | Zhang et al. |
| 2022/0115564 | A1 | 4/2022 | Jeon et al. |
| 2022/0352424 | A1 | 11/2022 | Choi et al. |
| 2025/0013326 | A1 | 1/2025 | Kang et al. |

FOREIGN PATENT DOCUMENTS

| | | |
|---|---|---|
| KR | 2017-0101064 A | 9/2017 |
| KR | 2017-0127954 A | 11/2017 |
| KR | 2018-0118488 A | 10/2018 |
| KR | 2019-0014216 A | 2/2019 |
| KR | 2019-0038365 A | 4/2019 |
| KR | 2021-0002232 A | 1/2021 |

* cited by examiner

DISPLAY DEVICE AND METHOD OF FABRICATING THE SAME

CROSS-REFERENCE TO RELATED APPLICATION

This application claims priority to and the benefit of Korean Patent Application No. 10-2021-0105373 filed on Aug. 10, 2021, in the Korean Intellectual Property Office (KIPO), the entire content of which is incorporated by reference herein.

BACKGROUND

1. Field

The present disclosure relates to a display device and a method of fabricating the same.

2. Description of the Related Art

As the information society has developed, the demand for display devices for displaying images has diversified. Here, the display devices may be flat panel display devices such as a liquid crystal display (LCD) device, a field emission display (FED) device, or a light-emitting display device, and the light-emitting display device may be one of an organic light-emitting display device including organic light-emitting diodes (OLEDs) as light-emitting elements, an inorganic light-emitting display device including inorganic semiconductor elements as light-emitting elements, and a microscopic light-emitting diode (micro LED) display device including micro LEDs as light-emitting elements.

Meanwhile, head-mounted displays (HMDs) equipped with light-emitting display devices have been developed. HMDs are devices that can be worn like glasses or a helmet and forms a focus at a close distance from the eyes of a user for providing virtual reality (VR) or augmented reality (AR).

A high-resolution micro LED display panel including micro LEDs can be applied to an HMD. In a case where the micro LEDs emit light of a single light, wavelength conversion layers for converting the wavelength of light emitted from the micro LEDs are essential. Partition walls having a high aspect ratio are needed to define the wavelength conversion layers. However, it is difficult to fabricate such partition walls.

SUMMARY

Aspects and features of embodiments of the present disclosure include a display device, which includes microscopic light-emitting diodes (micro LEDs) emitting red-wavelength light, micro LEDs emitting green-wavelength light, and micro LEDs emitting blue-wavelength light and is thus not in need of wavelength conversion layers and partition walls and a method of fabricating the display device.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a first pixel circuit unit, a second pixel circuit unit, a third pixel circuit unit, and a fourth pixel circuit unit spaced from one another, a first pixel electrode on the first pixel circuit unit, a second pixel electrode on the second pixel circuit unit, a third pixel electrode on the third pixel circuit unit, a fourth pixel electrode on the fourth pixel circuit unit, a first light-emitting element electrically connected to the first pixel electrode, the first light-emitting element being configured to emit first light, a second light-emitting element electrically connected to the second pixel electrode, the second light-emitting element being configured to emit second light, and a third light-emitting element electrically connected to the third pixel electrode, the third light-emitting element being configured to emit third light. A length of the first light-emitting element in a first direction is greater than each of a length of the second light-emitting element and a length of the third light-emitting element in the first direction. A length of the first light-emitting element in a second direction is greater than a length of the third light-emitting element in the second direction. The second direction is orthogonal to the first direction.

The length of the first light-emitting element in the second direction may be the same as a length of the second light-emitting element in the second direction. The length of the second light-emitting element in the first direction may be the same as the length of the third light-emitting element in the first direction.

The length of the first light-emitting element in the first direction may be 1.5 times or greater each of the length of the second light-emitting element and the length of the third light-emitting element in the first direction. The length of the first light-emitting element in the second direction may be 1.5 times or greater the length of the third light-emitting element in the second direction.

The first light may be light of a red wavelength range. The second light may be light of a green wavelength range. The third light may be light of a blue wavelength range.

The first pixel electrode may be located close to a first side of the first pixel circuit unit. The second pixel electrode may be located close to a second side of the second pixel circuit unit. The second side of the second pixel circuit unit may be opposite to a first side of the second pixel circuit unit that is close to the first side of the first pixel circuit unit.

The display device may further include a fourth light-emitting element electrically connected to the fourth pixel electrode, the fourth light-emitting element being configured to emit the second light. The third pixel electrode may be located close to middle parts of the third pixel circuit unit. The fourth pixel electrode may be located close to a second side of the fourth pixel circuit units. The second side of the fourth pixel circuit units may be opposite to a first side of the fourth pixel circuit unit that is close to the first side of the first pixel circuit unit.

The display device may further include a first pixel connecting electrode located between the first pixel electrode and the first light-emitting element, and a second pixel connecting electrode located between the second pixel electrode and the second light-emitting element.

The first pixel connecting electrode may extend to first side of the first pixel circuit unit. The second pixel connecting electrode may extend to second side of the second pixel circuit unit. The second side of the second pixel circuit unit may be opposite to first side of the second pixel circuit unit that are close to the first side of the first pixel circuit unit.

The display device may further include a fourth light-emitting element electrically connected to the fourth pixel electrode, the fourth light-emitting element being configured to emit the second light, third pixel connecting electrode located between the third pixel electrode and the third light-emitting element, and fourth pixel connecting electrode located between the fourth pixel electrode and the fourth light-emitting element.

The third pixel connecting electrode may be located close to middle parts of the third pixel circuit unit. The fourth pixel connecting electrode may extend to second side of the fourth pixel circuit unit. The second side of the fourth pixel circuit unit may be opposite to first side of the fourth pixel circuit unit that is close to first side of the first pixel circuit unit.

An area of the first pixel connecting electrode may be greater than each an area of the second pixel connecting electrode, an area of the third pixel connecting electrode, and an area of the fourth pixel connecting electrode.

An area of the third pixel connecting electrode may be smaller than each of an area of the first pixel connecting electrode, an area of the second pixel connecting electrode, and an area of the fourth pixel connecting electrode.

According to one or more embodiments of the present disclosure, there is provided a display device including a first pixel circuit unit, a second pixel circuit unit, a third pixel circuit unit, and a fourth pixel circuit unit spaced from one another, a first pixel electrode on the first pixel circuit unit, a second pixel electrode on the second pixel circuit unit, a third pixel electrode on the third pixel circuit unit, a fourth pixel electrode on the fourth pixel circuit unit, first light-emitting elements connected in common to the first pixel electrode, the first light-emitting elements being configured to emit first light, second light-emitting elements connected in common to the second pixel electrode, the second light-emitting elements being configured to emit second light, a third light-emitting element connected to the third pixel electrode, the third light-emitting element being configured to emit third light, and fourth light-emitting elements connected in common to the fourth pixel electrode, the fourth light-emitting elements being configured to emit the second light.

A number of first light-emitting elements may be greater than a number of second light-emitting elements.

An area of each of the first light-emitting elements may be the same as an area of each of the second light-emitting elements.

The area of each of the first light-emitting elements may be the same as an area of the third light-emitting element.

The display device may further include a first pixel connecting electrode located between the first pixel electrode and a first light-emitting element of the first light-emitting elements, a second pixel connecting electrode located between the second pixel electrode and a second light-emitting element of the second light-emitting elements, a third pixel connecting electrode located between the third pixel electrode and the third light-emitting element, and fourth pixel connecting electrode located between the fourth pixel electrode and a fourth light-emitting element of the fourth light-emitting elements.

An area of the first pixel connecting electrode may be greater than each of an area of the second pixel connecting electrode, an area of the third pixel connecting electrode, and an area of the fourth pixel connecting electrode.

Each of the area of the second pixel connecting electrode and the area of the fourth pixel connecting electrode may be greater than the area of the third pixel connecting electrode.

According to one or more embodiments of the present disclosure, there is provided a display device including: forming a first-type semiconductor layer on a light-emitting element substrate, forming a first insulating film on the first-type semiconductor layer, and forming a first through hole penetrating the first insulating film, forming a first light-emitting element in the first through hole, the first light-emitting element including a first semiconductor layer, an active layer, and a second semiconductor layer, forming a second insulating film covering the first light-emitting element, and forming a second through hole penetrating the first and second insulating film, forming a second light-emitting element in the second through hole, forming a third insulating film covering the second light-emitting element, and forming a third through hole penetrating the first, second, and third insulating films, the second light-emitting element including a first semiconductor layer, an active layer, and a second semiconductor layer, forming a third light-emitting element in the third through hole and removing the first, second, and third insulating films, the third light-emitting element including a first semiconductor layer, an active layer, and a second semiconductor layer, forming a contact electrode on a top surface of each of the first light-emitting element, the second light-emitting element, and the third light-emitting element, forming a first pixel connecting electrode on the contact electrode and forming a second pixel connecting electrode on a pixel electrode on a semiconductor circuit board, and aligning the semiconductor circuit board and the light-emitting element substrate and forming a connecting electrode by bonding the first pixel connecting electrode and the second pixel connecting electrode by heat. An area of the first light-emitting element is greater than each of an area of the second light-emitting element and an area of the third light-emitting element.

An indium content of the active layer of the first light-emitting element may be greater than an indium content of the active layer of the second light-emitting element. The indium content of the active layer of the second light-emitting element may be greater than an indium content of the active layer of the third light-emitting element.

According to the aforementioned and other embodiments of the present disclosure, as first light-emitting elements, which emit first light, second light-emitting elements, which emit second light, and third light-emitting elements, which emit third light, are provided, various colors can be displayed without the need of wavelength conversion layers, and as a result, no partition walls are needed for such wavelength conversion layers.

Also, according to the aforementioned and other embodiments of the present disclosure, as the area of the first light-emitting element is greater than each of the area of the second light-emitting element, the area of the third light-emitting element, and the area of the fourth light-emitting element, the current density in the first light-emitting element can be lowered, and as a result, the internal quantum efficiency of the first light-emitting element can be improved.

BRIEF DESCRIPTION OF THE DRAWINGS

The above and other embodiments and features of the present disclosure will become more apparent by describing embodiments thereof with reference to the attached drawings, in which.

DETAILED DESCRIPTION

Figure 1:
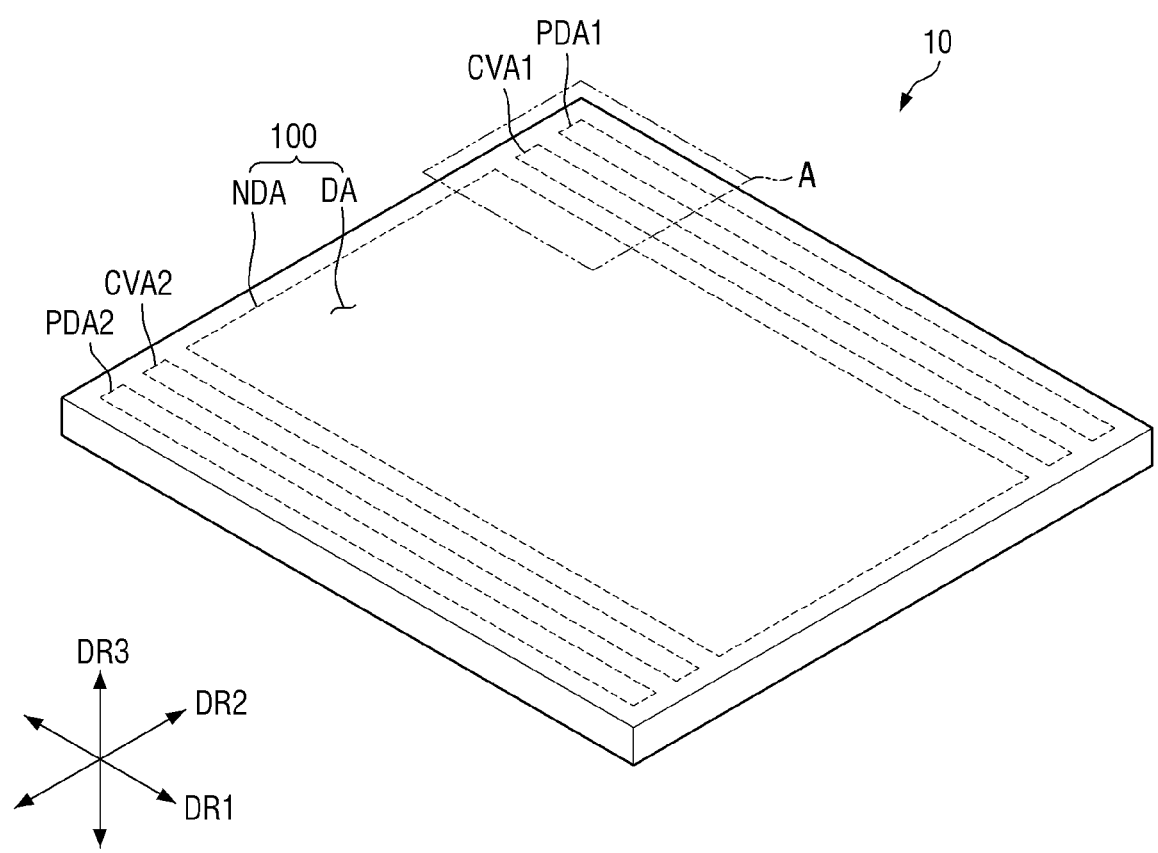
FIG. 1 is a perspective view of a display device according to one or more embodiments of the present disclosure.

Aspects and features of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of embodiments of the present disclosure to those skilled in the art. Accordingly, processes, elements, and techniques that are not necessary to those having ordinary skill in the art for a complete understanding of the aspects and features of embodiments of the present disclosure might not be described.

Unless otherwise noted, like reference numerals, characters, or combinations thereof denote like elements throughout the attached drawings and the written description, and thus, descriptions thereof will not be repeated. Further, parts not related to the description of some embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept as well as aspects and features of embodiments of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "a plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to one or more embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
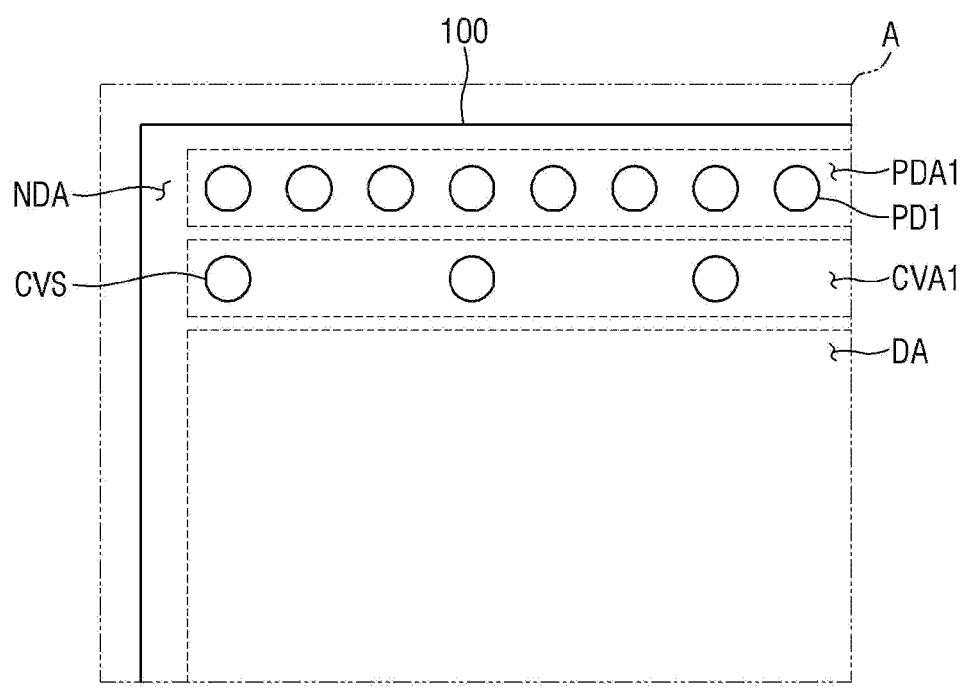
FIG. 2 is a layout view of an area A of FIG. 1.
Figure 2:
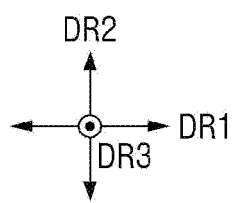

FIG. 1 is a perspective view of a display device according to one or more embodiments of the present disclosure. FIG. 2 is a layout view of an area A of FIG. 1.

FIGS. 1 and 2 illustrate a display device including microscopic light-emitting diodes (micro LEDs) or nano-light-emitting diodes (nano LEDs), but the present disclosure is not limited thereto.

FIGS. 1 and 2 also illustrate a light-emitting diode-on-silicon (LEDoS) display device in which light-emitting diodes (LEDs) are disposed on a semiconductor circuit board obtained by semiconductor processes using a silicon wafer, but the present disclosure is not limited thereto.

Referring to FIGS. 1 and 2, a first direction DR1 may refer to the horizontal direction of a display panel 100, a second direction DR2 may refer to the vertical direction of the display panel 100, and a third direction DR3 may refer to the thickness direction of the display panel 100 or the semiconductor circuit board. In this case, the terms "left", "right", "upper", and "lower" may refer to a first side in the first direction DR1, a second side in the first direction DR1, a first side in the second direction DR2, and a second side in the second direction DR2, respectively. Also, the terms "upper" and "lower" may refer to a first side in the third direction DR3 and a second side in the third direction DR3, respectively.

A display device 10 includes the display panel 100, which includes a display area DA and a non-display area NDA around the edge or periphery of the display area DA.

In a plan view, the display panel 100 may have a rectangular shape having long sides in the first direction DR1 and short sides in the second direction DR2, but the planar shape of the display panel 100 is not particularly limited. That is, the display panel 100 may have various other shapes such as a non-tetragonal polygonal shape, a circular shape, an elliptical shape, or an atypical shape in a plan view.

The display area DA may be an area where an image is displayed, and the non-display area NDA may be an area where an image is not displayed. The planar shape of the display area DA may conform to the planar shape of the display panel 100. FIG. 1 illustrates that the display area DA has a rectangular shape in a plan view. The display area DA may be disposed in the middle (or the central region) of the display panel 100. The non-display area NDA may be disposed around the display area DA. The non-display area NDA may be disposed to surround the display area DA along the edge or periphery of the display area DA.

Figure 3:
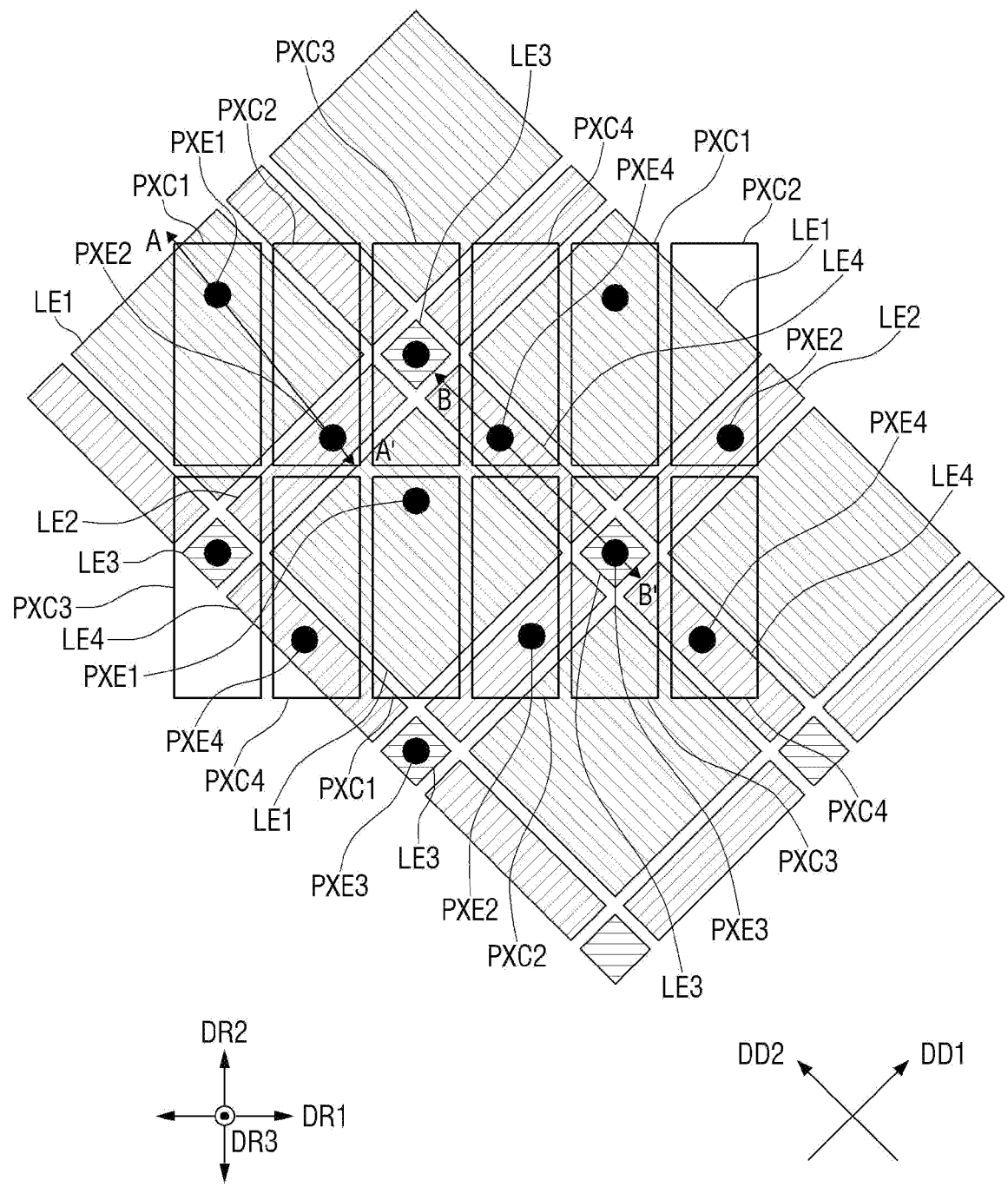
FIG. 3 is a layout view of a display area of a display panel according to one or more embodiments of the present disclosure.

The display area DA of the display panel 100 may include a plurality of pixels (PX of FIG. 3). The pixels may be defined as minimal emission units capable of displaying white light. The pixels will be described later with reference to FIG. 3.

The non-display area NDA may include a first common voltage supply area CVA1, a second common voltage supply area CVA2, a first pad area PDA1, and a second pad area PDA2.

The first common voltage supply area CVA1 may be disposed between the first pad area PDA1 and the display area DA in the second direction DR2. The second common voltage supply area CVA2 may be disposed between the second pad area PDA2 and the display area DA in the second direction DR2. Each of the first and second common voltage supply areas CVA1 and CVA2 may include a plurality of common voltage supply units CVS. A common voltage may be supplied to a common electrode layer (CEL of FIG. 8) through the common voltage supply units CVS.

The common voltage supply units CVS of the first common voltage supply area CVA1 may be electrically connected to one of first pads PD1 of the first pad area PDA1. That is, the common voltage supply units CVS of the first common voltage supply area CVA1 may receive the common voltage from one of the first pads PD1 of the first pad area PDA1.

The common voltage supply units CVS of the second common voltage supply area CVA2 may be electrically connected to one of second pads of the second pad area PDA2. That is, the common voltage supply units CVS of the second common voltage supply area CVA2 may receive the common voltage from one of the second pads of the second pad area PDA2.

The first pad area PDA1 may be disposed in an upper portion of the display panel 100 in the second direction DR2. The first pad area PDA1 may include first pads PD1, which are connected to an external circuit board.

The second pad area PDA2 may be disposed in a lower portion of the display panel 100 in the second direction DR2. The second pad area PDA2 may include second pads, which are to be connected to the external circuit board. In one or more embodiments, the second pad area PDA2 may not be provided.

FIG. 3 is a layout view of a display area of a display panel according to one or more embodiments of the present disclosure.

Referring to FIG. 3, a display area DA may include a plurality of pixels PX. Each of the pixels PX may include a plurality of pixel circuit units (PXC1, PXC2, PXC3, and PXC4), i.e., first pixel circuit units PXC1, second pixel circuit units PXC2, third pixel circuit units PXC3, and fourth pixel circuit units PXC4, a plurality of pixel electrodes (LE1, LE2, LE3, and LE4), i.e., first pixel electrodes PXE1, second pixel electrodes PXE2, third pixel electrodes PXE3, and fourth pixel electrodes PXE4, and a plurality of light-emitting elements, i.e., first light-emitting elements LE1, second light-emitting elements LE2, third light-emitting elements LE3, and fourth light-emitting elements LE4. FIG. 3 illustrates that each of the pixels PX includes four types of pixel circuit units, four types of pixel electrodes, and four types of light-emitting elements, but the numbers of types of pixel circuit units, pixel electrodes, and light-emitting elements included in each of the pixels PX are not particularly limited.

The first pixel circuit units PXC1, the second pixel circuit units PXC2, the third pixel circuit units PXC3, and the fourth pixel circuit units PXC4 may be alternately arranged along the first direction DR1. For example, the first pixel circuit units PXC1, the second pixel circuit units PXC2, the third pixel circuit units PXC3, and the fourth pixel circuit units PXC4 may be arranged repeatedly in the order of first, second, third and fourth pixel units PXC1, PXC2, PXC3, and PXC4 along the first direction DR1.

Each of the first pixel circuit units PXC1, the second pixel circuit units PXC2, the third pixel circuit units PXC3, and the fourth pixel circuit units PXC4 may have a rectangular shape having two sides in the first direction DR1 and two sides in the second direction DR2, in a plan view. Each of the length of the first pixel circuit unit PXC1, the length the second pixel circuit unit PXC2, the length of the third pixel circuit unit PXC3, and the length of the fourth pixel circuit unit PXC4 in the first direction DR1 may be smaller than each of the length of the first pixel circuit unit PXC1, the length of the second pixel circuit unit PXC2, the length of the third pixel circuit unit PXC3, the length of the fourth pixel circuit unit PXC4 in the second direction DR2.

Each of the first pixel circuit units PXC1, the second pixel circuit units PXC2, the third pixel circuit units PXC3, and the fourth pixel circuit units PXC4 may include a complementary metal-oxide semiconductor (CMOS) circuit formed by a semiconductor process. Alternatively, each of the first pixel circuit units PXC1, the second pixel circuit units PXC2, the third pixel circuit units PXC3, and the fourth pixel circuit units PXC4 may include a thin-film transistor (TFT) circuit formed by a TFT process.

Each of the first pixel circuit units PXC1, the second pixel circuit units PXC2, the third pixel circuit units PXC3, and the fourth pixel circuit units PXC4 may include at least one transistor. Each of the first pixel circuit units PXC1, the second pixel circuit units PXC2, the third pixel circuit units PXC3, and the fourth pixel circuit units PXC4 may further include at least one capacitor.

Figure 4:
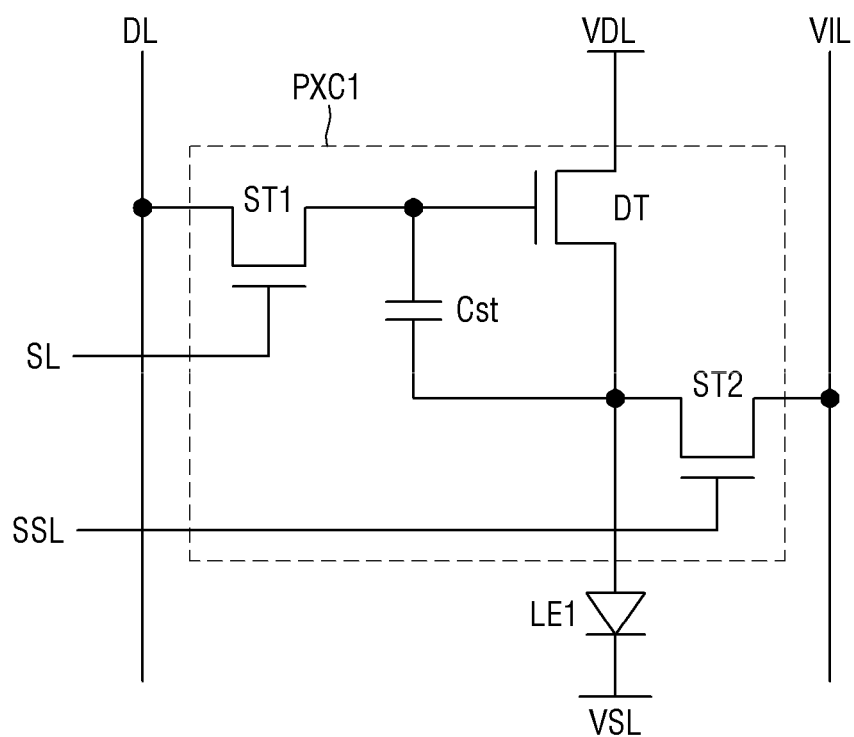
FIG. 4 is a circuit diagram illustrating a first light-emitting element and a first pixel circuit unit of FIG. 3.

Referring to FIG. 4, in one example, each of the first pixel circuit units PXC1 may include a driving transistor DT, a first transistor ST1, a second transistor ST2, and a capacitor Cst.

A first light-emitting element LE1 emits light in accordance with a driving current Ids. The amount of light emitted by the first light-emitting element LE1 may be proportional to the driving current Ids. The anode of the first light-emitting element LE1 may be connected to the drain electrode of the driving transistor DT, and the cathode of the first light-emitting element LE1 may be connected to a second power supply line VSL, to which a low-potential voltage lower than a high-potential voltage is supplied.

The driving transistor DT may control a current flowing from a first power supply line VDL, to which a first power supply voltage is supplied, to the first light-emitting element LE1, in accordance with the difference in voltage between the gate electrode and the source electrode of the driving transistor DT. The gate electrode of the driving transistor DT may be connected to the first electrode of the first transistor ST1, the source electrode of the driving transistor DT may be connected to the anode of the first light-emitting element LE1, and the drain electrode of the driving transistor DT may be connected to the first power supply line VDL.

The first transistor ST1 may be turned on by a scan signal from a scan line SL to connect the data line DL to the gate electrode of the driving transistor DT. The gate electrode of the first transistor ST1 may be connected to the scan line SL, the first electrode of the first transistor ST1 may be connected to the gate electrode of the driving transistor DT, and the second electrode of the first transistor ST1 may be connected to the data line DL.

The second transistor ST2 may be turned on by a sensing signal from a sensing signal line SSL to connect an initialization voltage line VIL to the source electrode of the driving transistor DT. The gate electrode of the second transistor ST2 may be connected to the sensing signal line SSL, the first electrode of the second transistor ST2 may be connected to the initialization voltage line VIL, and the second electrode of the second transistor ST2 may be connected to the source electrode of the driving transistor DT.

The first electrodes of the first and second transistors ST1 and ST2 may be, but are not limited to, source electrodes, and the second electrodes of the first and second transistors ST1 and ST2 may be, but are not limited to, drain electrodes. Alternatively, the first electrodes of the first and second transistors ST1 and ST2 may be drain electrodes, and the second electrodes of the first and second transistors ST1 and ST2 may be source electrodes.

The capacitor Cst is formed between the gate electrode and the drain electrode of the driving transistor DT. The capacitor Cst stores a differential voltage (or charge) between the voltage at the gate electrode of the driving transistor DT and the voltage at the drain electrode of the driving transistor DT.

FIG. 4 illustrates that the driving transistor DT and the first and second transistors ST1 and ST2 are formed as P-type metal-oxide semiconductor field-effect transistors (MOSFETs), but the present disclosure is not limited thereto. Alternatively, the driving transistor DT and the first and second transistors ST1 and ST2 may be formed as N-type MOSFETs.

Figure 5:
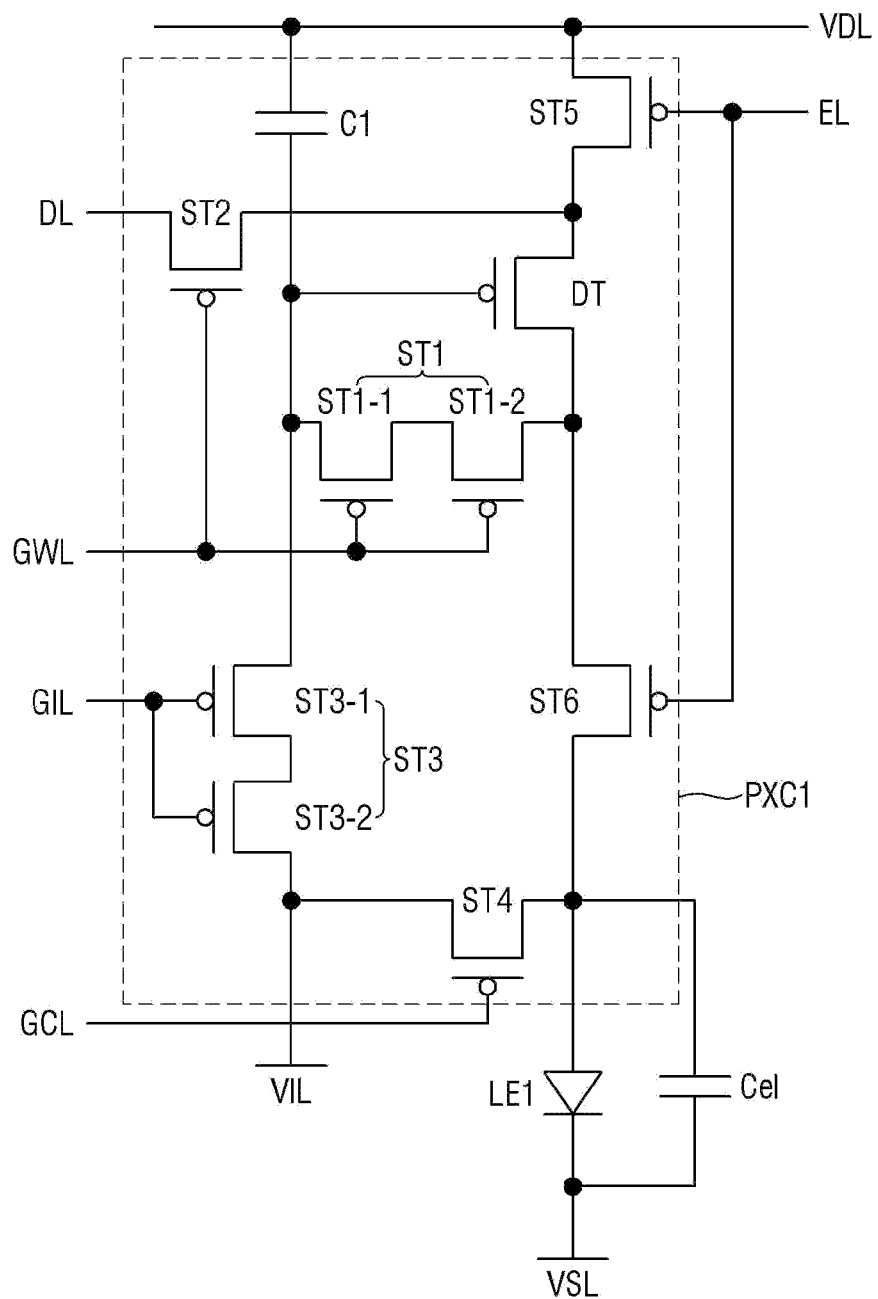
FIG. 5 is a circuit diagram illustrating a first light-emitting element and a first pixel circuit unit of FIG. 3.

Referring to FIG. 5, in another example, each of the first pixel circuit units PXC1 may include a driving transistor DT, switching elements, and a capacitor C1. The switching elements may include first through sixth transistors ST1 (e.g., ST1-1, ST1-2) through ST6.

The driving transistor DT includes a gate electrode, a first electrode, and a second electrode. The driving transistor DT controls a drain-source current Ids flowing between the first and second electrodes, in accordance with a data voltage applied to the gate electrode.

The capacitor C1 is formed between the gate electrode of the driving transistor DT and a first power supply line VDL. The second electrode of the capacitor C1 may be connected to the gate electrode of the driving transistor DT, and the first electrode of the capacitor C1 may be connected to the first power supply line VDL.

In a case where the first electrodes of the first through sixth transistors ST1 through ST6 and the driving transistor DT are source electrodes, the second electrodes of the first through sixth transistors ST1 through ST6 and the driving transistor DT are drain electrodes. Alternatively, in a case where the first electrodes of the first through sixth transistors ST1 through ST6 and the driving transistor DT are drain electrodes, the second electrodes of the first through sixth transistors ST1 through ST6 and the driving transistor DT are source electrodes.

Active layers of the first through sixth transistors ST1 through ST6 and the driving transistor DT may be formed of one of polysilicon, amorphous silicon, and an oxide semiconductor. For example, the active layers of the first through sixth transistors ST1 through ST6 and the driving transistor DT may be formed of polysilicon by a low-temperature polysilicon (LTPS) process. In one or more embodiments, the third transistor ST3 may include transistors ST3-1 and ST3-2.

FIG. 5 illustrates that the first through sixth transistors ST1 through ST6 and the driving transistor DT are formed as P-type MOSFETs, but the present disclosure is not limited thereto. Alternatively, the first through sixth transistors ST1 through ST6 and the driving transistor DT may be formed as N-type MOSFETs.

Figure 6:
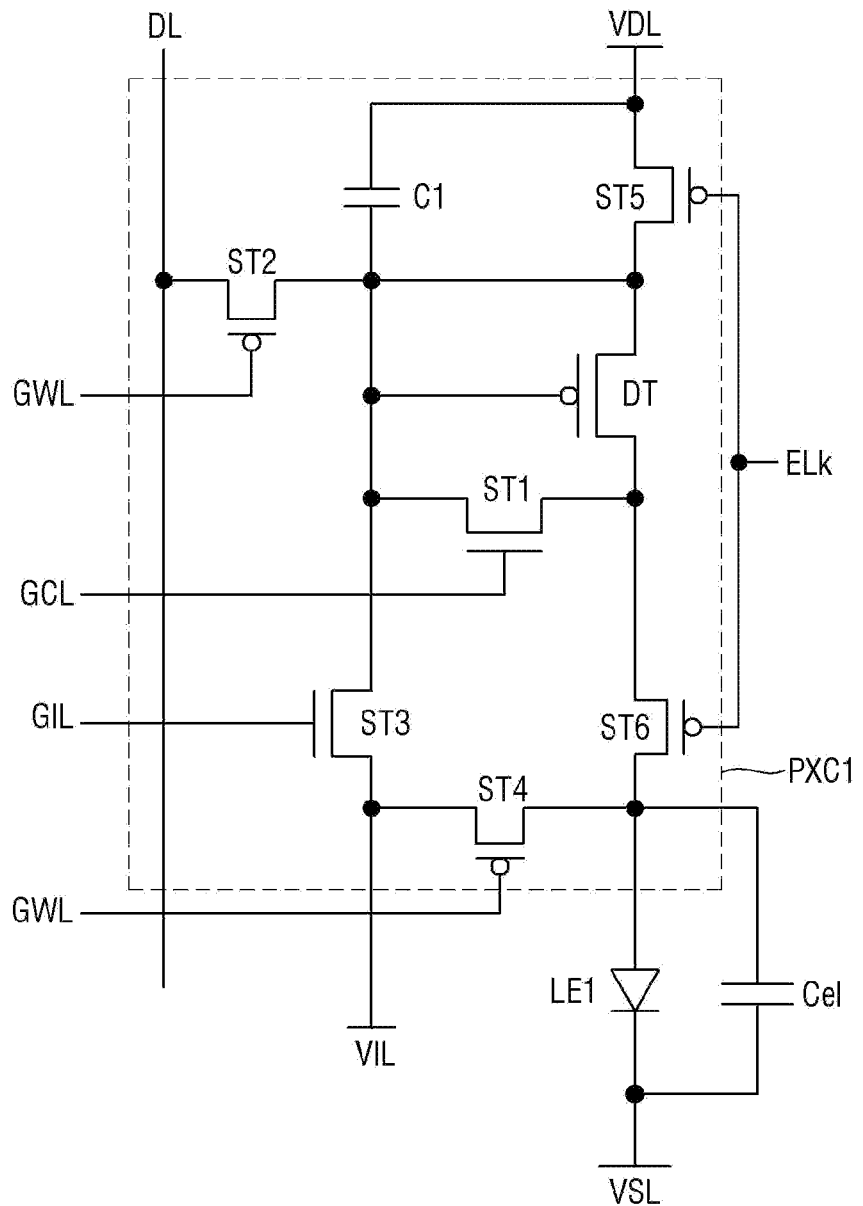
FIG. 6 is a circuit diagram illustrating a first light-emitting element and a first pixel circuit unit of FIG. 3.

Yet alternatively, referring to FIG. 6, the driving transistor DT and the second, fourth, fifth, and sixth transistors ST2, ST4, ST5, and ST6 may be formed as P-type MOSFETs, and the first and third transistors ST1 and ST3 may be formed as N-type MOSFETs.

Here, the active layers of the driving transistor DT and the second, fourth, fifth, and sixth transistors ST2, ST4, ST5, and ST6, which are formed as P-type MOSFETs, may be formed of polysilicon, and the active layers of the first and third transistors ST1 and ST3, which are formed as N-type MOSFETs, may be formed of an oxide semiconductor.

The embodiment of FIG. 6 differs from the embodiment of FIG. 5 in that the gate electrodes of the second and fourth transistors ST2 and ST4 may be connected to a write scan line GWL, and that the gate electrode of the first transistor ST1 is connected to a control scan line GCL. In the embodiment of FIG. 6, as the first and third transistors ST1 and ST3 are formed as N-type MOSFETs, a scan signal having a gate-high voltage may be applied to the control scan line GCL and an initialization scan line GIL (that is connected to the gate electrode of the third transistor ST3). On the contrary, as the second, fourth, fifth, and sixth transistors ST2, ST4, ST5, and ST6 are formed as P-type MOSFETs, a scan signal having a gate-low voltage may be applied to the write scan line GWL and an emission line EL (that is connected to the gate electrodes of the fifth and sixth transistors ST5 and ST6).

The first pixel circuit units PXC1 are not particularly limited to what is illustrated in FIGS. 4 through 6. That is, the first pixel circuit units PXC1 may be formed to have various other structures.

The second pixel circuit units PXC2, the third pixel circuit units PXC3, and the fourth pixel circuit units PXC4 may be substantially the same as the first pixel circuit units PXC1, described above with reference to FIGS. 4 through 6, and thus, detailed descriptions thereof will be omitted.

Referring to FIG. 3, the first pixel electrodes PXE1 may be disposed to correspond one-to-one to the first pixel circuit units PXC1. That is, the first pixel electrodes PXE1 may be disposed in their respective first pixel circuit units PXC1.

The second pixel electrodes PXE2 may be disposed to correspond one-to-one to the second pixel circuit units PXC2. That is, the second pixel electrodes PXE2 may be disposed in their second pixel circuit units PXC2.

The third pixel electrodes PXE3 may be disposed to correspond one-to-one to the third pixel circuit units PXC3. That is, the third pixel electrodes PXE3 may be disposed in their third pixel circuit units PXC3.

The fourth pixel electrodes PXE4 may be disposed to correspond one-to-one to the fourth pixel circuit units PXC4. That is, the fourth pixel electrodes PXE4 may be disposed in their fourth pixel circuit units PXC4.

The first light-emitting elements LE1 may emit first light. The first light may be light of a red wavelength range. For example, the first light may have a main peak wavelength of about 600 nm to about 750 nm.

The second light-emitting elements LE2 and the fourth light-emitting elements LE4 may emit second light. The second light may be light of a green wavelength range. For example, the second light may have a main peak wavelength of about 480 nm to about 560 nm.

The third light-emitting elements LE3 may emit third light. The third light may be light of a blue wavelength range. For example, the third light may have a main peak wavelength of about 370 nm to about 460 nm.

However, the present disclosure is not limited to this. Alternatively, the first light-emitting elements LE1 may emit the second light or the third light, the second light-emitting elements LE2 and the fourth light-emitting elements LE4 may emit the first light or the third light, and the third light-emitting elements LE3 may emit the first light or the second light.

The first light-emitting elements LE1 may be connected one-to-one to the first pixel electrodes PXE1. That is, the first light-emitting elements LE1 may be connected to their respective first pixel electrodes PXE1. The first light-emitting elements LE1 may receive a first driving current (e.g., Ids) from their respective first pixel circuit units PXC1 through their respective first pixel electrodes PXE1. The first light-emitting elements LE1 may emit the first light at a desired luminance (e.g., a set or predetermined luminance) in accordance with the first driving current (e.g., Ids).

The second light-emitting elements LE2 may be connected one-to-one to the second pixel electrodes PXE2. That is, the second light-emitting elements LE2 may be connected to their respective second pixel electrodes PXE2. The second light-emitting elements LE2 may receive a second driving current (e.g., Ids) from their respective second pixel circuit units PXC2 through their respective second pixel electrodes PXE2. The second light-emitting elements LE2 may emit the second light at a desired luminance (e.g., a set or predetermined luminance) in accordance with the second driving current (e.g., Ids).

The third light-emitting elements LE3 may be connected one-to-one to the third pixel electrodes PXE3. That is, the third light-emitting elements LE3 may be connected to their respective third pixel electrodes PXE3. The third light-emitting elements LE3 may receive a third driving current (e.g., Ids) from their respective third pixel circuit units PXC3 through their respective third pixel electrodes PXE3. The third light-emitting elements LE3 may emit the third light at a desired luminance (e.g., a set or predetermined luminance) in accordance with the third driving current (e.g., Ids).

The fourth light-emitting elements LE4 may be connected one-to-one to the fourth pixel electrodes PXE4. That is, the fourth light-emitting elements LE4 may be connected to their respective fourth pixel electrodes PXE4. The fourth light-emitting elements LE4 may receive a fourth driving current (e.g., Ids) from their respective fourth pixel circuit units PXC4 through their respective fourth pixel electrodes PXE4. The fourth light-emitting elements LE4 may emit the fourth light at a desired luminance (e.g., a set or predetermined luminance) in accordance with the fourth driving current (e.g., Ids).

Figure 7:
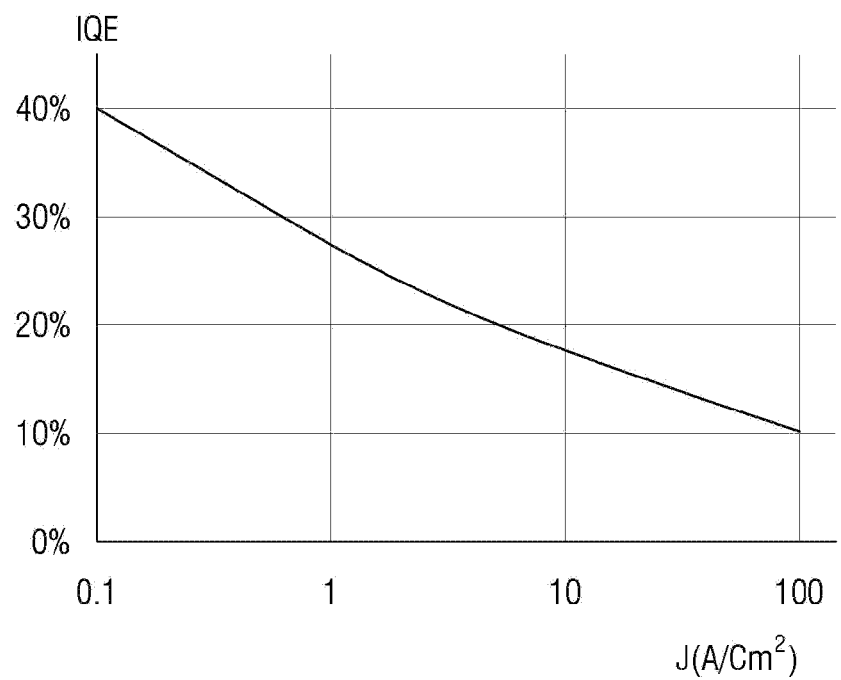
FIG. 7 is a graph showing the inner emission efficiency versus the current density of a first light-emitting element according to one or more embodiments of the present disclosure.

Referring to FIG. 7, as the densities of currents flowing in the first light-emitting elements LE1, the second light-emitting elements LE2, the third light-emitting elements LE3, and the fourth light-emitting elements LE4 increase, the internal quantum efficiencies of the first light-emitting elements LE1, the second light-emitting elements LE2, the third light-emitting elements LE3, and the fourth light-emitting elements LE4 may decrease. Referring to FIG. 7, the X axis represents current density (unit: J ($A/cm^2$)), and the Y axis represents internal quantum efficiency "IQE".

The internal quantum efficiency of the first light-emitting elements LE1 varies more considerably than the internal quantum efficiencies of the second light-emitting elements LE2, the third light-emitting elements LE3, and the fourth light-emitting elements LE4 with respect to current density. Thus, to raise the internal quantum efficiency of the first light-emitting elements LE1, the current density in the first light-emitting elements LE1 needs to be lowered. The larger the area of the first light-emitting elements LE1, the lower the current density in the first light-emitting elements LE1. Accordingly, the area of the first light-emitting element LE1 may be increased to raise the internal quantum efficiency of the first light-emitting element LE1. Therefore, the area of the first light-emitting element LE1 may be greater than each of the area of the second light-emitting element LE2, the area of the third light-emitting element LE3, and the area of the fourth light-emitting element LE4 (e.g., see FIG. 3).

Also, in a case where the internal quantum efficiency of the third light-emitting elements LE3 varies less considerably than the internal quantum efficiencies of the second light-emitting element LE2 and the fourth light-emitting element LE4 with respect to current density, each of the area of the second light-emitting element LE2 and the area of the fourth light-emitting element LE4 may be greater than the area of the third light-emitting element LE3.

The length of the first light-emitting element LE1 in a first diagonal direction DD1 may be substantially the same as the length of the second light-emitting element LE2 in the first diagonal direction DD1 and greater than the length of the third light-emitting element LE3 in the first diagonal direction DD1. Also, the length of the first light-emitting element LE2 in a second diagonal direction DD2 may be greater than the length of the second light-emitting element LE2 in the second diagonal direction DD2 and the length of the third light-emitting element LE3 in the second diagonal direction DD2. The first diagonal direction DD1 may be a direction between the first and second directions DR1 and DR2 and may be 45 degrees inclined from the first and second directions DR1 and DR2. The second diagonal direction DD2 may be a direction orthogonal to the first diagonal direction DD1.

The length of the first light-emitting element LE1 and the length of the second light-emitting element LE2 in the first diagonal direction DD1 may be 1.5 times greater than the length of the third light-emitting element LE3 in the first diagonal direction DD1. The length, in the second diagonal direction DD2, of the first light-emitting elements LE1 may be 1.5 times greater than the length of the second light-emitting element LE2 and the length of the third light-emitting element LE3 in the second diagonal direction DD2. For convenience, FIG. 3 illustrates that the length of the first light-emitting element LE1 in the first diagonal direction DD1 and the length of the second light-emitting element LE2 in the first diagonal direction DD1 are 3 times greater than the length of the third light-emitting element LE3 in the first diagonal direction DD1, and that the length of the first light-emitting element LE1 in the second diagonal direction DD2 is 3 times greater than the length of the second light-emitting element LE2 and the length of the third light-emitting element LE3 in the second diagonal direction DD2.

The first light-emitting elements LE1, the second light-emitting elements LE2, the third light-emitting elements LE3, and the fourth light-emitting elements LE4 may have a rectangular shape having two sides in the first diagonal direction DD1 and two sides in the second diagonal direction DD2. The first light-emitting elements LE1 may have a square shape having substantially the same length in both the first and second diagonal directions DD1 and DD2. The second light-emitting elements LE2 may have a rectangular shape having a larger length in the first diagonal direction DD1 than in the second diagonal direction DD2. The third light-emitting elements LE3 may have a square shape having substantially the same length in both the first and second diagonal directions DD1 and DD2. The fourth light-emitting elements LE4 may have a rectangular shape having a larger length in the second diagonal direction DD2 than in the first diagonal direction DD1.

Each of the first light-emitting elements LE1 may be surrounded by two second light-emitting elements LE2 in the second diagonal direction DD2 and two fourth light-emitting elements LE4 in the first diagonal direction DD1. For example, second light-emitting elements LE2 may be disposed on first and second sides of each of the first light-emitting elements LE1 in the second diagonal direction DD2, and fourth light-emitting elements LE4 may be disposed on third and fourth sides of each of the first light-emitting elements LE1 in the first diagonal direction DD1. In this example, the first and second sides of each of the first light-emitting elements LE1 may be opposite to each other, and the third and fourth sides of each of the first light-emitting elements LE1 may be opposite to each other.

Each of the third light-emitting elements LE3 may be surrounded by two second light-emitting elements LE2 in the first diagonal direction DD1 and two fourth light-emitting elements LE4 in the second diagonal direction DD2. For example, second light-emitting elements LE2 may be disposed on first and second sides of each of the third light-emitting elements LE3 in the first diagonal direction DD1, and fourth light-emitting elements LE4 may be disposed on third and fourth sides of each of the third light-emitting elements LE3 in the second diagonal direction DD2. In this example, the first and second sides of each of the third light-emitting elements LE3 may be opposite to each other, and the third and fourth sides of each of the third light-emitting elements LE3 may be opposite to each other.

A third light-emitting element LE3 may be disposed between each pair of adjacent first light-emitting elements LE1 in the first direction DR1. Also, a first light-emitting element LE1 may be disposed between each pair of third light-emitting elements LE3 in the first direction DR1. That is, the first light-emitting elements LE1 and the third light-emitting elements LE3 may be alternately arranged along the first direction DR1.

A third light-emitting element LE3 may be disposed between each pair of first light-emitting elements LE1 in the second direction DR2. Also, a first light-emitting element LE1 may be disposed between each pair of third light-emitting elements LE3 in the second direction DR2. That is, the first light-emitting elements LE1 and the third light-emitting elements LE3 may be alternately arranged along the second direction DR2.

A third light-emitting element LE3 may be disposed between each pair of adjacent second light-emitting elements LE2 in the first diagonal direction DD1. Also, a second light-emitting element LE2 may be disposed between each pair of third light-emitting elements LE3 in the first direction DR1. That is, the second light-emitting elements LE2 and the third light-emitting elements LE3 may be alternately arranged along the first diagonal direction DD1.

A second light-emitting element LE2 may be disposed between each pair of adjacent first light-emitting elements LE1 in the second diagonal direction DD2. Also, a first light-emitting element LE1 may be disposed between each pair of second light-emitting elements LE2 in the second diagonal direction DD2. That is, the first light-emitting elements LE1 and the second light-emitting elements LE2 may be alternately arranged along the second diagonal direction DD2.

A fourth light-emitting element LE4 may be disposed between each pair of adjacent first light-emitting elements LE1 in the first diagonal direction DD1. Also, a first light-emitting element LE1 may be disposed between each pair of fourth light-emitting elements LE4 in the first diagonal direction DD1. That is, the first light-emitting elements LE1 and the fourth light-emitting elements LE4 may be alternately arranged along the first diagonal direction DD1.

A third light-emitting element LE3 may be disposed between each pair of adjacent fourth light-emitting elements LE4 in the second diagonal direction DD2. Also, a fourth light-emitting element LE4 may be disposed between each pair of third light-emitting elements LE3 in the second diagonal direction DD2. That is, the third light-emitting elements LE3 and the fourth light-emitting elements LE4 may be alternately arranged along the second diagonal direction DD2.

Referring to FIG. 3, considering the internal quantum efficiencies of the first light-emitting elements LE1, the second light-emitting elements LE2, the third light-emitting elements LE3, and the fourth light-emitting elements LE4 with respect to current density, the area of the first light-emitting element LE1 may be greater than each of the area of the second light-emitting element LE2, the area of the third light-emitting element LE3, and the area of the fourth light-emitting element LE4. Also, each of the area of the second light-emitting element LE2 and the area of the fourth light-emitting element LE4 may be greater than the area of the third light-emitting element LE3. Thus, the area of the first pixel circuit unit PXC1 may differ from the area of the first light-emitting element LE1, and the area of the second pixel circuit unit PXC2 may differ from the area of the second light-emitting element LE2. Also, the area of the third pixel circuit unit PXC3 may differ from the area of the third light-emitting element LE3, and the area of the fourth pixel circuit unit PXC4 may differ from the area of the fourth light-emitting element LE4. For example, the area of the first light-emitting element LE1 may be greater than the area of the first pixel circuit unit PXC1, and the area of the third light-emitting element LE3 may be smaller than the area of the third pixel circuit unit PXC3.

The first pixel circuit units PXC1, the second pixel circuit units PXC2, the third pixel circuit units PXC3, and the fourth pixel circuit units PXC4 may have a rectangular shape having two sides in the first direction DR1 and two sides in the second direction DR2, but the first light-emitting elements LE1, the second light-emitting elements LE2, the third light-emitting elements LE3, and the fourth light-emitting elements LE4 may have a rectangular or square shape having two sides in the first diagonal direction DD1 and two sides in the second diagonal direction DD2.

Thus, the first light-emitting elements LE1 may overlap with at least parts of the first pixel circuit units PXC1. For example, the area of the first light-emitting element LE1 may be greater than the area of the first pixel circuit unit PXC1, and thus, the first pixel circuit unit PXC1 may completely overlap with the first light-emitting element LE1.

The second light-emitting elements LE2 may overlap with at least parts of the second pixel circuit units PXC2. The fourth light-emitting elements LE4 may overlap with at least parts of the fourth pixel circuit units PXC4.

The third light-emitting elements LE3 may overlap with at least parts of the third pixel circuit units PXC3. For example, as illustrated in FIG. 3, the area of the third light-emitting element LE3 may be smaller than the area of the third pixel circuit unit PXC3, and thus, the third light-emitting element LE3 may completely overlap with the third pixel circuit unit PXC3.

The locations of the overlapping areas of the first pixel circuit units PXC1 and the first light-emitting elements LE1, the locations of the overlapping areas of the second pixel circuit units PXC2 and the second light-emitting elements LE2, the locations of the overlapping areas of the third pixel circuit units PXC3 and the third light-emitting elements LE3, and the locations of the overlapping areas of the fourth pixel circuit units PXC4 and the fourth light-emitting elements LE4 may differ from one another.

The first pixel electrodes PXE1, which connect the first pixel circuit units PXC1 and the first light-emitting elements LE1, may be disposed close to sides of the first pixel circuit units PXC1. For example, the first pixel electrodes PXE1 may be disposed close to the upper sides of the first pixel circuit units PXC1.

The second pixel electrodes PXE2, which connect the second pixel circuit units PXC2 and the second light-emitting elements LE2, may be disposed close to sides of the second pixel circuit units PXC2. For example, the second pixel electrodes PXE2 may be disposed close to the lower sides of the second pixel circuit units PXC2.

The third pixel electrodes PXE3, which connect the third pixel circuit units PXC3 and the third light-emitting elements LE3, may be disposed close to the centers of the third pixel circuit units PXC3.

The fourth pixel electrodes PXE4, which connect the fourth pixel circuit units PXC4 and the fourth light-emitting elements LE4, may be disposed close to sides of the fourth pixel circuit units PXC4. For example, the fourth pixel electrodes PXE4 may be disposed close to the lower sides of the fourth pixel circuit units PXC4.

As illustrated in FIG. 3, the area of the first light-emitting element LE1 may be greater than each of the area of the second light-emitting element LE2, the area of the third light-emitting element LE3, and the area of the fourth light-emitting element LE4. As a result, the current density in the first light-emitting element LE1 may be lowered, and thus, the internal quantum efficiency of the first light-emitting element LE1 may be improved.

As illustrated in FIG. 3, the first light-emitting elements LE1, the second light-emitting elements LE2, the third light-emitting elements LE3, and the fourth light-emitting elements LE4 that form a single pixel PX together may be designed into a PENTILE®™ structure having a diamond or rhombus shape, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

FIG. 3 illustrates that the first light-emitting elements LE1 emit the first light, the second light-emitting elements LE2 and the fourth light-emitting elements LE4 emit the second light, and the third light-emitting elements LE3 emit the third light, but the present disclosure is not limited thereto. Alternatively, the first light-emitting elements LE1 may emit the first light, the second light-emitting elements LE2 and the fourth light-emitting elements LE4 emit the third light, and the third light-emitting elements LE3 emit the second light. Yet alternatively, the first light-emitting elements LE1 may emit the first light, the second light-emitting elements LE2 may emit the second light, the third light-emitting elements LE3 may emit the third light, and the fourth light-emitting elements LE4 may emit fourth light. The fourth light may be light of a yellow wavelength range and may have a main peak wavelength of about 550 nm to about 600 nm, but the present disclosure is not limited thereto.

FIG. 3 also illustrates that the first light-emitting elements LE1, the second light-emitting elements LE2, the third light-emitting elements LE3, and the fourth light-emitting elements LE4 have a rectangular or square shape in a plan view, but the present disclosure is not limited thereto. Alternatively, the first light-emitting elements LE1, the second light-emitting elements LE2, the third light-emitting elements LE3, and the fourth light-emitting elements LE4 may have a tetragonal shape other than a rectangular or square shape, a non-tetragonal polygonal shape (e.g., a triangular shape, a pentagonal shape, a hexagonal shape, or an octagonal shape), a circular shape, an elliptical shape, or an amorphous shape in a plan view.

Figure 8:
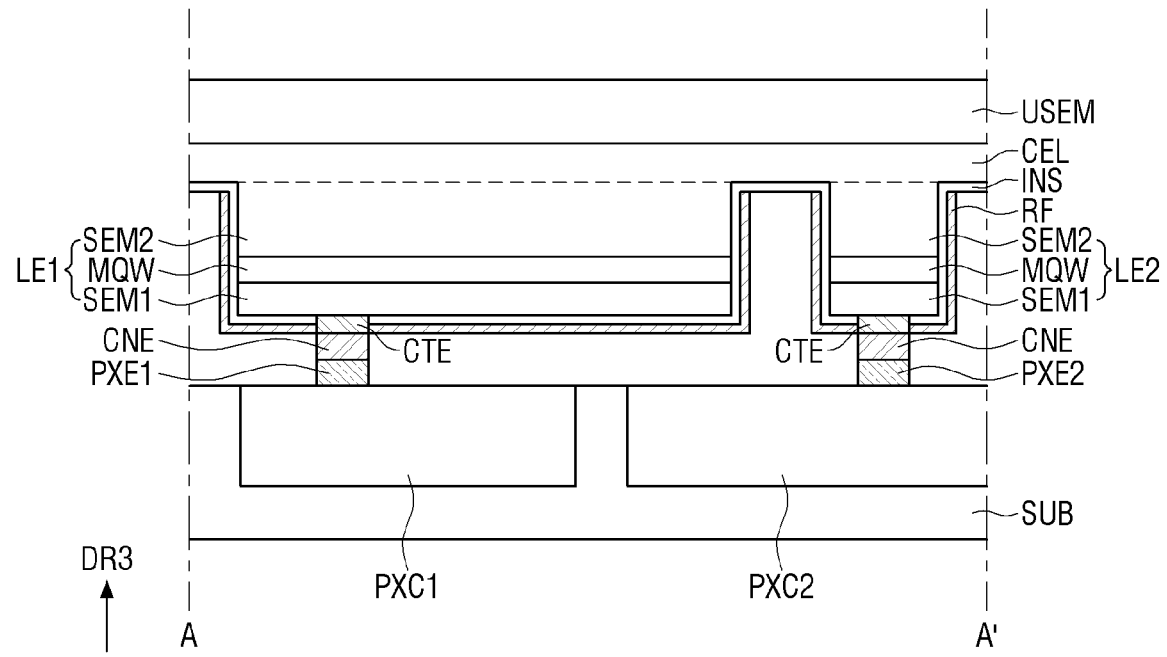
FIG. 8 illustrates cross-sectional views taken along the lines A-A' and B-B' of FIG. 3.
Figure 8:
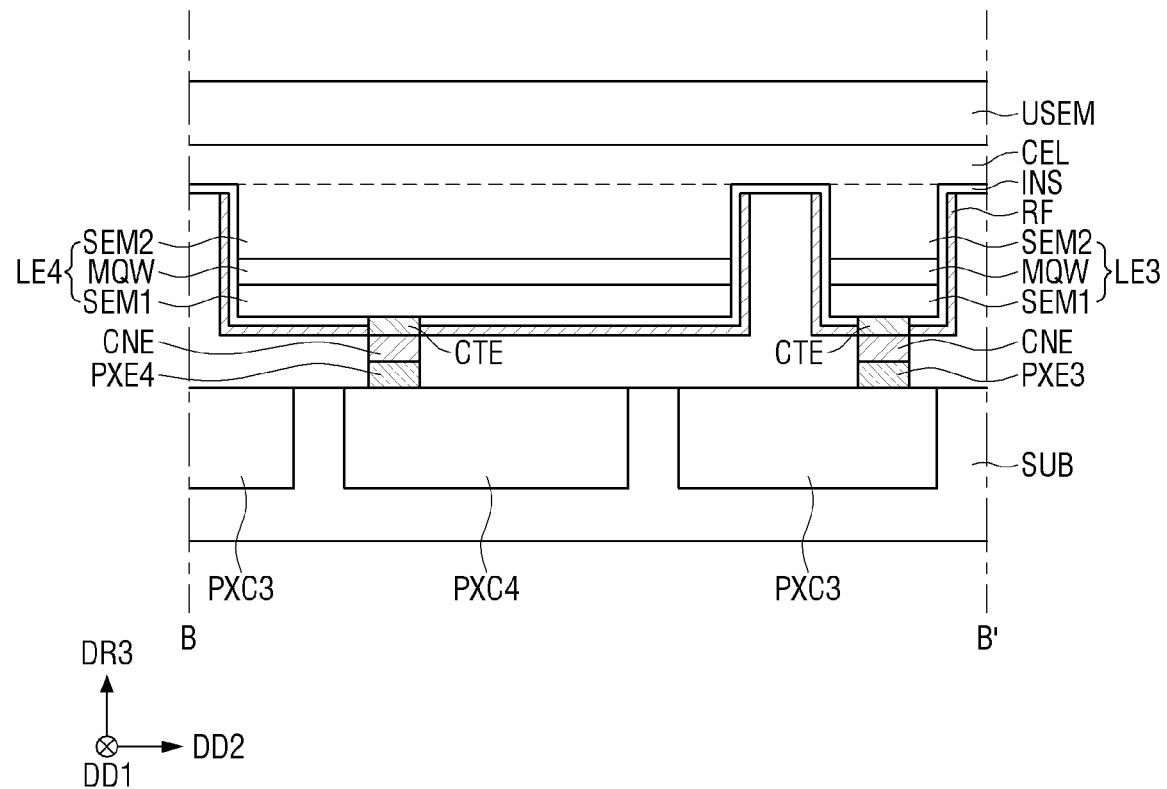
Figure 9:
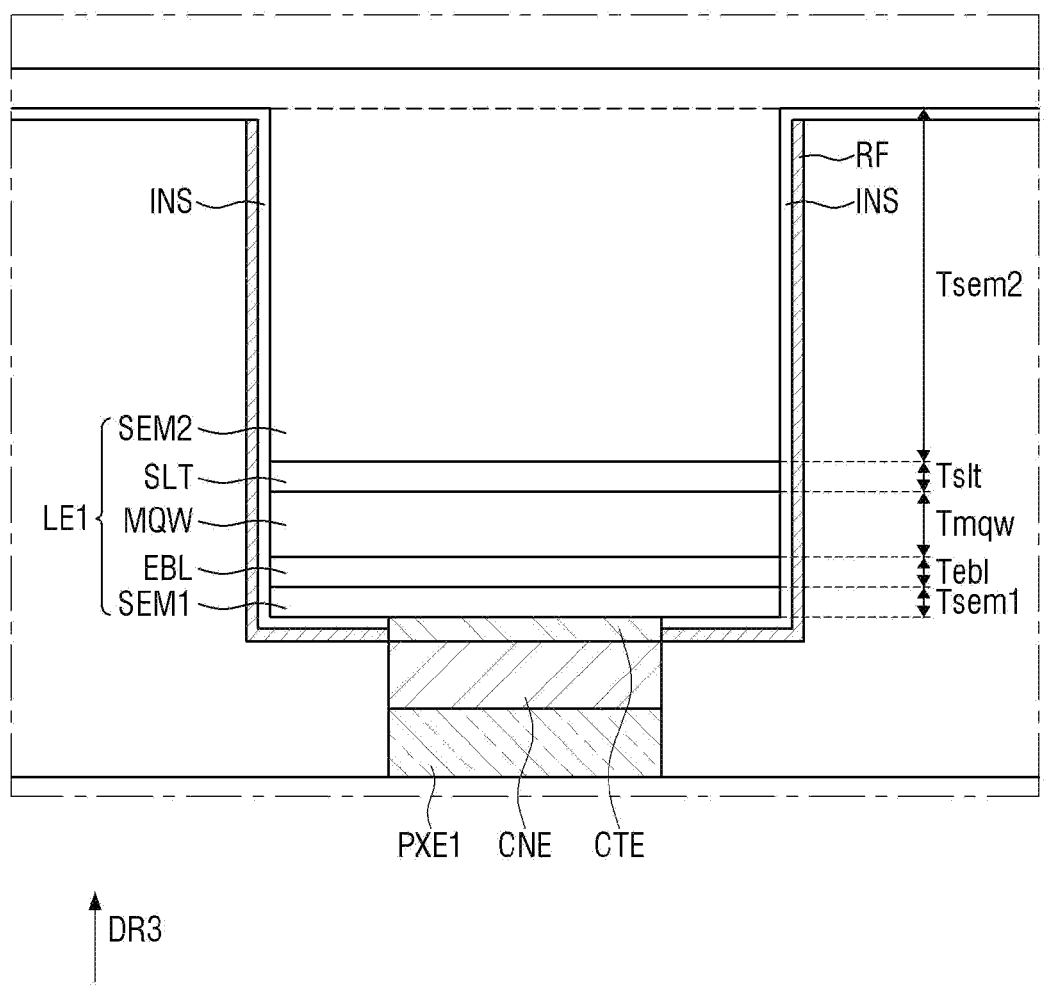
FIG. 9 is an enlarged cross-sectional view of a first light-emitting element of FIG. 8.

FIG. 8 illustrates cross-sectional views taken along the lines A-A' and B-B' of FIG. 3. FIG. 9 is an enlarged cross-sectional view of a first light-emitting element of FIG. 8.

Referring to FIGS. 8 and 9, the display panel 100 may include a semiconductor circuit board, a light-emitting element layer, and a filler layer. The semiconductor circuit board may include a substrate SUB, a plurality of pixel circuit units (PXC1, PXC2, PXC3, and PXC4) and a plurality of pixel electrodes (PXE1, PXE2, PXE3, and PXE4).

The substrate SUB may be a silicon wafer substrate. The substrate SUB may be formed of monocrystalline silicon.

Each of the pixel circuit units (PXC1, PXC2, PXC3, and PXC4) may be disposed on the substrate SUB. Each of the pixel circuit units (PXC1, PXC2, PXC3, and PXC4) may include a CMOS circuit formed by a semiconductor process. Alternatively, each of the pixel circuit units (PXC1, PXC2, PXC3, and PXC4) may include a TFT circuit formed by a TFT process.

The pixel circuit units (PXC1, PXC2, PXC3, and PXC4) may be disposed in the display area DA. The pixel circuit units (PXC1, PXC2, PXC3, and PXC4) may be connected to their respective pixel electrodes (PXE1, PXE2, PXE3, and PXE4). That is, the pixel circuit units (PXC1, PXC2, PXC3, and PXC4) may be connected one-to-one to their respective pixel electrodes (PXE1, PXE2, PXE3, and PXE4).

For example, first pixel circuit units PXC1 may supply a pixel voltage or an anode voltage to first pixel electrodes PXE1, second pixel circuit units PXC2 may supply a pixel voltage or an anode voltage to second pixel electrodes PXE2, third pixel circuit units PXC3 may supply a pixel voltage or an anode voltage to third pixel electrodes PXE3, and fourth pixel circuit units PXC4 may supply a pixel voltage or an anode voltage to fourth pixel electrodes PXE4.

The first pixel electrodes PXE1 may be disposed on the first pixel circuit units PXC1. The first pixel electrodes PXE1 may be electrodes exposed from the first pixel circuit units PXC1. That is, the first pixel electrodes PXE1 may protrude from the top surfaces of the first pixel circuit units PXC1. The first pixel electrodes PXE1 may be integrally formed with the first pixel circuit units PXC1.

The second pixel electrodes PXE2 may be disposed on the second pixel circuit units PXC2. The second pixel electrodes PXE2 may be electrodes exposed from the second pixel circuit units PXC2. That is, the second pixel electrodes PXE2 may protrude from the top surfaces of the second pixel circuit units PXC2. The second pixel electrodes PXE2 may be integrally formed with the second pixel circuit units PXC2.

The third pixel electrodes PXE3 may be disposed on the third pixel circuit units PXC3. The third pixel electrodes PXE3 may be electrodes exposed from the third pixel circuit units PXC3. That is, the third pixel electrodes PXE3 may protrude from the top surfaces of the third pixel circuit units PXC3. The third pixel electrodes PXE3 may be integrally formed with the third pixel circuit units PXC3.

The fourth pixel electrodes PXE4 may be disposed on the fourth pixel circuit units PXC4. The fourth pixel electrodes PXE4 may be electrodes exposed from the fourth pixel circuit units PXC4. That is, the fourth pixel electrodes PXE4 may protrude from the top surfaces of the fourth pixel circuit units PXC4. The fourth pixel electrodes PXE4 may be integrally formed with the fourth pixel circuit units PXC4.

The first pixel electrodes PXE1, the second pixel electrodes PXE2, the third pixel electrodes PXE3, and the fourth pixel electrodes PXE4 may include aluminum (Al), gold (Au), copper (Cu), an alloy of Au and tin (Sn), an alloy of silver (Ag) and Sn, or an alloy of Sn, Au, or Cu.

The light-emitting element layer may be a layer including first light-emitting elements LE1, second light-emitting elements LE2, third light-emitting elements LE3, and fourth light-emitting elements LE4 and emitting light. The light-emitting element layer may include the first light-emitting elements LE1, the second light-emitting elements LE2, the third light-emitting elements LE3, the fourth light-emitting elements LE4, connecting electrodes CNE, contact electrodes CTE, a common electrode layer CEL, and an undoped semiconductor layer USEM.

The connecting electrodes CNE may be disposed on the first pixel electrodes PXE1, the second pixel electrodes PXE2, the third pixel electrodes PXE3, and the fourth pixel electrodes PXE4. That is, the connecting electrodes CNE may be connected one-to-one to the first pixel electrodes PXE1, the second pixel electrodes PXE2, the third pixel electrodes PXE3, and the fourth pixel electrodes PXE4. During the fabrication of the display device 10, the connecting electrodes CNE may function as bonding metals for bonding the first pixel electrodes PXE1 and the first light-emitting elements LE1, the second pixel electrodes PXE2 and the second light-emitting elements LE2, the third pixel electrodes PXE3 and the third light-emitting elements LE3, and the fourth pixel electrodes PXE4 and the fourth light-emitting elements LE4. For example, the connecting electrodes CNE may include Au, Cu, an alloy of Au and Sn, an alloy of Ag and Sn, or an alloy of Sn, Au, or Cu. Alternatively, the connecting electrodes CNE may include titanium (Ti), platinum (Pt), or an alloy of Ti and Pt.

The contact electrodes CTE may be connected one-to-one to the connecting electrodes CNE. The contact electrodes CTE may be connected to their respective connecting electrodes CNE. The contact electrodes CTE may be disposed between the first light-emitting elements LE1 and the connecting electrodes CNE, between the second light-emitting elements LE2 and the connecting electrodes CNE, between the third light-emitting elements LE3 and the connecting electrodes CNE, and between the fourth light-emitting elements LE4 and the connecting electrodes CNE. The contact electrodes CTE may be connected to first semiconductor layers SEM1 of the first light-emitting elements LE1, the second light-emitting elements LE2, the third light-emitting elements LE3, and the fourth light-emitting elements LE4.

The first light-emitting elements LE1, the second light-emitting elements LE2, the third light-emitting elements LE3, and the fourth light-emitting elements LE4 may be disposed on their respective contact electrodes CTE. The first light-emitting elements LE1, the second light-emitting elements LE2, the third light-emitting elements LE3, and the fourth light-emitting elements LE4 may be connected one-to-one to the contact electrodes CTE. The first light-emitting elements LE1, the second light-emitting elements LE2, the third light-emitting elements LE3, and the fourth light-emitting elements LE4 may be vertical light-emitting diodes (LEDs) extending in the third direction DR3. That is, each of the length of the first light-emitting element LE1, the length of the second light-emitting element LE2, the length of the third light-emitting element LE3, and the length of the fourth light-emitting element LE4 in the third direction DR3 may be greater than the length of the first light-emitting element LE1, the length of the second light-emitting element LE2, the length of the third light-emitting element LE3, and the length of the fourth light-emitting element LE4 in a horizontal direction. Here, the horizontal direction may refer to the first direction DR1 or the second direction DR2.

The first light-emitting elements LE1 may be micro LEDs or nano LEDs. Referring to FIG. 9, a first light-emitting element LE1 may include a first semiconductor layer SEM1, an electron blocking layer EBL, an active layer MQW, a superlattice layer SLT, and a second semiconductor layer SEM2 disposed along the third direction DR3. The first semiconductor layer SEM1, the electron blocking layer EBL, the active layer MQW, the superlattice layer SLT, and the second semiconductor layer SEM2 may be sequentially stacked along the third direction DR3.

The first semiconductor layer SEM1 may be disposed on a contact electrode CTE. The first semiconductor layer SEM1 may be doped with a dopant of a first conductivity type such as magnesium (Mg), zinc (Zn), calcium (Ca), selenium (Se), or barium (Ba). For example, the first semiconductor layer SEM1 may be p-GaN doped with Mg, which is a p-type dopant. A thickness Tsem1 of the first semiconductor layer SEM1 may be about 30 nm to about 200 nm.

The electron blocking layer EBL may be disposed on the first semiconductor layer SEM1. The electron blocking layer EBL may be a layer suppressing or preventing the flow of too many electrons into the active layer MQW. For example, the electron blocking layer EBL may be p-AlGaN doped with Mg, which is a p-type dopant. A thickness Tebl of the electron blocking layer EBL may be about 10 nm to about 50 nm. The electron blocking layer EBL may not be provided.

The active layer MQW may be disposed on the electron blocking layer EBL. The active layer MQW may emit light through the combination of electron-hole pairs in accordance with electric signals applied thereto from the first and second semiconductor layers SEM1 and SEM2.

The active layer MQW may include a material having a single- or multi-quantum well structure. In a case where the active layer MQW includes a material having a multi-quantum well structure, the active layer MQW may have a structure in which a plurality of well layers and a plurality of barrier layers are alternately stacked. The thickness of the well layers may be about 1 nm to about 4 nm, and the thickness of the barrier layers may be about 3 nm to about 10 nm. The thickness Tmqw of the active layer MQW may be a combination of the thickness of the well layers and the thickness of the barrier layers.

Alternatively, the active layer MQW may have a structure in which semiconductor materials having a large bandgap energy and semiconductor materials having a small bandgap energy are alternately stacked or may include a Group III semiconductor material or a Group V semiconductor material depending on the wavelength range of light to be emitted by the active layer MQW.

In a case where the active layer MQW includes InGaN, the color of light to be emitted by the active layer MQW may vary depending on the indium (In) content of the active layer MQW. For example, as the In content of the active layer MQW increases, the wavelength of light emitted by the active layer MQW may be switched to a red wavelength range, and as the In content of the active layer MQW decreases, the wavelength of light emitted by the active layer MQW may be switched to a blue wavelength range. Thus, the In content of the active layer MQW of the first light-emitting element LE1 may be greater than the In contents of active layers MQW of second and fourth light-emitting elements LE2 and LE4, and the In contents of active layers MQW of the second and fourth light-emitting elements LE2 and LE4 may be greater than the In content of an active layer MQW of a third light-emitting element LE3. For example, the In content of the active layer MQW of the third light-emitting element LE3 may be about 15%, the In content of the active layer MQW of the second and fourth light-emitting element LE2 and LE4 may be about 25%, and the In content of the active layer MQW of the first light-emitting element LE1 may be about 35% or greater. That is, by controlling the In contents of the active layers MQW of the first, second and fourth, and third light-emitting elements LE1, LE2 and LE4, and LE3, the first, second and fourth, and third light-emitting elements LE1, LE2 and LE4, and LE3 may be allowed to emit the first light, the second light, and the third light, respectively.

Referring to FIG. 9, the superlattice layer SLT may be disposed on the active layer MQW. The superlattice layer SLT may be a layer for alleviating the stress between the second semiconductor layer SEM2 and the active layer MQW. For example, the superlattice layer SLT may be formed of InGaN or GaN. A thickness Tslt of the superlattice layer SLT may be about 50 nm to about 200 nm. In one or more embodiments, the superlattice layer SLT may not be provided.

The second semiconductor layer SEM2 may be disposed on the superlattice layer SLT. The second semiconductor layer SEM2 may be doped with a dopant of a second conductivity type such as silicon (Si), germanium (Ge), or Sn. For example, the second semiconductor layer SEM2 may be n-GaN doped with Si. A thickness Tsem2 of the second semiconductor layer SEM2 may be about 500 nm to about 1 μm.

Referring to FIG. 8, the common electrode layer CEL may be disposed on the first light-emitting elements LE1, the second light-emitting elements LE2, the third light-emitting elements LE3, and the fourth light-emitting elements LE4. The common electrode layer CEL may be connected in common to the first light-emitting elements LE1, the second light-emitting elements LE2, the third light-emitting elements LE3, and the fourth light-emitting elements LE4. The common electrode layer CEM may be connected to second semiconductor layers SEM2 of the first light-emitting elements LE1, the second light-emitting elements LE2, the third light-emitting elements LE3, and the fourth light-emitting elements LE4.

An insulating film INS may be disposed on the side surfaces, and a portion of the top surface, of each of the first light-emitting elements LE1, the second light-emitting elements LE2, the third light-emitting elements LE3, and the fourth light-emitting elements LE4. The insulating film INS may be disposed on parts of the top surfaces of the first light-emitting elements LE1, the second light-emitting elements LE2, the third light-emitting elements LE3, and the fourth light-emitting elements LE4, exposed by the contact electrodes CTE. The insulating film INS may be in contact with the side surfaces of each of the contact electrodes CTE. The insulating film INS may be disposed on the common electrode layer CEL, between each pair of light-emitting elements in any one of the first direction DR1, the second direction DR2, the first diagonal direction DD1, and the second diagonal direction DD2, among the first light-emitting elements LE1, the second light-emitting elements LE2, the third light-emitting elements LE3, and the fourth light-emitting elements LE4. The insulating film INS may be formed as an inorganic film such as a silicon oxide ($SiO_2$) film, an aluminum oxide ($Al_2O_3$) film, or a hafnium oxide ($HfO_x$) film. The thickness of the insulating film INS may be about 0.1 µm.

A reflective film RF reflects light traveling sideways, rather than in an upward direction, among beams of light emitted from the first light-emitting elements LE1, the second light-emitting elements LE2, the third light-emitting elements LE3, and the fourth light-emitting elements LE4. The reflective film RF may be disposed to cover the insulating film INS, which is disposed on the side surfaces and the top surface of each of the first light-emitting elements LE1, the second light-emitting elements LE2, the third light-emitting elements LE3, and the fourth light-emitting elements LE4. However, in one or more embodiments, the reflective film RF may not cover the surface of the insulating film INS that is disposed on the common electrode layer CEL. The reflective film RF may be in contact with the side surfaces of each of the contact electrodes CTE.

The reflective film RF may include a metallic material with high reflectance such as Al or Ag. In this case, the thickness of the reflective film RF may be about 0.1 µm, but the present disclosure is not limited thereto.

Alternatively, the reflective film RF may be a distributed Bragg reflector. In this case, the reflective film RF may have a structure in which a plurality of high refractive index layers and a plurality of low refractive index layers are alternately stacked.

The common electrode layer CEL may be integrally formed with the second semiconductor layers SEM2 of the first light-emitting elements LE1, the second light-emitting elements LE2, the third light-emitting elements LE3, and the fourth light-emitting elements LE4. The common electrode layer CEL may include the same material as the second semiconductor layers SEM2 of the first light-emitting elements LE1, the second light-emitting elements LE2, the third light-emitting elements LE3, and the fourth light-emitting elements LE4. For example, the common electrode layer CEL may be n-GaN doped with Si, which is an n-type dopant.

The common electrode layer CEL may be connected to the common voltage supply units CVS in each of the first and second common voltage supply areas CVA1 and CVA2 of FIGS. 1 and 2. Thus, a common voltage may be supplied to the second semiconductor layers SEM2 of the first light-emitting elements LE1, the second light-emitting elements LE2, the third light-emitting elements LE3, and the fourth light-emitting elements LE4 through the common electrode layer CEL.

The undoped semiconductor layer USEM may be disposed on the common electrode layer CEL. The undoped semiconductor layer USEM may be a semiconductor layer not doped with a dopant. For example, the undoped semiconductor layer USEM may be GaN not doped with a dopant. Thus, the undoped semiconductor layer USEM may be a non-conductive layer not having conductivity. That is, the undoped semiconductor layer USEM may be an insulating layer. In one or more embodiments, the undoped semiconductor layer USEM may not be provided.

The filler layer may fill the gaps between the substrate SUB and the first light-emitting elements LE1, the second light-emitting elements LE2, the third light-emitting elements LE3, and the fourth light-emitting elements LE4. The filler layer may also fill the gap between each pair of light-emitting elements in any one of the first direction DR1, the second direction DR2, the first diagonal direction DD1, and the second diagonal direction DD2, among the first light-emitting elements LE1, the second light-emitting elements LE2, the third light-emitting elements LE3, and the fourth light-emitting elements LE4.

The filler layer may include a fluxing underfill. For example, the filler layer may include a non-conductive paste such as an epoxy-based thermosetting material. Alternatively, the filler layer may include a $SiO_2$ film.

Referring to FIGS. 8 and 9, as the display panel 100 includes the first light-emitting elements LE1, which emit the first light, the second light-emitting elements LE2, which emit the second light, and the third light-emitting elements LE3, which emit the third light, various colors can be displayed without the need of wavelength conversion layers, and as a result, no partition walls are needed to define wavelength conversion layers.

Figure 10:
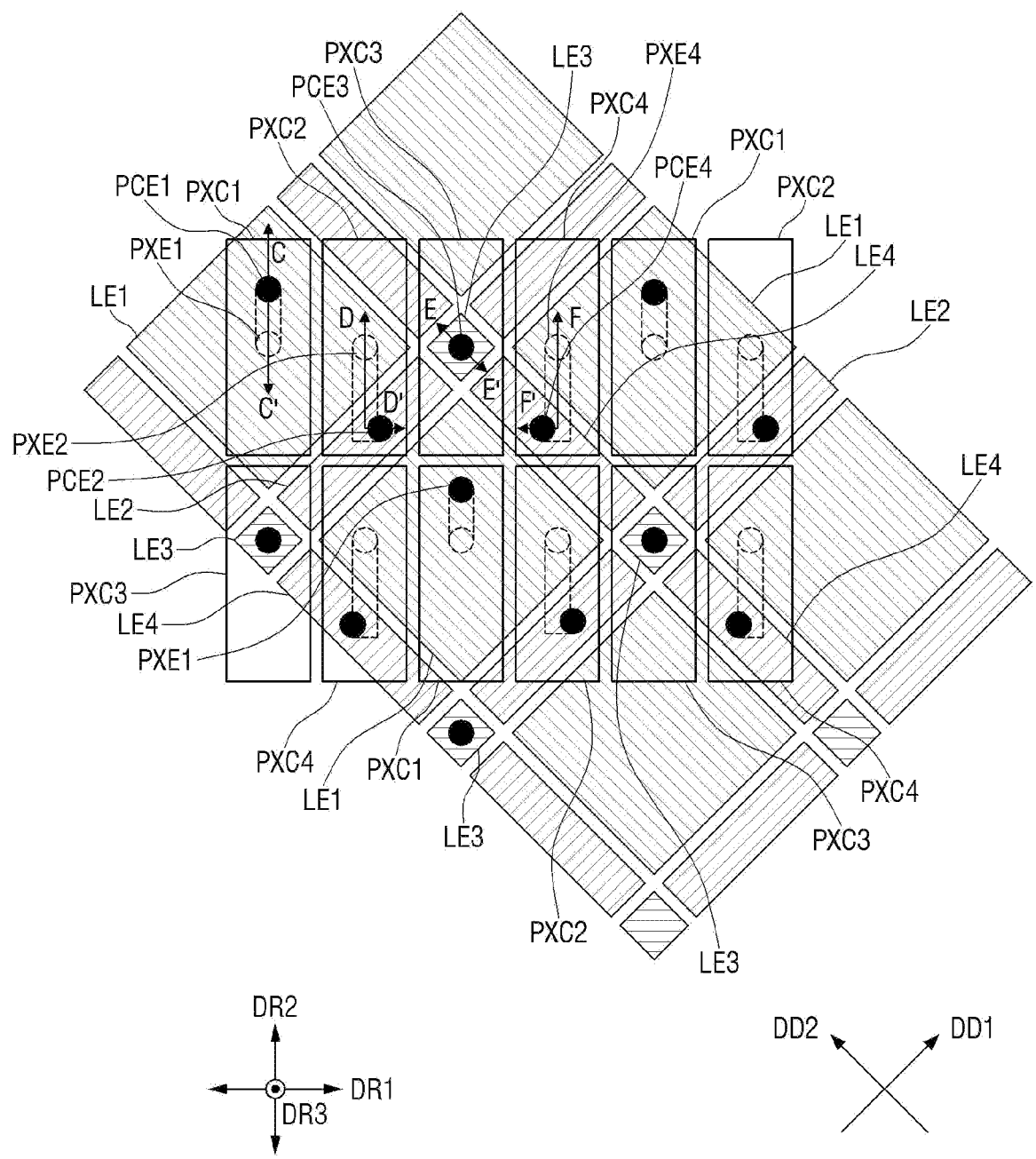
FIG. 10 is a layout view of a display area of a display panel according to one or more embodiments of the present disclosure.
Figure 11:
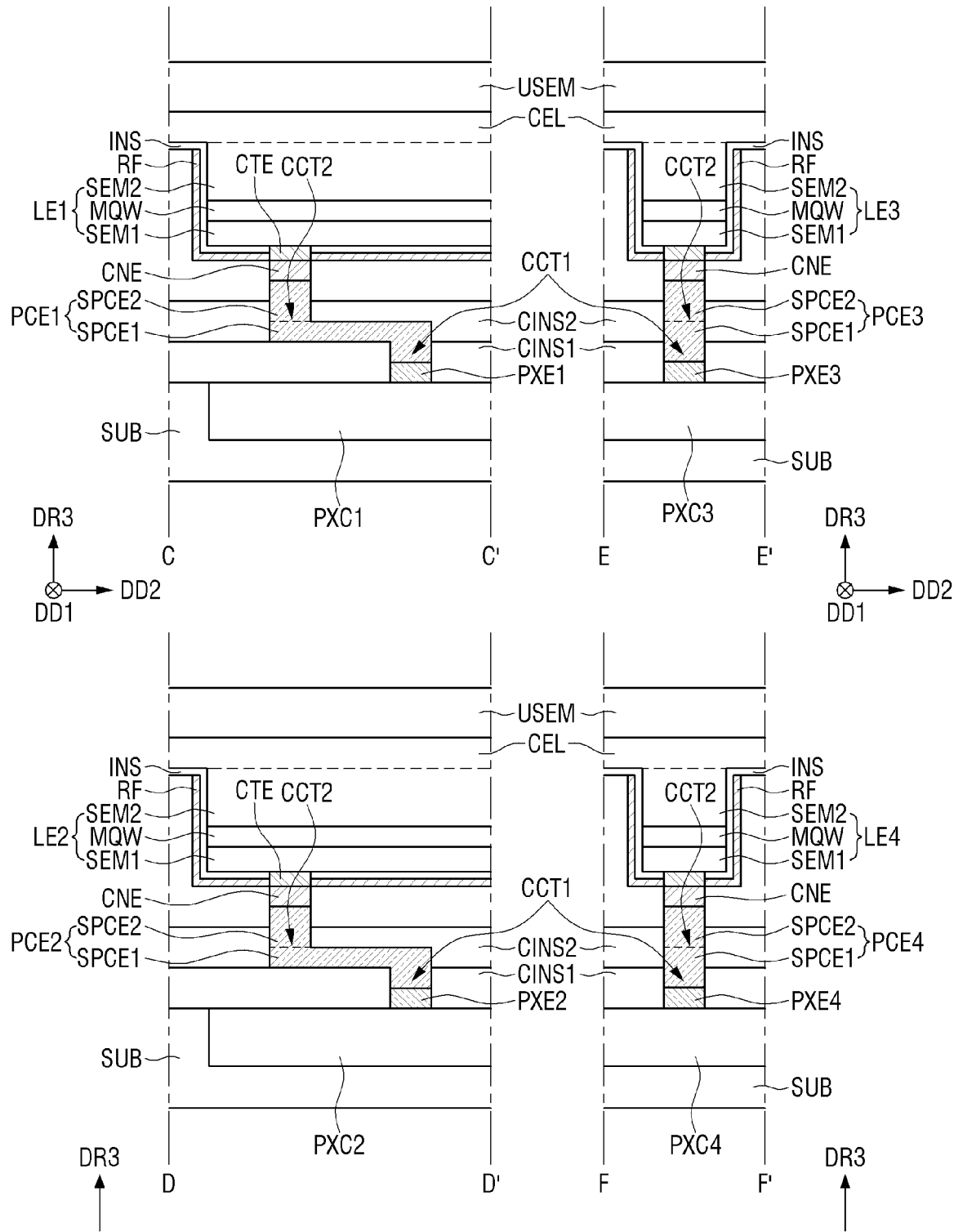
FIG. 11 illustrates cross-sectional views taken along the lines C-C', D-D', E-E', and F-F' of FIG. 10.

FIG. 10 is a layout view of a display area of a display panel according to one or more embodiments of the present disclosure. FIG. 11 illustrates cross-sectional views taken along the lines C-C', D-D', E-E', and F-F' of FIG. 10.

The embodiment of FIGS. 10 and 11 differs from the embodiment of FIGS. 3 and 8 in that a pixel PX further includes first pixel connecting electrodes PCE1, which are disposed between first pixel electrodes PXE1 and first light-emitting elements LE1, second pixel connecting electrodes PCE2, which are disposed between second pixel electrodes PXE2 and second light-emitting elements LE2, third pixel connecting electrodes PCE3, which are disposed between third pixel electrodes PXE3 and third light-emitting elements LE3, and fourth pixel connecting electrodes PCE4, which are disposed between fourth pixel electrodes PXE4 and fourth light-emitting elements LE4. The embodiment of FIGS. 10 and 11 will hereinafter be described, focusing mainly on the differences with the embodiment of FIGS. 3 and 8.

Referring to FIGS. 10 and 11, the first pixel connecting electrodes PCE1 may be disposed on the first pixel electrodes PXE1. Connecting electrodes CNE of the first light-emitting elements LE1 may be disposed on the first pixel connecting electrodes PCE1. The first pixel connecting electrodes PCE1 may be disposed between the first pixel electrodes PXE1 and the connecting electrodes CNE of the first light-emitting elements LE1. That is, the first pixel connecting electrodes PCE1 may connect the first pixel electrodes PXE1 and the connecting electrodes CNE of the first light-emitting elements LE1. The first pixel connecting electrodes PCE1 may extend from middle parts to upper parts of first pixel circuit units PXC1.

The second pixel connecting electrodes PCE2 may be disposed on the second pixel electrodes PXE2. Connecting electrodes CNE of the second light-emitting elements LE2 may be disposed on the second pixel connecting electrodes PCE2. The second pixel connecting electrodes PCE2 may be disposed between the second pixel electrodes PXE2 and the connecting electrodes CNE of the second light-emitting elements LE2. That is, the second pixel connecting electrodes PCE2 may connect the second pixel electrodes PXE2 and the connecting electrodes CNE of the second light-emitting elements LE2. The second pixel connecting electrodes PCE2 may extend from middle parts to lower parts of second pixel circuit units PXC2.

The third pixel connecting electrodes PCE3 may be disposed on the third pixel electrodes PXE3. Connecting electrodes CNE of the third light-emitting elements LE3 may be disposed on the third pixel connecting electrodes PCE3. The third pixel connecting electrodes PCE3 may be disposed between the third pixel electrodes PXE3 and the connecting electrodes CNE of the third light-emitting elements LE3. That is, the third pixel connecting electrodes PCE3 may connect the third pixel electrodes PXE3 and the connecting electrodes CNE of the third light-emitting elements LE3. The third pixel connecting electrodes PCE3 may be disposed in the middle of third pixel circuit units PXC3.

The fourth pixel connecting electrodes PCE4 may be disposed on the fourth pixel electrodes PXE4. Connecting electrodes CNE of the fourth light-emitting elements LE4 may be disposed on the fourth pixel connecting electrodes PCE4. The fourth pixel connecting electrodes PCE4 may be disposed between the fourth pixel electrodes PXE4 and the connecting electrodes CNE of the fourth light-emitting elements LE4. That is, the fourth pixel connecting electrodes PCE4 may connect the fourth pixel electrodes PXE4 and the connecting electrodes CNE of the fourth light-emitting elements LE4. The fourth pixel connecting electrodes PCE4 may extend from middle parts to lower parts of fourth pixel circuit units PXC4.

In one or more embodiments, A first connecting insulating film CINS1 may be disposed on the first pixel electrodes PXE1, the second pixel electrodes PXE2, the third pixel electrodes PXE3, and the fourth pixel electrodes PXE4. The first connecting insulating film CINS1 may be disposed to cover the first pixel electrodes PXE1, the second pixel electrodes PXE2, the third pixel electrodes PXE3, and the fourth pixel electrodes PXE4. In one or more embodiments, the first connecting insulating film CINS1 may be disposed on the first pixel circuit units PXC1, the second pixel circuit units PXC2, the third pixel circuit units PXC3, and the fourth pixel circuit units PXC4. The first connecting insulating film CINS1 may be disposed to cover the first pixel circuit units PXC1, the second pixel circuit units PXC2, the third pixel circuit units PXC3, and the fourth pixel circuit units PXC4. The first connecting insulating film CINS1 may be formed as an inorganic film such as a $SiO_2$ film, an $Al_2O_3$ film, or a $HfO_x$ film.

Each of the first pixel connecting electrodes PCE1, the second pixel connecting electrodes PCE2, the third pixel connecting electrodes PCE3, and the fourth pixel connecting electrodes PCE4 may include first and second subpixel connecting electrodes SPCE1 and SPCE2.

First subpixel connecting electrodes SPCE1 may be disposed on the first connecting insulating film CINS1. The first subpixel connecting electrodes SPCE1 may be connected to the first pixel electrodes PXE1, the second pixel electrodes PXE2, the third pixel electrodes PXE3, or the fourth pixel electrodes PXE4 through first connecting contact holes CCT1, which penetrate the first connecting insulating film CINS1. The first subpixel connecting electrodes SPCE1 may include Au, Cu, an alloy of Au and Sn, an alloy of Ag and Sn, or an alloy of Sn, Au, or Cu, but the present disclosure is not limited thereto.

A second connecting insulating film CINS2 may be disposed on the first subpixel connecting electrodes SPCE1. The second connecting insulating film CINS2 may be disposed to cover the first subpixel connecting electrodes SPCE1. The second connecting insulating film CINS2 may be formed as an inorganic film such as a $SiO_2$ film, an $Al_2O_3$ film, or a $HfO_x$ film.

The second connecting insulating film CINS2 may include second connecting contact holes CCT2, which expose the first subpixel connecting electrodes SPCE1.

Second subpixel connecting electrodes SPCE2 may be disposed in the second connecting contact holes CCT2. The top surfaces of the second subpixel connecting electrodes SPCE2 and the top surface of the second connecting insulating film CINS2 may be flat. The second subpixel connecting electrodes SPCE2 may include Au, Cu, an alloy of Au and Sn, an alloy of Ag and Sn, or an alloy of Sn, Au, or Cu, but the present disclosure is not limited thereto.

To raise the internal quantum efficiency of the first light-emitting elements LE1, the area of the first light-emitting element LE1 may be configured to be greater than each of the area of the second light-emitting element LE2, the area of the third light-emitting element LE3, and the area of the fourth light-emitting element LE4. Also, the first light-emitting elements LE1, the second light-emitting elements LE2, the third light-emitting elements LE3, and the fourth light-emitting elements LE4 that form a single pixel PX together may be designed into a PENTILE® structure having a diamond or rhombus shape in a plan view. In this case, the locations of the overlapping areas of the first pixel circuit units PXC1 and the first light-emitting elements LE1, the locations of the overlapping areas of the second pixel circuit units PXC2 and the second light-emitting elements LE2, the locations of the overlapping areas of the third pixel circuit units PXC3 and the third light-emitting elements LE3, and the locations of the overlapping areas of the fourth pixel circuit units PXC4 and the fourth light-emitting elements LE4 may differ from one another.

In a case where a plurality of pixel electrodes (PXE1, PXE2, PXE3, and PXE4) and connecting electrodes CNE are connected using a plurality of pixel connecting electrodes (PCE1, PCE2, PCE3, and PCE4), as illustrated in FIGS. 10 and 11, a plurality of pixel electrodes (PXE1, PXE2, PXE3, and PXE4) may be placed at the same locations in a plurality of pixel circuit units (PXC1, PXC2, PXC3, and PXC4), for example, in the middle of the pixel circuit units (PXC1, PXC2, PXC3, and PXC4).

The second pixel connecting electrodes PCE2 may extend from the second pixel electrodes PXE2 to the overlapping areas of the second pixel circuit units PXC2 and the second light-emitting elements LE2. Also, the fourth pixel connecting electrodes PCE4 may extend from the fourth pixel electrodes PXE4 to the overlapping areas of the fourth pixel circuit units PXC4 and the fourth light-emitting elements LE4.

As the first pixel circuit units PXC1 completely overlap with the first light-emitting elements LE1 but the first pixel electrodes PXE1 do not overlap with the connecting electrodes CNE of the first light-emitting elements LE1 in a third direction DR3, the first pixel connecting electrodes PCE1 may extend to the connecting electrodes CNE of the first light-emitting elements LE1 in the horizontal direction. Because, the second pixel electrodes PXE2 do not overlap with the connecting electrodes CNE of the second light-emitting elements LE2 in a third direction DR3, the second pixel connecting electrodes PCE2 may extend to the connecting electrodes CNE of the second light-emitting elements LE2 in the horizontal direction. As the third pixel circuit units PXC3 completely overlap with the third light-emitting elements LE3 and the third pixel electrodes PXE3 overlap with the connecting electrodes CNE of the third light-emitting elements LE3 in the third direction DR3, the third pixel connecting electrodes PCE3 may not extend in a horizontal direction, but may extend in the third direction DR3. Because the fourth pixel electrodes PXE4 overlap with the connecting electrodes CNE of the fourth light-emitting elements LE4 in the third direction DR3, the fourth pixel connecting electrodes PCE4 may not extend in a horizontal direction, but may extend in the third direction DR3. The horizontal direction includes the first direction DR1, the second direction DR2, the first diagonal direction DD1, and the second diagonal direction DD2.

Figure 12:
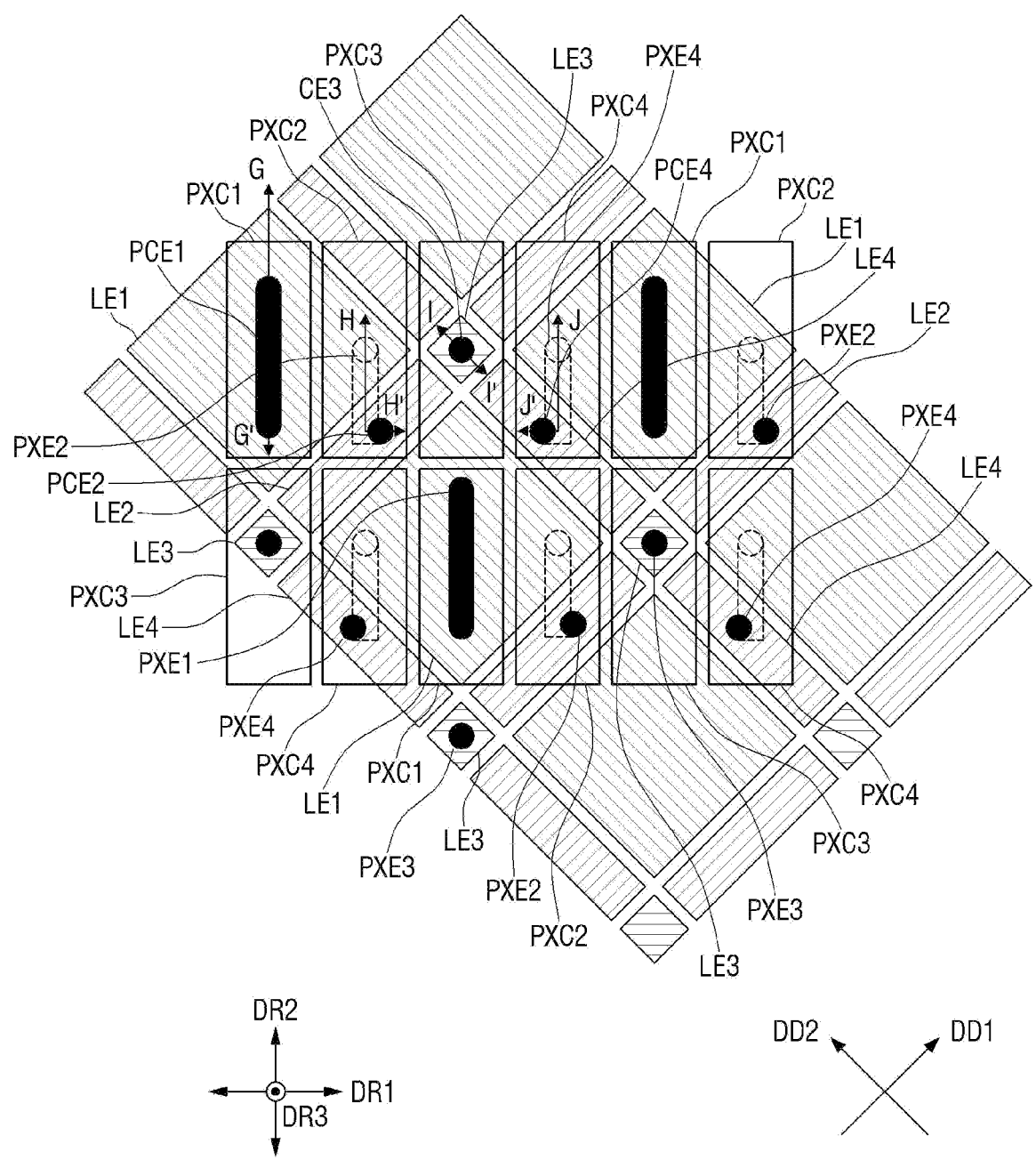
FIG. 12 is a layout view of a display area of a display panel according to another embodiment of the present disclosure.
Figure 13:
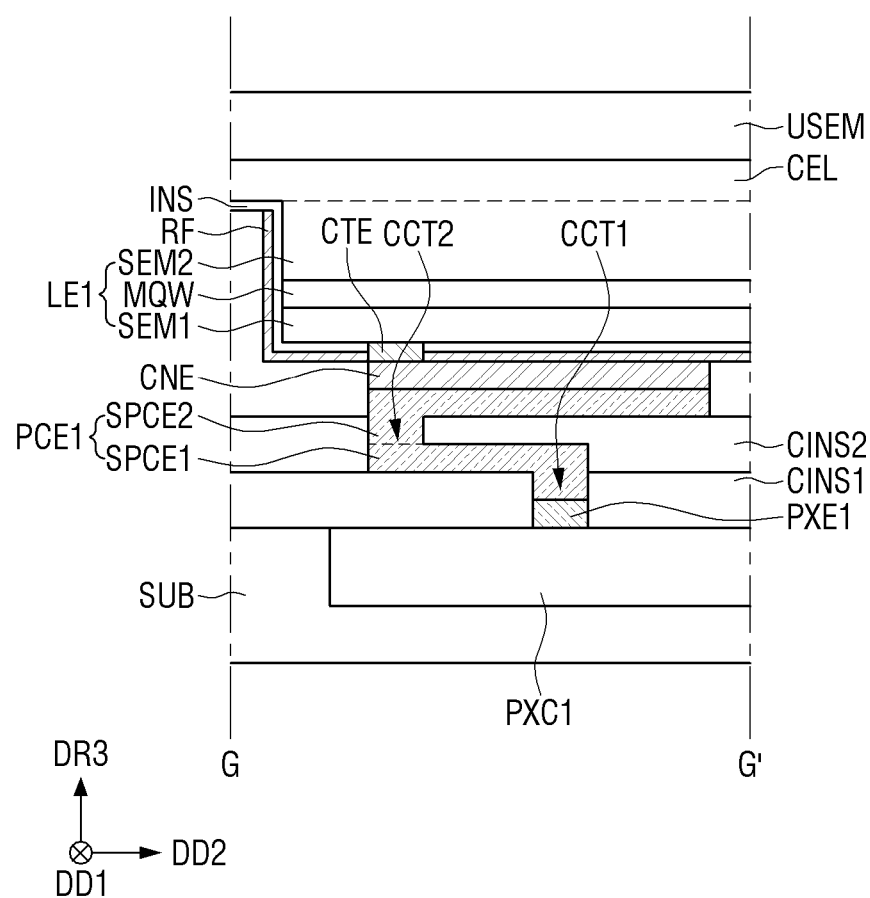
FIG. 13 is a cross-sectional view taken along the line G-G' of FIG. 12.

FIG. 12 is a layout view of a display area of a display panel according to one or more embodiments of the present disclosure. FIG. 13 is a cross-sectional view taken along the line G-G' of FIG. 12.

The embodiment of FIGS. 12 and 13 differs from the embodiment of FIGS. 10 and 11 in that first pixel connecting electrodes PCE1, which are in contact with connecting electrodes CNE of first light-emitting elements LE1, are enlarged. Descriptions of features or elements that have already been described above with reference to FIGS. 10 and 11 will be omitted. Cross-sectional views taken along the lines H-H', I-I', and J-J' of FIG. 12 are substantially the same as their respective counterparts of FIG. 11 and are thus not illustrated.

Referring to FIGS. 12 and 13, as first pixel circuit units PXC1 completely overlap with the first light-emitting elements LE1, the first pixel connecting electrodes PCE1 may be connected to the first light-emitting elements LE1 at any locations in the first pixel circuit units PXC1. Thus, the first pixel connecting electrodes PCE1 may be disposed to range from the upper sides to the lower sides of the first pixel circuit units PXC1. As the first pixel circuit units PXC1 extend in a second direction DR2, the first pixel connecting electrodes PCE1 may also extend in the second direction DR2. The area of the first pixel connecting electrode PCE1 may be greater than each of the area of second pixel connecting electrode PCE2, the area of the third pixel connecting electrode PCE3, and the area of the fourth pixel connecting electrode PCE4. The area of the third pixel connecting electrode PCE3 may be smaller than each of the area of the first pixel connecting electrode PCE1, the area of the second pixel connecting electrode PCE2, and the area of the fourth pixel connecting electrode PCE4.

The contact resistance between the first pixel connecting electrodes PCE1 and connecting electrodes CNE of the first light-emitting elements LE1 can be lowered by increasing the contact areas between the first pixel connecting electrodes PCE1 and the connecting electrodes CNE of the first light-emitting elements LE1, as illustrated in FIGS. 12 and 13. Thus, the current density in the first light-emitting elements LE1 can be further lowered.

Figure 14:
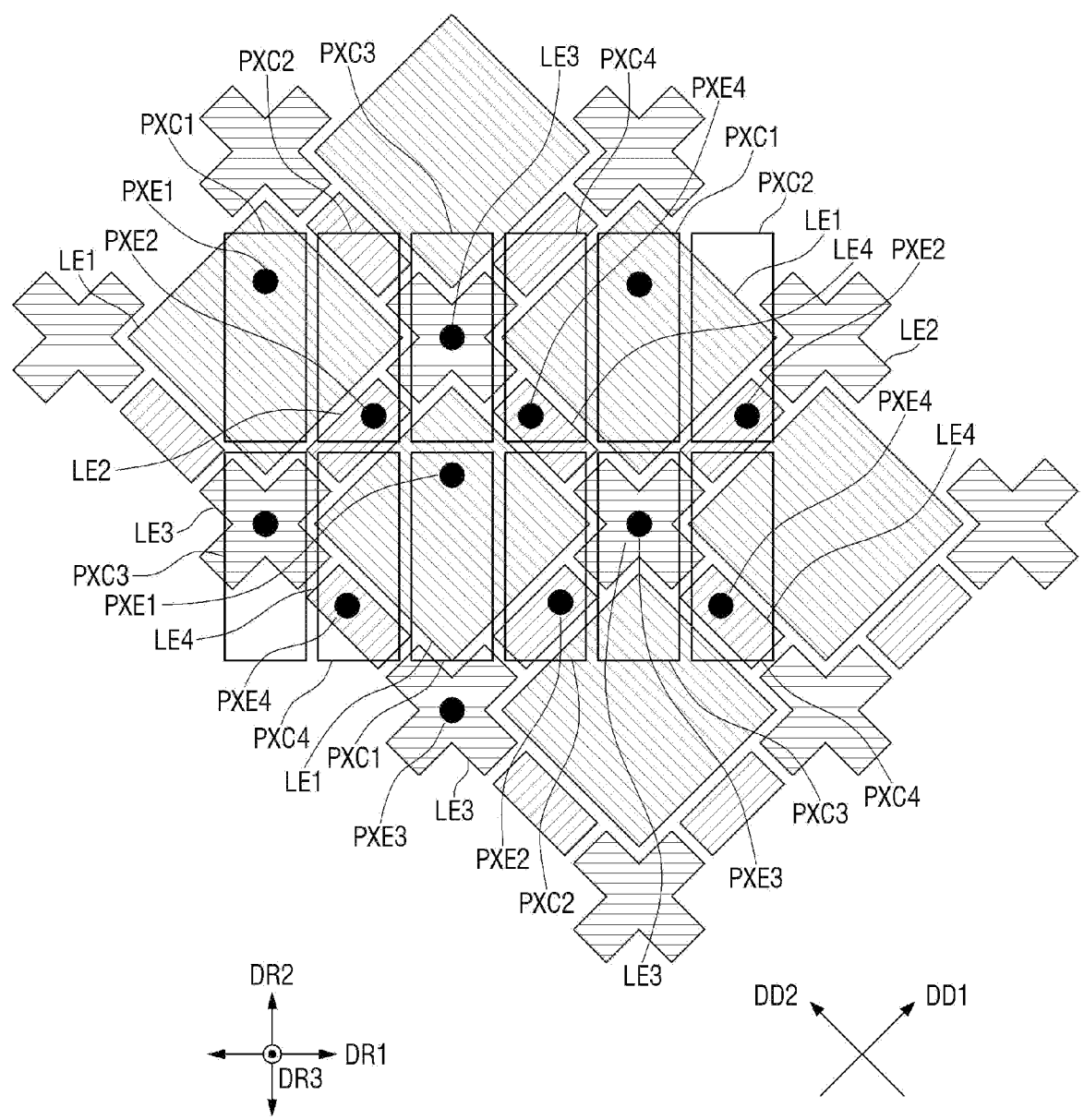
FIG. 14 is a layout view of a display area of a display panel according to one or more embodiments of the present disclosure.

FIG. 14 is a layout view of a display area of a display panel according to one or more embodiments of the present disclosure.

The embodiment of FIG. 14 differs from the embodiment of FIG. 3 in that the area of third light-emitting element LE3 is greater than each of the area of second light-emitting element LE2 and the area of fourth light-emitting element LE4.

Referring to FIG. 14, in a case where the internal quantum efficiency of the third light-emitting elements LE3 varies more considerably than the internal quantum efficiencies of the second light-emitting elements LE2 and the fourth light-emitting elements LE4 with respect to current density, the area of the third light-emitting elements LE3 may be greater than each of the area of the second light-emitting element LE2 and the area of the fourth light-emitting elements LE4. Accordingly, the third light-emitting elements LE3 may have an X shape in a plan view.

In this case, the length of the third light-emitting element LE3 in a first diagonal direction DD1 may be greater than each of the length of the second light-emitting element LE2 and the length of the fourth light-emitting element LE4 in the first diagonal direction DD1. The length of the third light-emitting element LE3 in a second diagonal direction DD2 may be greater than the length of the second light-emitting element LE2 and the length of the fourth light-emitting element LE4 in the second diagonal direction DD2.

Second and third light-emitting elements LE2 and LE3 may be disposed on first and second sides of each of the first light-emitting elements LE1 in the second diagonal direction DD2, and third and fourth light-emitting elements LE3 and LE4 may be disposed on third and fourth sides of each of the first light-emitting elements LE1 in the first diagonal direction DD1. In this case, the first and second sides of each of the first light-emitting elements LE1 may be opposite to each other, and the third and fourth sides of each of the first light-emitting elements LE1 may be opposite to each other.

Figure 15:
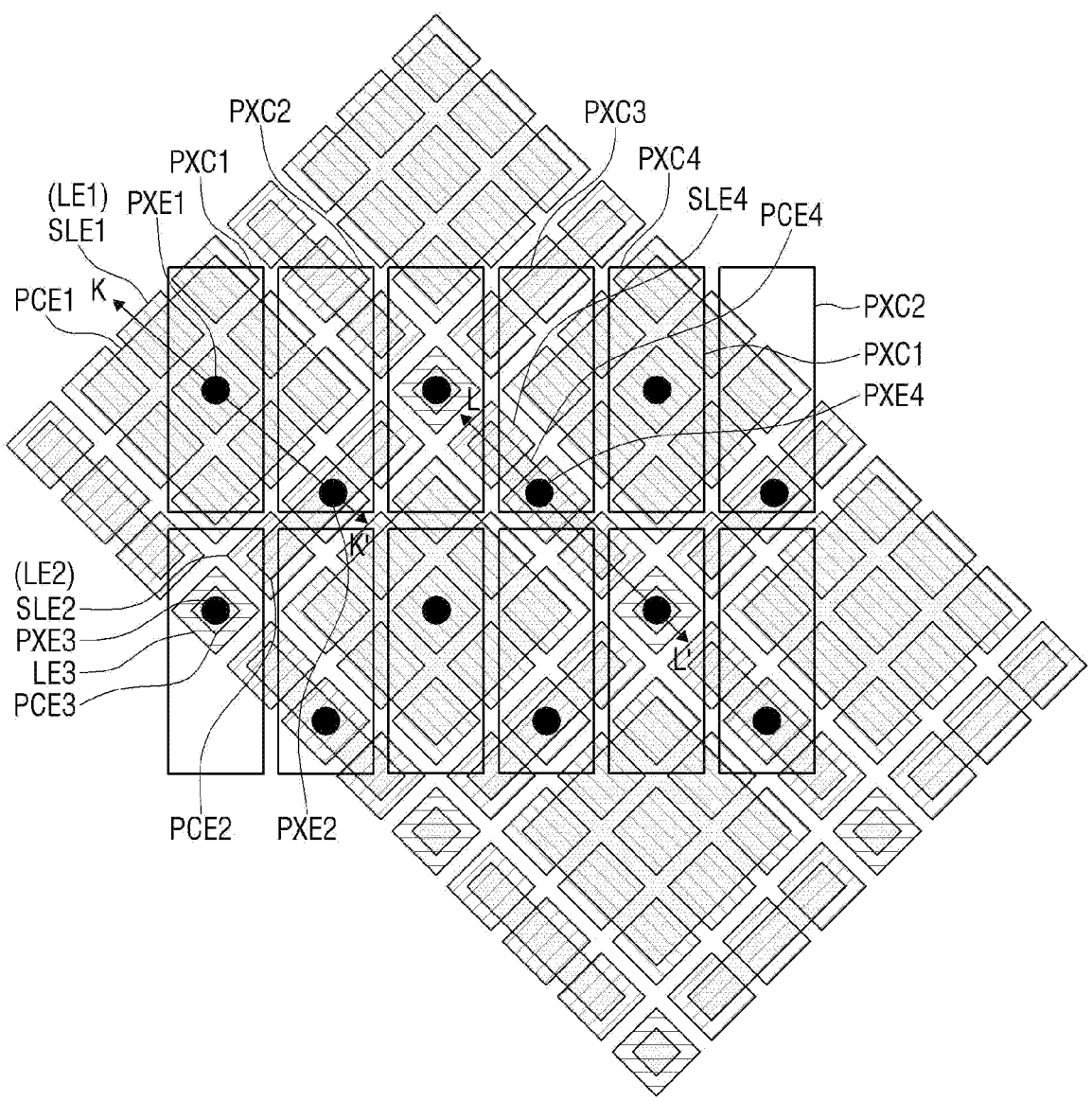
FIG. 15 is a layout view of a display area of a display panel according to one or more embodiments of the present disclosure.
Figure 16:
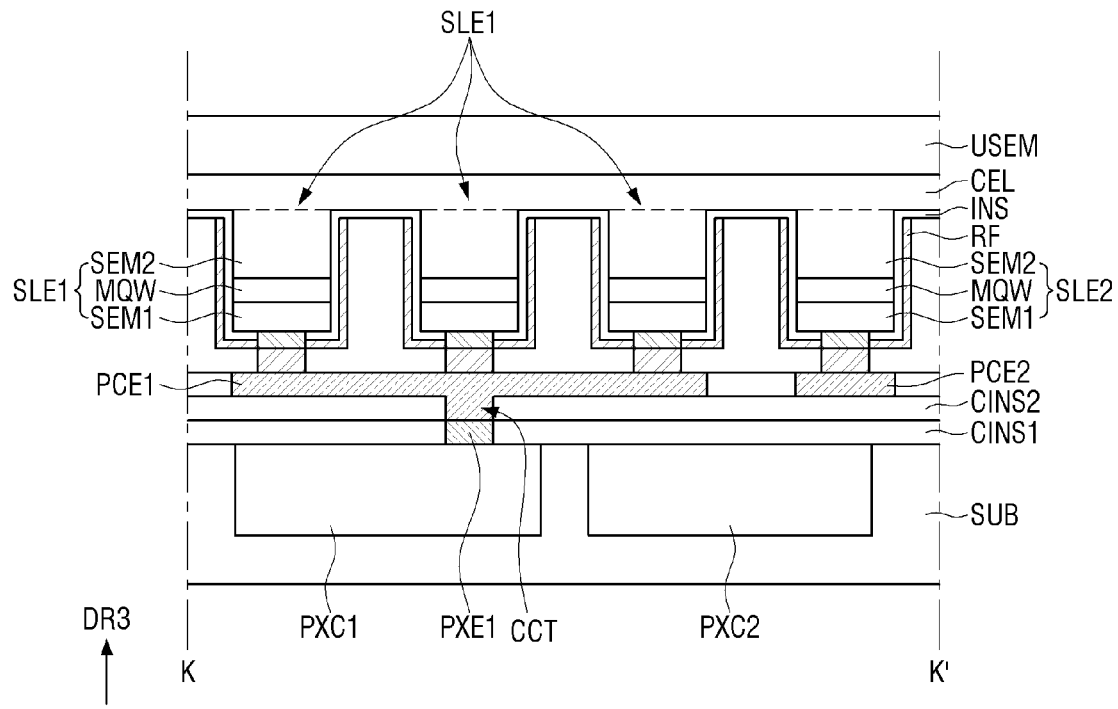
FIG. 16 illustrates cross-sectional views taken along the lines K-K' and L-L' of FIG. 15.
Figure 16:
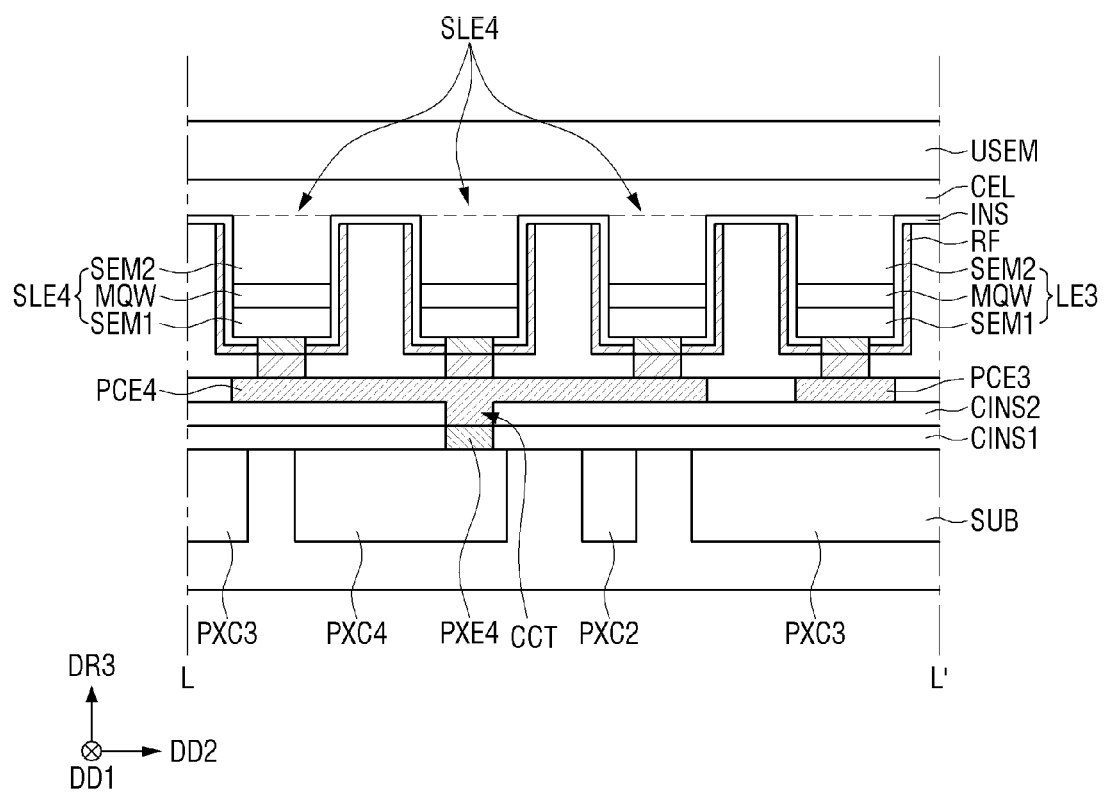

FIG. 15 is a layout view of a display area of a display panel according to one or more embodiments of the present disclosure. FIG. 16 illustrates cross-sectional views taken along the lines K-K' and L-L' of FIG. 15.

The embodiment of FIGS. 15 and 16 differs from the embodiment of FIGS. 3 and 8 in that each of first light-emitting elements LE1 includes a plurality of first sub-light-emitting elements SLE1, each of second light-emitting elements LE2 includes a plurality of second sub-light-emitting elements SLE2, and each of fourth light-emitting elements LE4 includes a plurality of fourth sub-light-emitting elements SLE4. The embodiment of FIGS. 15 and 16 will hereinafter be described, focusing mainly on the differences with the embodiment of FIGS. 3 and 8.

Referring to FIGS. 15 and 16, a plurality of first sub-light-emitting elements SLE1 may be arranged in a matrix in first and second diagonal directions DD1 and DD2. FIG. 15 illustrates that the first sub-light-emitting elements SLE1 are arranged in a 3×3 matrix along the first and second diagonal directions DD1 and DD2, but the present disclosure is not limited thereto.

The first sub-light-emitting elements SLE1 may have the same size. The first sub-light-emitting elements SLE1 may all have the same length not only in the first diagonal direction DD1, but also in the second diagonal direction DD2. The length of the first sub-light-emitting element SLE1 in the first diagonal direction DD1 may be the same as the length of the first sub-light-emitting element SLE1 in the second diagonal direction DD2. That is, the first sub-light-emitting elements SLE1 may have a square shape in a plan view.

A plurality of second sub-light-emitting elements SLE2 may be arranged along the first diagonal direction DD1. FIG. 15 illustrates that each of the second light-emitting elements LE2 includes three second sub-light-emitting elements SLE2 arranged along the first diagonal direction DD1, but the present disclosure is not limited thereto.

The second sub-light-emitting elements SLE2 may all have the same size. The length of the second sub-light-emitting element SLE2 in the first diagonal direction DD1 may be the same as the length of the second sub-light-emitting element SLE2 in the second diagonal direction DD2. That is, the second sub-light-emitting elements SLE2 may have a square shape in a plan view.

A plurality of fourth sub-light-emitting elements SLE4 may be arranged along the second diagonal direction DD2. FIG. 15 illustrates that each of the fourth light-emitting elements LE4 includes three fourth sub-light-emitting elements SLE4 arranged along the second diagonal direction DD2, but the present disclosure is not limited thereto.

The fourth sub-light-emitting elements SLE4 may all have the same size. The length of the fourth sub-light-emitting element SLE4 in the first diagonal direction DD1 may be the same as the length of the fourth sub-light-emitting element SLE4 in the second diagonal direction DD2. That is, the fourth sub-light-emitting elements SLE4 may have a square shape in a plan view.

The first sub-light-emitting elements SLE1, the second sub-light-emitting elements SLE2, third light-emitting elements LE3, and the fourth sub-light-emitting elements SLE4 may all have the same size. Each of the length of the first sub-light-emitting element SLE1, the length of the second sub-light-emitting element SLE2, the length of the third light-emitting element LE3, and the length of the fourth sub-light-emitting element SLE4 in the first diagonal direction DD1 may all be substantially the same. Each of the length of the first sub-light-emitting element SLE1, the length of the second sub-light-emitting element SLE2, the length of the third light-emitting element LE3, and the length of the fourth sub-light-emitting element SLE4 in the second diagonal direction DD2 may all be substantially the same.

The first sub-light-emitting elements SLE1 may be disposed on a first pixel connecting electrode PCE1. The first sub-light-emitting elements SLE1 may be connected in common to the first pixel connecting electrode PCE1. The first pixel connecting electrode PCE1 may be disposed on a second connecting insulating film CINS2 and may thus be connected to connecting electrodes CNE of the first sub-light-emitting elements SLE1. The first pixel connecting electrode PCE1 may be connected to a first pixel electrode PXE1, not covered, but exposed by a first connecting insulating film CINS1 and the second connecting insulating film CINS2 through a connecting contact hole CCT, which penetrates the second connecting insulating film CINS2.

As the first sub-light-emitting elements SLE1 are connected in common to the first pixel connecting electrode PCE1, the first sub-light-emitting elements SLE1 may be connected in parallel between the first pixel electrode PXE1 and a common electrode layer CEL. Thus, a first driving current from a first pixel circuit unit PXC1 may be distributed between the first sub-light-emitting elements SLE1 through the first pixel electrode PXE1. Accordingly, the current density in each of the first sub-light-emitting elements SLE1 may be prevented from increasing. Therefore, the internal quantum efficiency of each of the first sub-light-emitting elements SLE1 may be prevented from being lowered.

The second sub-light-emitting elements SLE2 may be disposed on a second pixel connecting electrode PCE2. The second sub-light-emitting elements SLE2 may be connected in common to the second pixel connecting electrode PCE2. The second pixel connecting electrode PCE2 may be disposed on the second connecting insulating film CINS2 and may thus be connected to connecting electrodes CNE of the second sub-light-emitting elements SLE2. In one or more embodiments, the second pixel connecting electrode PCE2 may be connected to a second pixel electrode PXE2, not covered, but exposed by the first and second connecting insulating films CINS1 and CINS2 through a connecting contact hole CCT, which penetrates the second connecting insulating film CINS2.

As the second sub-light-emitting elements SLE2 are connected in common to the second pixel connecting electrode PCE2, in one or more embodiments, the second sub-light-emitting elements SLE2 may be connected in parallel between the second pixel electrode PXE2 and the common electrode layer CEL. Thus, a second driving current from a second pixel circuit unit PXC2 may be distributed between the second sub-light-emitting elements SLE2 through the second pixel electrode PXE2. Accordingly, the current density in each of the second sub-light-emitting elements SLE2 may be prevented from increasing. Therefore, the internal quantum efficiency of each of the second sub-light-emitting elements SLE2 may be prevented from being lowered.

The fourth sub-light-emitting elements SLE4 may be disposed on a fourth pixel connecting electrode PCE4. The fourth sub-light-emitting elements SLE4 may be connected in common to the fourth pixel connecting electrode PCE4. The fourth pixel connecting electrode PCE4 may be disposed on the second connecting insulating film CINS2 and may thus be connected to connecting electrodes CNE of the fourth sub-light-emitting elements SLE4. The fourth pixel connecting electrode PCE4 may be connected to a fourth pixel electrode PXE4, not covered, but exposed by the first and second connecting insulating films CINS1 and CINS2 through a connecting contact hole CCT, which penetrates the second connecting insulating film CINS2.

As the fourth sub-light-emitting elements SLE4 are connected in common to the fourth pixel connecting electrode PCE4, the fourth sub-light-emitting elements SLE4 may be connected in parallel between the fourth pixel electrode PXE4 and the common electrode layer CEL. Thus, a fourth driving current from a fourth pixel circuit unit PXC4 may be distributed between the fourth sub-light-emitting elements SLE4 through the fourth pixel electrode PXE4. Accordingly, the current density in each of the fourth sub-light-emitting elements SLE4 may be prevented from increasing. Therefore, the internal quantum efficiency of each of the fourth sub-light-emitting elements SLE4 may be prevented from being lowered.

The area of the first pixel connecting electrode PCE1 may be greater than each of the area of the second pixel connecting electrode PCE2, the area of the third pixel connecting electrode PCE3, and the area of the fourth pixel connecting electrode PCE4. Also, each of the area of the second pixel connecting electrode PCE2 and the area of the fourth pixel connecting electrode PCE4 may be greater than the area of the third pixel connecting electrode PCE3.

The first sub-light-emitting elements SLE1, the second sub-light-emitting elements SLE2, the third light-emitting elements LE3, and the fourth sub-light-emitting elements SLE4 are illustrated as having a square shape in a plan view, but the present disclosure is not limited thereto. Alternatively, the first sub-light-emitting elements SLE1, the second sub-light-emitting elements SLE2, the third light-emitting elements LE3, and the fourth sub-light-emitting elements SLE4 may have a tetragonal shape other than a square shape, a non-tetragonal polygonal shape, a circular shape, an elliptical shape, or an amorphous shape in a plan view.

The first sub-light-emitting elements SLE1, the second sub-light-emitting elements SLE2, the third light-emitting elements LE3, and the fourth sub-light-emitting elements SLE4 are illustrated as having the same size, but the present disclosure is not limited thereto. Alternatively, the first sub-light-emitting elements SLE1, the second sub-light-emitting elements SLE2, the third light-emitting elements LE3, and/or the fourth sub-light-emitting elements SLE4 may have different sizes.

Figure 17:
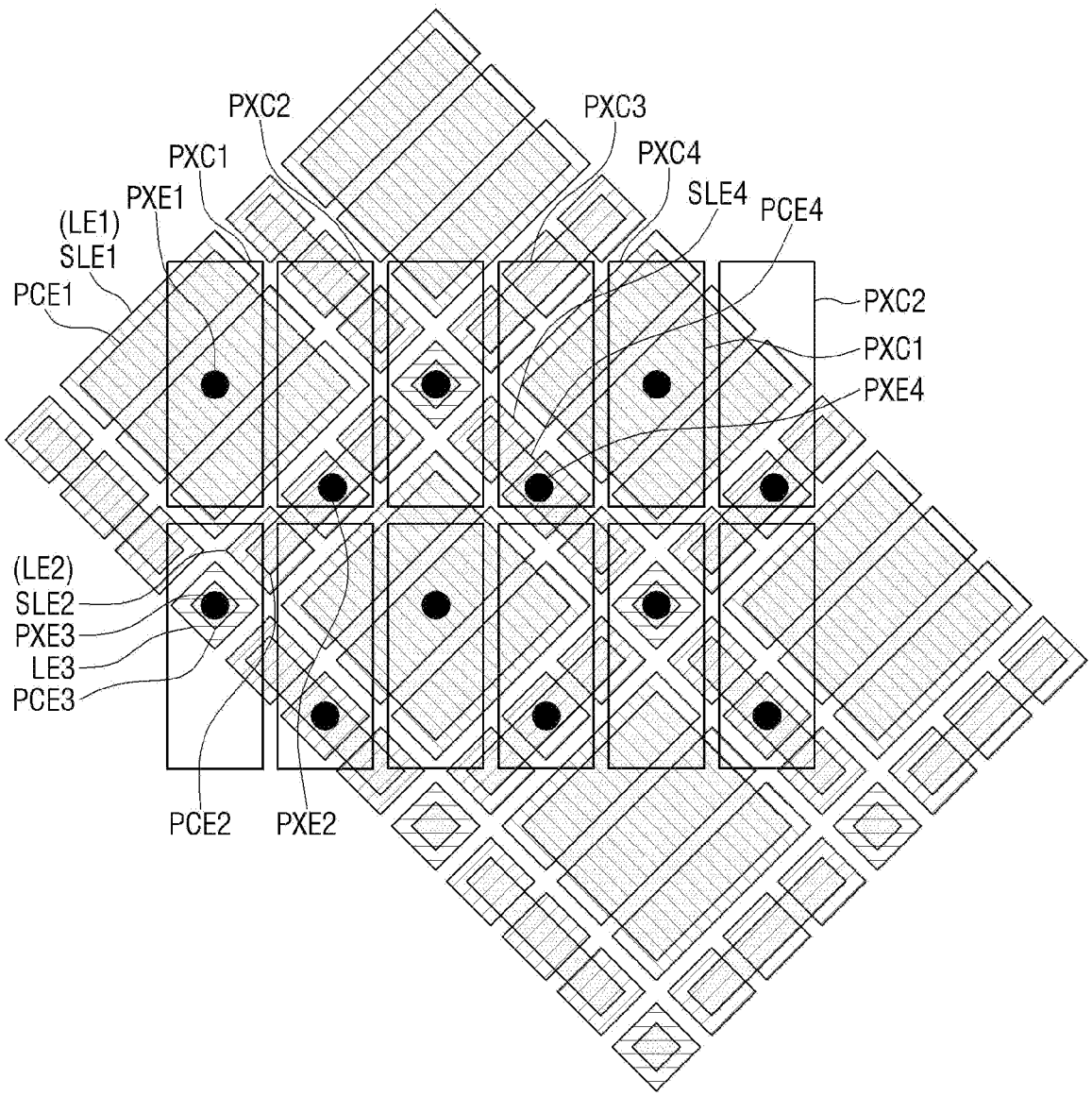
FIG. 17 is a layout view of a display area of a display panel according to one or more embodiments of the present disclosure.
Figure 17:
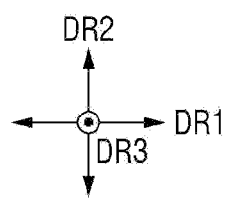
Figure 17:
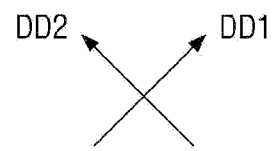

FIG. 17 is a layout view of a display area of a display panel according to one or more embodiments of the present disclosure.

The embodiment of FIG. 17 differs from the embodiment of FIG. 15 in that the area of first sub-light-emitting element SLE1 is greater than each of the area of second sub-light-emitting element SLE2, the area of the third light-emitting elements LE3, and the area of the fourth sub-light-emitting elements SLE4. The embodiment of FIG. 17 will hereinafter be described, focusing mainly on the differences with the embodiment of FIG. 15.

Referring to FIG. 17, the first sub-light-emitting elements SLE1 may extend in a first diagonal direction DD1. The first sub-light-emitting elements SLE1 may have a rectangular shape having long sides in the first diagonal direction DD1 and short sides in a second diagonal direction DD2, in a plan view. In this case, the length of the first sub-light-emitting element SLE1 in the first diagonal direction DD1 may be greater than each of the length of the second sub-light-emitting element SLE2, the length of the third light-emitting element LE3, and the length of the fourth sub-light-emitting element SLE4 in the first diagonal direction DD1. Each of the length of the first sub-light-emitting element SLE1, the length of the second sub-light-emitting element SLE2, the length of the third light-emitting element LE3, and the length of the fourth sub-light-emitting element SLE4 in the second diagonal direction DD2 may all be substantially the same.

Alternatively, the first sub-light-emitting elements SLE1 may extend in the second diagonal direction DD2. The first sub-light-emitting elements SLE1 may have a rectangular shape having short sides in the first diagonal direction DD1 and long sides in the second diagonal direction DD2, in a plan view. In this case, each of the length of the first sub-light-emitting element SLE1, the length of the second sub-light-emitting element SLE2, the length of the third light-emitting element LE3, and the length of the fourth sub-light-emitting element SLE4 in the first diagonal direction DD1 may all be substantially the same. The length of the first sub-light-emitting element SLE1 in the second diagonal direction DD2 may be greater than each of the length of the second sub-light-emitting element SLE2, the length of the third light-emitting element LE3, and the length of the fourth sub-light-emitting element SLE4 in the second diagonal direction DD2.

The first sub-light-emitting elements SLE1 are illustrated as having a rectangular shape in a plan view, but the present disclosure is not limited thereto. That is, the first sub-light-emitting elements SLE1 may have a tetragonal shape other than a rectangular shape, a non-tetragonal polygonal shape, a circular shape, an elliptical shape, or an amorphous shape in a plan view.

The first sub-light-emitting elements SLE1 are illustrated as having the same shape in a plan view, but the present disclosure is not limited thereto. Alternatively, at least two of the first sub-light-emitting elements SLE1 may have a different shape from the other first sub-light-emitting elements SLE1, in a plan view.

Figure 18:
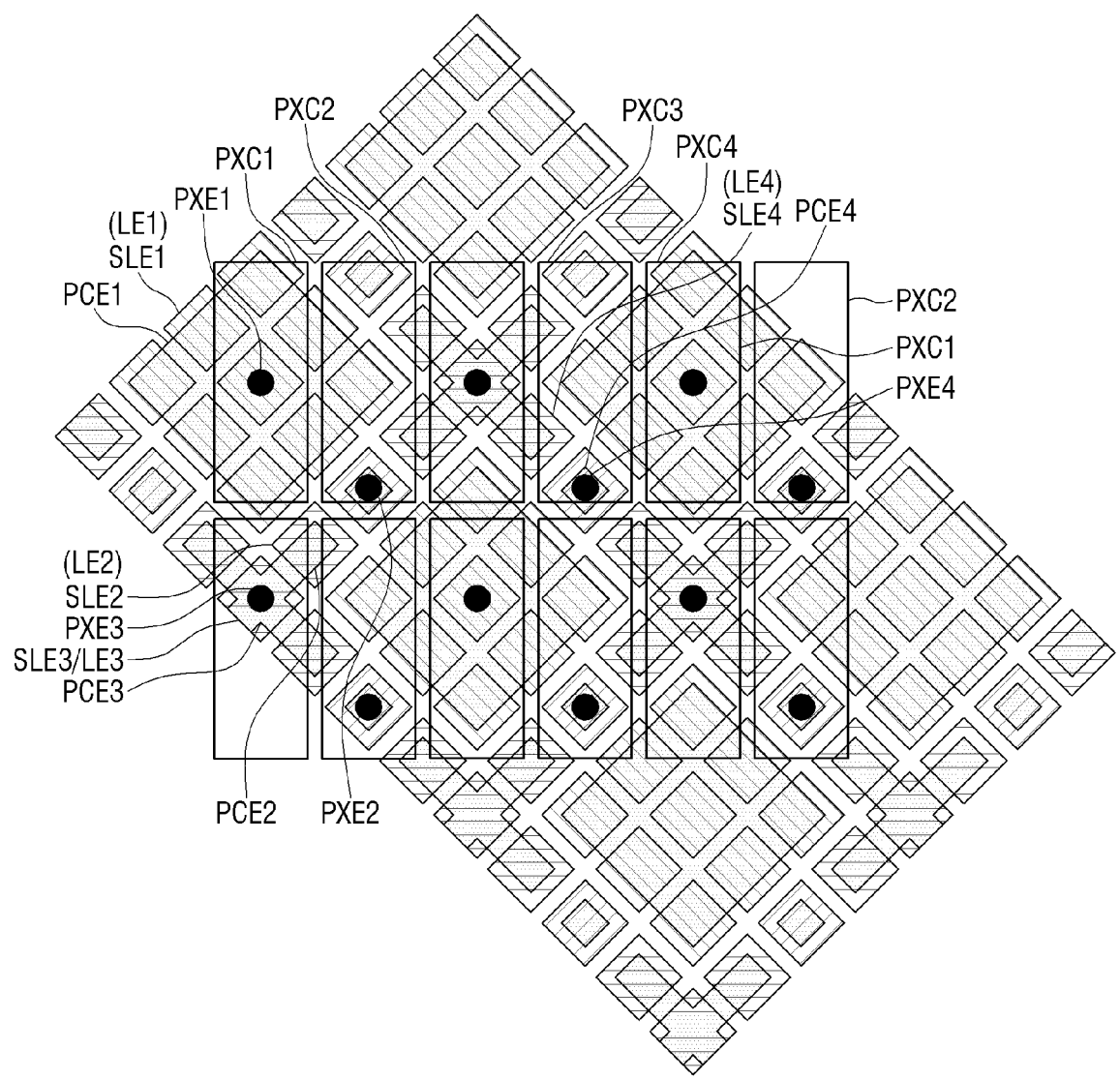
FIG. 18 is a layout view of a display area of a display panel according to one or more embodiments of the present disclosure.

FIG. 18 is a layout view of a display area of a display panel according to one or more embodiments of the present disclosure.

The embodiment of FIG. 18 differs from the embodiment of FIG. 3 in that each of first light-emitting elements LE1 includes a plurality of first sub-light-emitting elements SLE1, and that each of third light-emitting elements LE3 includes a plurality of third sub-light-emitting elements SLE3. The embodiment of FIG. 18 will hereinafter be described, focusing mainly on the differences with the embodiment of FIG. 3. The first sub-light-emitting elements SLE1 and a first pixel connecting electrode PCE1 are substantially the same as their respective counterparts of FIGS. 15 and 16, and thus, detailed descriptions thereof will be omitted.

Referring to FIG. 18, in a case where the internal quantum efficiency of the third light-emitting elements LE3 varies more considerably than the internal quantum efficiencies of second light-emitting elements LE2 and fourth light-emitting elements LE4 with respect to current density, the area of the third light-emitting element LE3 may be greater than each of the area of the second light-emitting element LE2 and the area of the fourth light-emitting element LE4. Accordingly, in one or more embodiments, each of the third light-emitting elements LE3 may include a plurality of third sub-light-emitting elements SLE3 arranged in an X shape.

For example, in one or more embodiments, in each of the third light-emitting elements LE3, three third sub-light-emitting elements SLE3 may be arranged in the first diagonal direction DD1, and three third sub-light-emitting elements SLE3 may be arranged in the second diagonal direction DD2. In this example, one of the three third sub-light-emitting elements SLE3 arranged in the first diagonal direction DD1 and one of the three third sub-light-emitting elements SLE3 arranged in the second diagonal direction DD2 may be the same third sub-light-emitting element SLE3.

The third sub-light-emitting elements SLE3 may have the same size. The third sub-light-emitting elements SLE3 may all have the same length not only in the first diagonal direction DD1, but also in the second diagonal direction DD2. The length of the third sub-light-emitting element SLE3 in the first diagonal direction DD1 may be the same as the length of the third sub-light-emitting element SLE3 in the second diagonal direction DD2. That is, the third sub-light-emitting element SLE3 may have a square shape in a plan view.

In one or more embodiments, the first sub-light-emitting elements SLE1, the second light-emitting elements LE2, the third sub-light-emitting elements SLE3, and the fourth light-emitting elements LE4 may all have the same size. Each of the length of the first sub-light-emitting element SLE1, the length of the second light-emitting element LE2, the length of the third sub-light-emitting element SLE3, and the length of the fourth light-emitting element LE4 in the first diagonal direction DD1 may all be substantially the same. Each of the length of the first sub-light-emitting element SLE1, the length of the second light-emitting element LE2, the length of the third sub-light-emitting element SLE3, and the length of the fourth light-emitting element LE4 in the second diagonal direction DD2 may all be substantially the same.

In one or more embodiments, the third sub-light-emitting elements SLE3 may be disposed on a third pixel connecting electrode PCE3. The third sub-light-emitting elements SLE3 may be connected in common to the third pixel connecting electrode PCE3. The third pixel connecting electrode PCE3 may be disposed on a second connecting insulating film CINS2 and may thus be connected to connecting electrodes CNE of the third sub-light-emitting elements SLE3. The third pixel connecting electrode PCE3 may be connected to a third pixel electrode PXE3, not covered, but exposed by a first connecting insulating film CINS1 and the second connecting insulating film CINS2 through a connecting contact hole CCT, which penetrates the second connecting insulating film CINS2.

In one or more embodiments, as the third sub-light-emitting elements SLE3 are connected in common to the third pixel connecting electrode PCE3, the third sub-light-emitting elements SLE3 may be connected in parallel between the third pixel electrode PXE3 and a common electrode layer CEL. Thus, a third driving current from a third pixel circuit unit PXC3 may be distributed between the third sub-light-emitting elements SLE3 through the third pixel electrode PXE3. Accordingly, the current density in each of the third sub-light-emitting elements SLE3 may be prevented from increasing. Therefore, the internal quantum efficiency of each of the third sub-light-emitting elements SLE3 may be prevented from being lowered.

The first sub-light-emitting elements SLE1, the second light-emitting elements LE2, the third sub-light-emitting elements SLE3, and the fourth light-emitting elements LE4 are illustrated as having a square shape in a plan view, but the present disclosure is not limited thereto. That is, the first sub-light-emitting elements SLE1, the second light-emitting elements LE2, the third sub-light-emitting elements SLE3, and the fourth light-emitting elements LE4 may have a tetragonal shape other than a square shape, a non-tetragonal polygonal shape, a circular shape, an elliptical shape, or an amorphous shape in a plan view.

The first sub-light-emitting elements SLE1, the second light-emitting elements LE2, the third sub-light-emitting elements SLE3, and the fourth light-emitting elements LE4 are illustrated as having the same size, but the present disclosure is not limited thereto. Alternatively, the first sub-light-emitting elements SLE1, the second light-emitting elements LE2, the third sub-light-emitting elements SLE3, and/or the fourth light-emitting elements LE4 may have different sizes.

Figure 19:
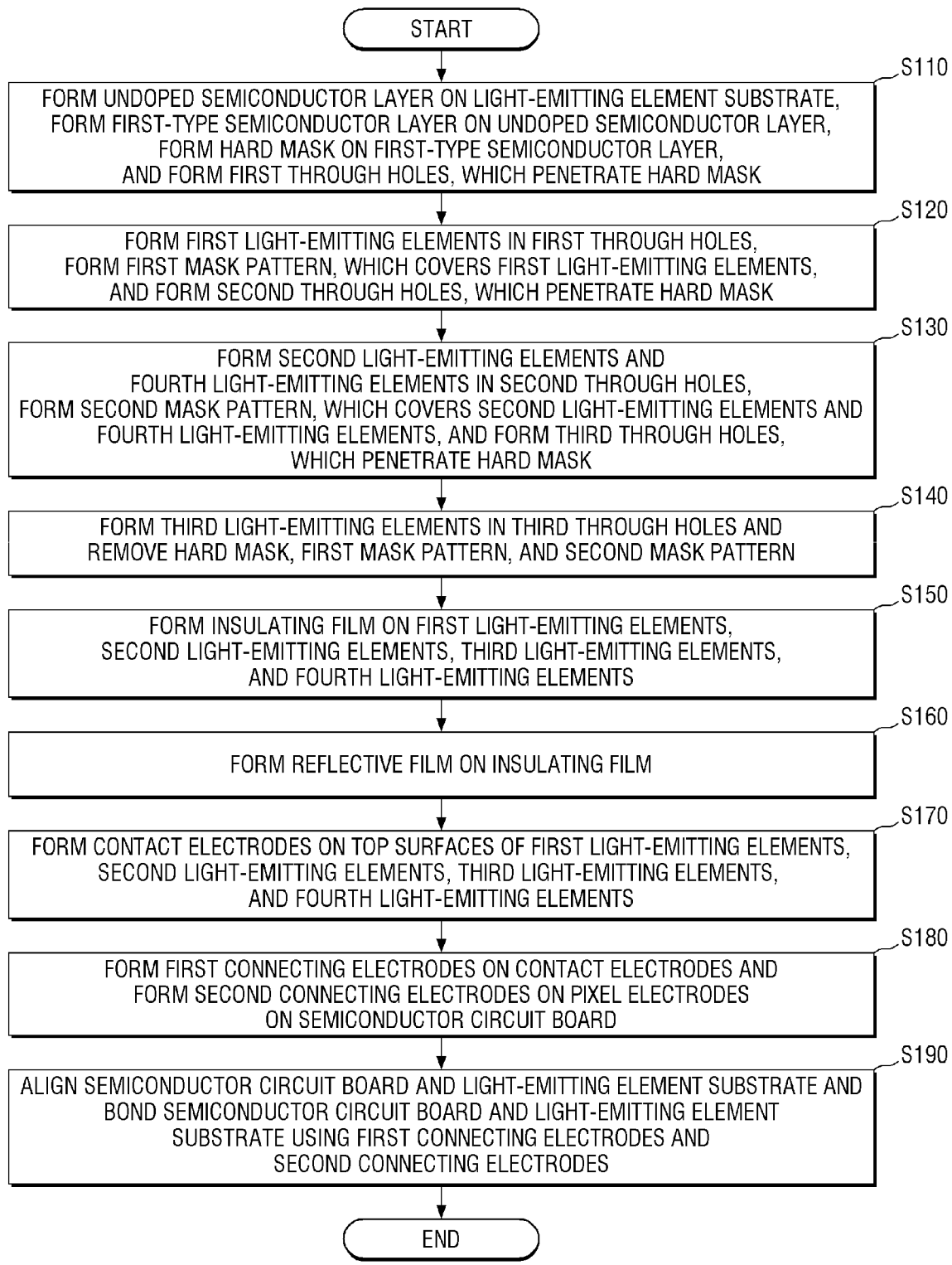
FIG. 19 is a flowchart illustrating a method of fabricating a display device according to one or more embodiments of the present disclosure.

FIG. 19 is a flowchart illustrating a method of fabricating a display device according to one or more embodiments of the present disclosure. FIGS. 20 through 28 are cross-sectional views illustrating the method of FIG. 19.

FIGS. 20 through 28 are cross-sectional views, taken along the lines A-A' and B-B' of FIG. 3, of a display panel obtained by the method of FIG. 19. A method of fabricating a display device according to one or more embodiments of the present disclosure will hereinafter be described with reference to FIGS. 19 through 28.

Figure 20:
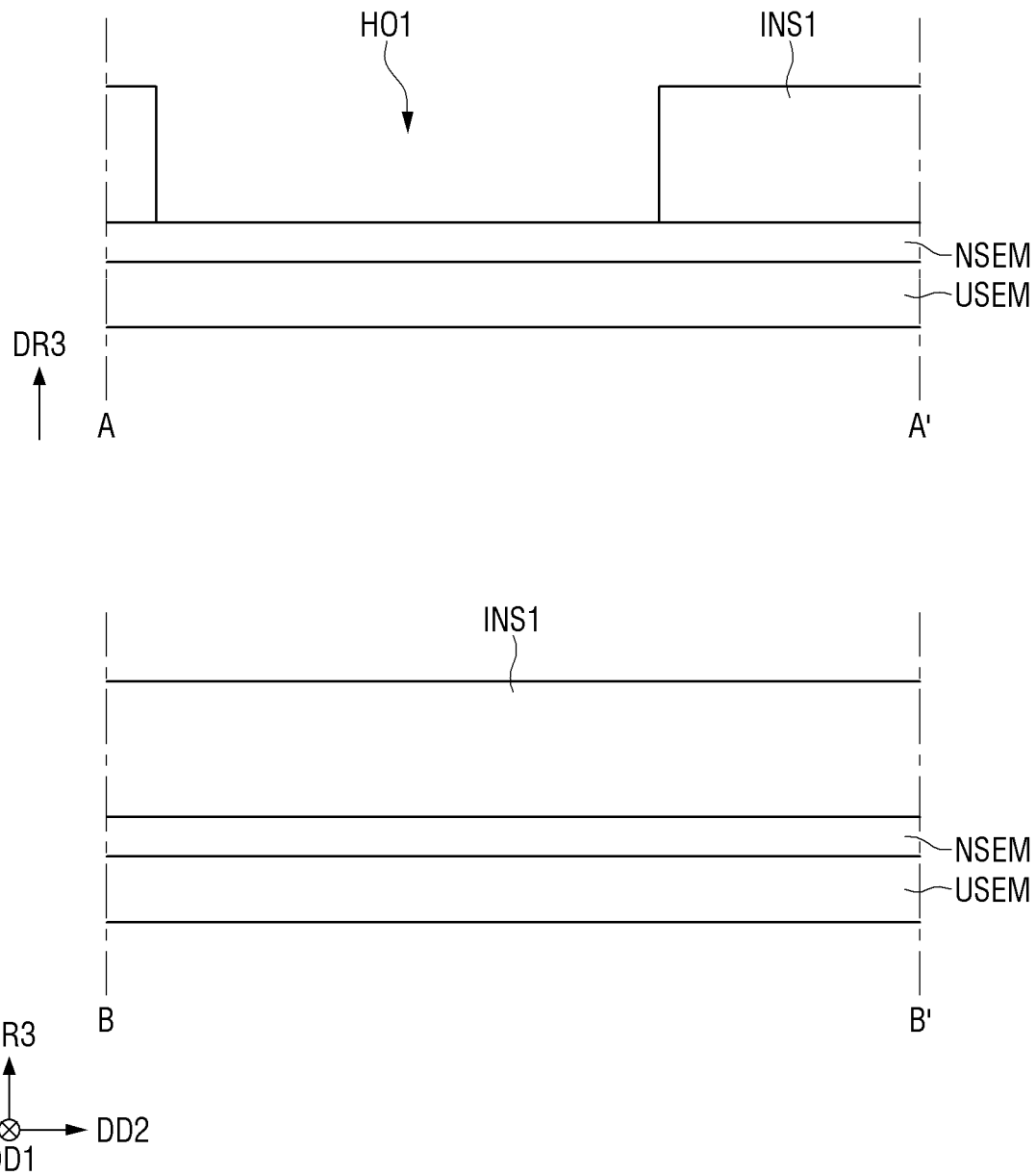
FIGS. 20 through 28 are cross-sectional views illustrating the method of FIG. 19.

First, referring to FIGS. 19 and 20, an undoped semiconductor layer USEM is formed on a light-emitting element substrate a first-type semiconductor layer NSEM is formed on the undoped semiconductor layer USEM, and a hard mask INS1 is formed on the first-type semiconductor layer NSEM (S110).

Specifically, the light-emitting element substrate may be a sapphire substrate or a silicon substrate.

The undoped semiconductor layer USEM is formed on one surface of the light-emitting element substrate. The undoped semiconductor layer USEM may be formed by growing seed crystals through epitaxial growth. For example, the undoped semiconductor layer USEM may be formed by any one of electron beam deposition, physical vapor deposition (PVD), chemical vapor deposition (CVD), plasma laser deposition (PLD), dual-type thermal evaporation, sputtering, and metal organic chemical vapor deposition (MOCVD).

The type of precursor material for forming the undoped semiconductor layer USEM is not particularly limited. For example, the precursor material may be a metal precursor including an alkyl group such as a methyl group or an ethyl group. For example, the precursor material may be a compound such as trimethyl gallium ($Ga(CH_3)_3$), trimethyl aluminum ($Al(CH_3)_3$), or triethyl phosphate ($(C_2H_5)_3PO_4$), but the present disclosure is not limited thereto.

The undoped semiconductor layer USEM may include a plurality of layers. The undoped semiconductor layer USEM may be provided to reduce the difference in lattice constant between the first-type semiconductor layer NSEM and the light-emitting element substrate. The undoped semiconductor layer USEM may include a semiconductor material not doped with an n- or p-type dopant. For example, the undoped semiconductor layer USEM may be at least one of InAlGaN, GaN, AlGaN, InGaN, AlN, and InN that are not doped, but the present disclosure is not limited thereto.

Thereafter, the first-type semiconductor layer NSEM is formed on the surface of the undoped semiconductor layer USEM. The first-type semiconductor layer NSEM may be formed in similar manner to the undoped semiconductor layer USEM, and thus, a detailed description thereof will be omitted.

The first-type semiconductor layer NSEM may include a semiconductor material doped with an n-type dopant such as Si, Ge, or Sn. For example, the first-type semiconductor layer NSEM may be at least one of InAlGaN, GaN, AlGaN, InGaN, AlN, and InN, but the present disclosure is not limited thereto.

Thereafter, the hard mask INS1 is formed on the first-type semiconductor layer NSEM. The hard mask INS1 may be formed as an inorganic film such as a $SiO_2$ film, an $Al_2O_3$ film, or a $HfO_x$ film.

Thereafter, first through holes HO1, which penetrate the hard mask INS1, are formed by photolithography.

Figure 21:
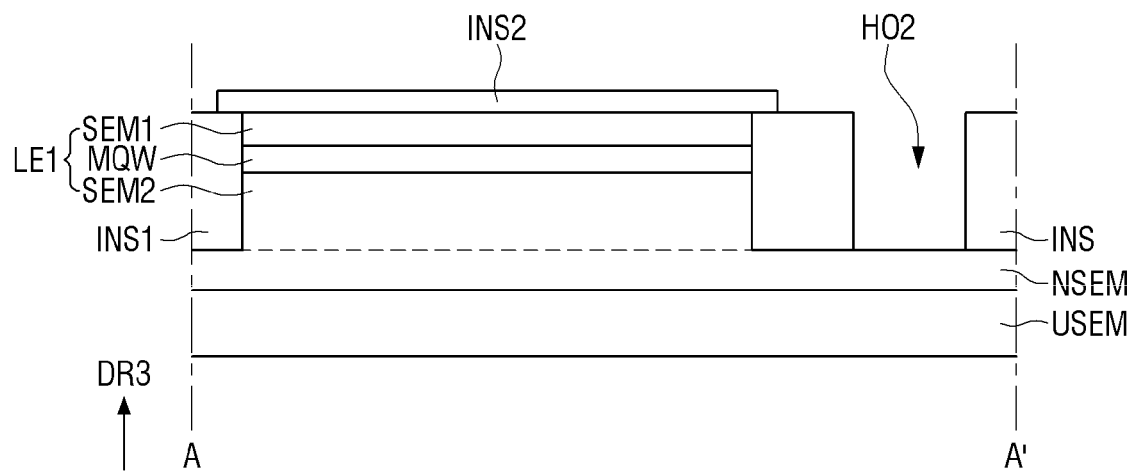
Figure 21:
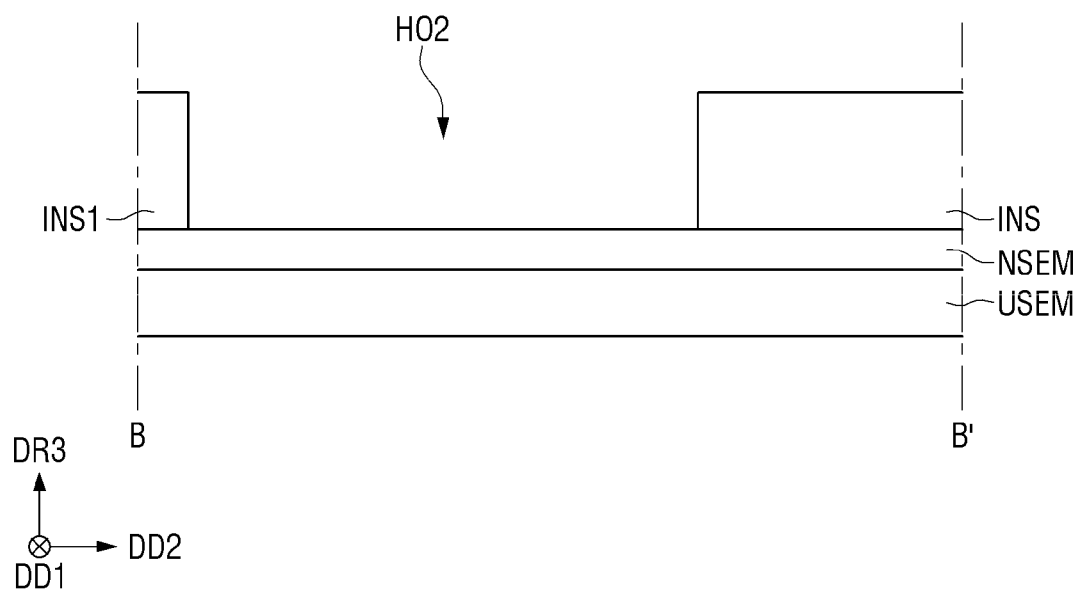

Second, referring to FIGS. 19 and 21, first light-emitting elements LE1 are formed in the first through holes HO1, a first mask pattern INS2, which covers the first light-emitting elements LE1, is formed, and second through holes HO2, which penetrate the hard mask INS1, are formed (S120).

Specifically, a second semiconductor layer SEM2 is formed on parts of the first-type semiconductor layer NSEM, exposed by the first through holes HO1. The second semiconductor layer SEM2 may include the same material as the first-type semiconductor layer NSEM.

Thereafter, a superlattice layer SLT (e.g., see, FIG. 9), an active layer MQW, an electron blocking layer EBL (e.g., see, FIG. 9), and a first semiconductor layer SEM1 are sequentially formed in the third direction DR3 in each of the first through holes HO1. In a case where the active layer MQW includes InGaN, the In content of the active layer MQW may be 35% or greater. In this manner, the first light-emitting elements LE1, which emit first light, may be formed in the first through holes HO1.

Thereafter, the first mask pattern INS2, which covers the first light-emitting elements LE1, may be formed. The first mask pattern INS2 may be formed as an inorganic film such as a $SiO_2$ film, an $Al_2O_3$ film, or a $HfO_x$ film.

Thereafter, the second through holes HO2, which penetrate the hard mask INS1, are formed by photolithography.

Figure 22:
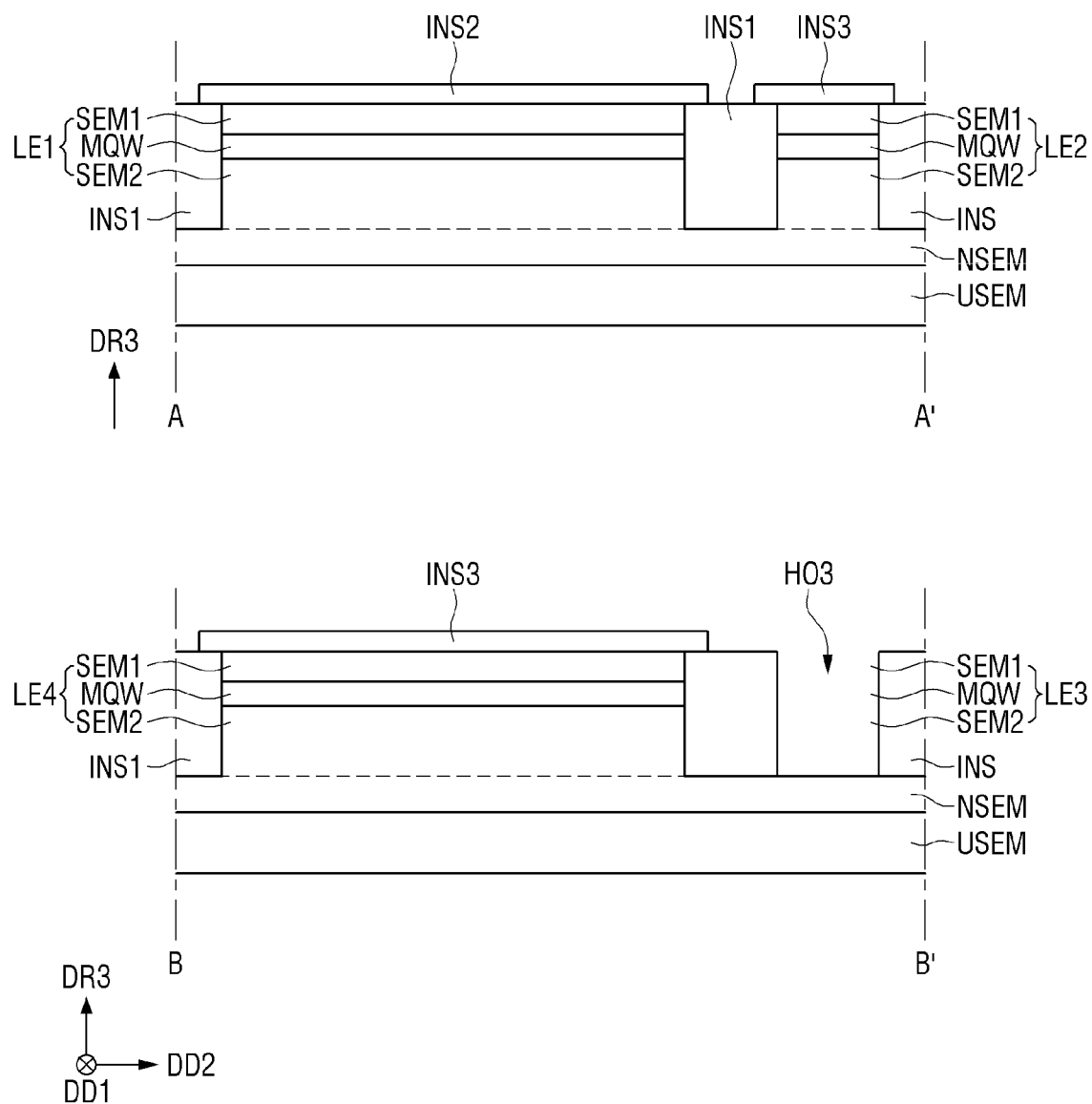

Third, referring to FIGS. 19 and 22, second light-emitting elements LE2 and fourth light-emitting elements LE4 are formed in the second through holes HO2, a second mask pattern INS3, which covers the second light-emitting elements LE2 and the fourth light-emitting elements LE4, is formed, and third through holes HO3, which penetrate the hard mask INS1, are formed (S130).

Specifically, a second semiconductor layer SEM2 is formed on parts of the first-type semiconductor layer NSEM, exposed by the second through holes HO2. The second semiconductor layer SEM2 may include the same material as the first-type semiconductor layer NSEM.

Thereafter, a superlattice layer SLT (e.g., see, FIG. 9), an active layer MQW, an electron blocking layer EBL (e.g., see, FIG. 9), and a first semiconductor layer SEM1 are sequentially formed in the third direction DR3 in each of the second through holes HO2. In a case where the active layer MQW includes InGaN, the In content of the active layer MQW may be about 25%. In this manner, the second light-emitting elements LE2 or the fourth light-emitting elements LE4, which emit second light, may be formed in the second through holes HO2.

As the first light-emitting elements LE1 are masked by the first mask pattern INS2, the second semiconductor layer SEM2, the superlattice layer SLT (e.g., see, FIG. 9), the active layer MQW, the electron blocking layer EBL (e.g., see, FIG. 9), and the first semiconductor layer SEM1 formed in each of the second through holes HO2 may not be formed on the first light-emitting elements LE1.

Thereafter, the second mask pattern INS3, which covers the second light-emitting elements LE2 and the fourth light-emitting elements LE4, may be formed. The second mask pattern INS3 may be formed as an inorganic film such as a $SiO_2$ film, an $Al_2O_3$ film, or a $HfO_x$ film.

Thereafter, the third through holes HO3, which penetrate the hard mask INS1, the first mask pattern INS2, and the second mask pattern INS3, are formed.

Figure 23:
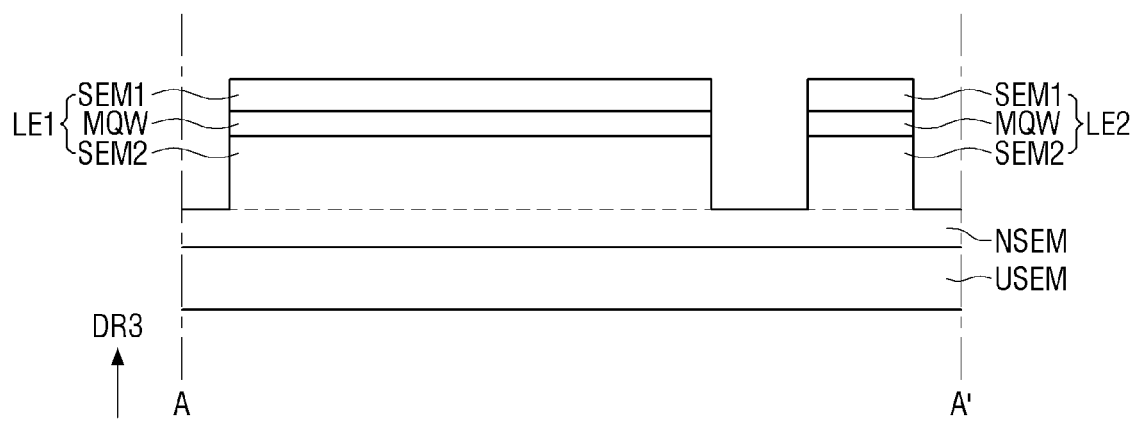
Figure 23:
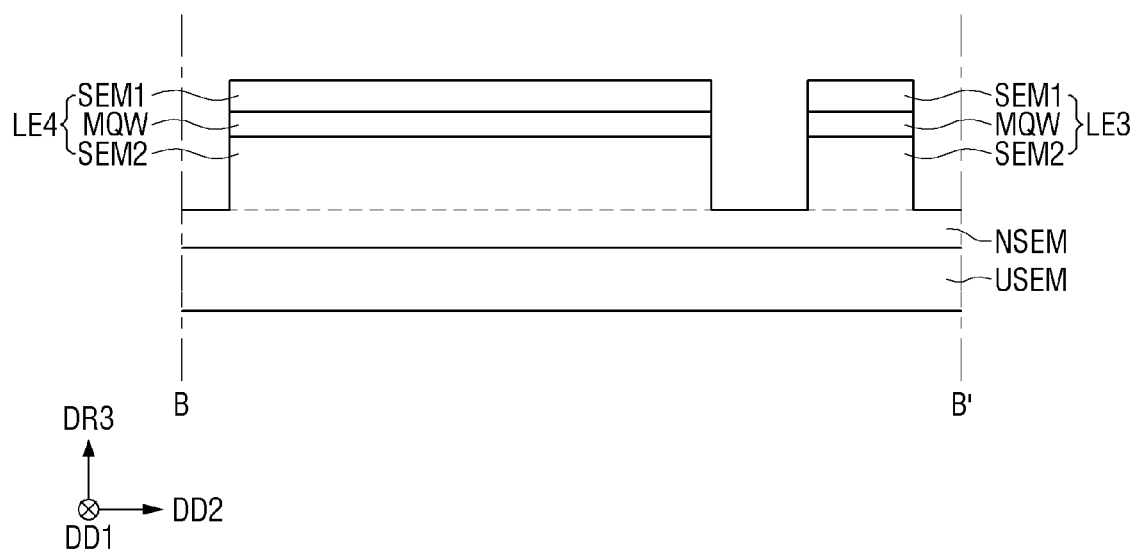

Fourth, referring to FIGS. 19 and 23, third light-emitting elements LE are formed in the third through holes HO3, and the hard mask INS1, the first mask pattern INS2, and the second mask pattern INS3 are removed (S140).

Specifically, a second semiconductor layer SEM2 is formed on parts of the first-type semiconductor layer NSEM, exposed by the third through holes HO3. The second semiconductor layer SEM2 may include the same material as the first-type semiconductor layer NSEM.

Thereafter, a superlattice layer SLT (e.g., see, FIG. 9), an active layer MQW, an electron blocking layer EBL (e.g., see, FIG. 9), and a first semiconductor layer SEM1 are sequentially formed in the third direction DR3 in each of the third through holes HO3. In a case where the active layer MQW includes InGaN, the In content of the active layer MQW may be about 15%. In this manner, the third light-emitting elements LE3, which emit third light, may be formed in the third through holes HO3.

As the first light-emitting elements LE1 are masked by the first mask pattern INS2 and the second light-emitting elements LE2 and the fourth light-emitting elements LE4 are masked by the second mask pattern INS3, the second semiconductor layer SEM2, the superlattice layer SLT (e.g., see, FIG. 9), the active layer MQW, the electron blocking layer EBL (e.g., see, FIG. 9), and the first semiconductor layer SEM1 formed in each of the third through holes HO3 may not be formed on the first light-emitting elements LE1, the second light-emitting elements LE2, and the fourth light-emitting elements LE4.

The first-type semiconductor layer NSEM may be connected to the common voltage supply units CVS in each of the first and second common voltage supply areas CVA1 and CVA2 of FIGS. 1 and 2 and may thus receive a common voltage. That is, the first-type semiconductor layer NSEM may be a common electrode layer CEL, to which the common voltage is applied.

Thereafter, the hard mask INS1, the first mask pattern INS2, and the second mask pattern INS3 may be removed by a separate etching process.

Figure 24:
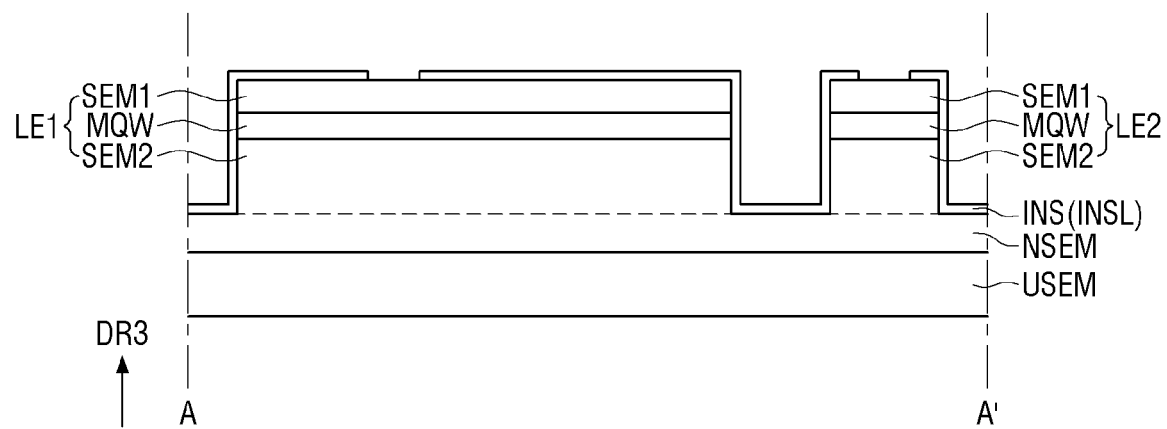
Figure 24:
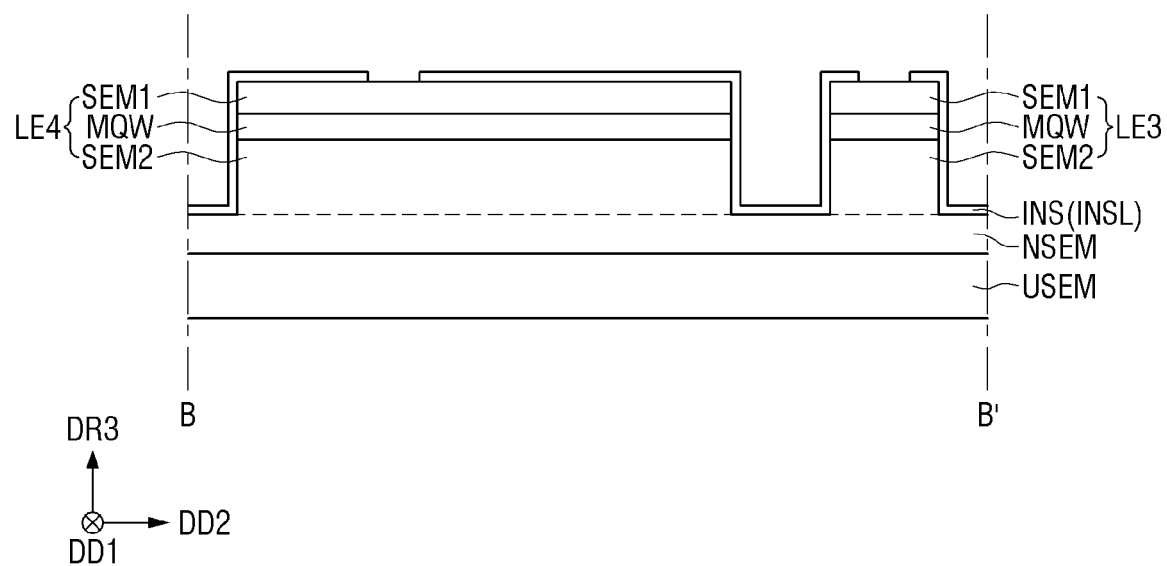

Fifth, referring to FIG. 24, an insulating film INS is formed on the first light-emitting elements LE1, the second light-emitting elements LE2, the third light-emitting elements LE3, and the fourth light-emitting elements LE4 (S150).

Specifically, an insulating material layer INSL, which covers the first light-emitting elements LE1, the second light-emitting elements LE2, the third light-emitting elements LE3, and the fourth light-emitting elements LE4, is formed. The insulating material layer INSL may be formed by a deposition method such as atomic layer deposition (ALD) or CVD. The insulating material layer INSL may be formed as an inorganic film such as a $SiO_2$ film, an $Al_2O_3$ film, or a $HfO_x$ film.

Thereafter, an insulating film INS is formed by etching the insulating material layer INSL to expose parts of the top surfaces of the first light-emitting elements LE1, the second light-emitting elements LE2, the third light-emitting elements LE3, and the fourth light-emitting elements LE4. The insulating film INS may be disposed on the side surfaces, and a portion of the top surface, of each of the first light-emitting elements LE1, the second light-emitting elements LE2, the third light-emitting elements LE3, and the fourth light-emitting elements LE4.

Figure 25:
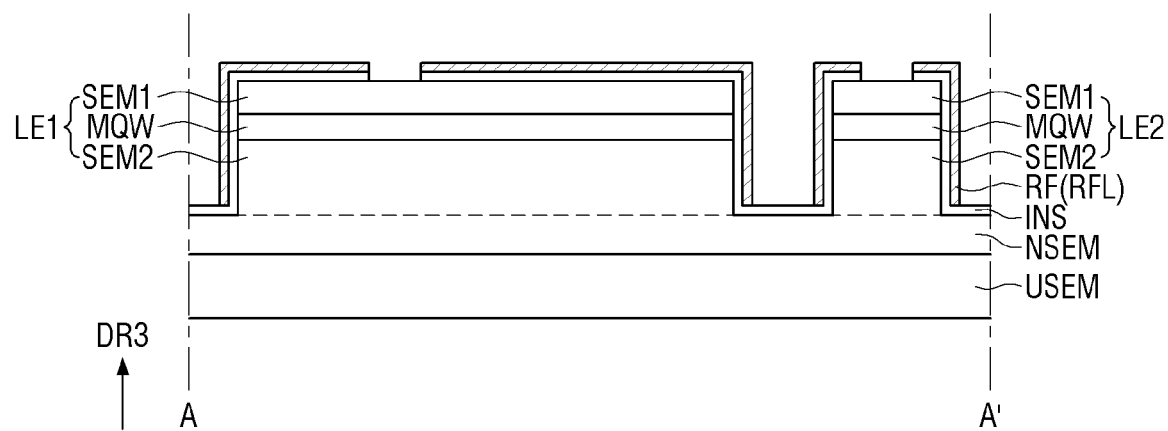
Figure 25:
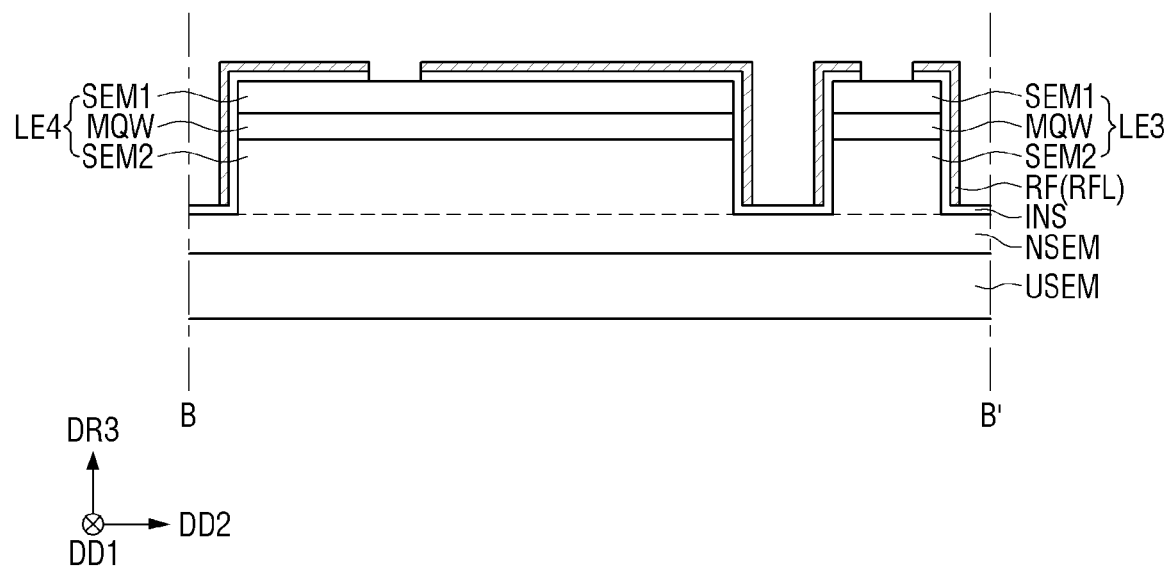

Sixth, referring to FIGS. 19 and 25, a reflective film RF is formed on the insulating film INS (S160).

Specifically, a reflective material layer RFL, which covers the first light-emitting elements LE1, the second light-emitting elements LE2, the third light-emitting elements LE3, and the fourth light-emitting elements LE4, is formed. The reflective material layer RFL may be formed by a metal deposition method such as sputtering. The reflective material layer RFL may include a metallic material with high reflectance such as Al or Ag. Alternatively, to realize a distributed Bragg reflector, the reflective material layer RFL may be formed to have a structure in which a plurality of high refractive index layers and a plurality of low refractive index layers are alternately stacked.

Thereafter, the reflective film RF is formed by etching the reflective material layer RFL to expose parts of the top surfaces of the first light-emitting elements LE1, the second light-emitting elements LE2, the third light-emitting elements LE3, and the fourth light-emitting elements LE4. The reflective film RF may be disposed on the side surfaces, and a portion of the top surface, of each of the first light-emitting elements LE1, the second light-emitting elements LE2, the third light-emitting elements LE3, and the fourth light-emitting elements LE4.

Figure 26:
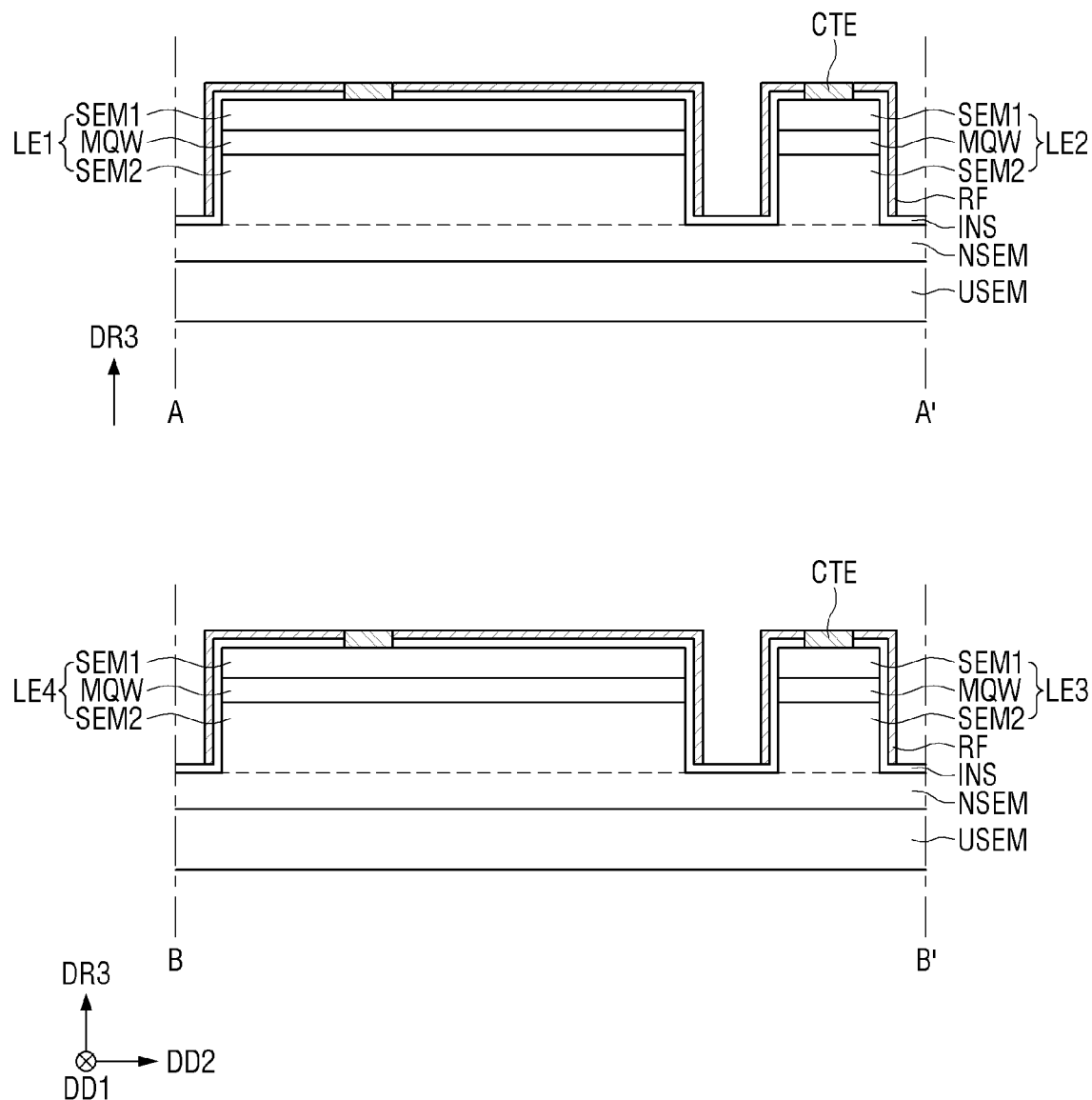

Seventh, referring to FIGS. 19 and 26, contact electrodes CTE are formed on the top surfaces of the first light-emitting elements LE1, the second light-emitting elements LE2, the third light-emitting elements LE3, and the fourth light-emitting elements LE4 (S170).

Specifically, the contact electrodes CTE are formed on parts of the top surfaces of the first light-emitting elements LE1, the second light-emitting elements LE2, the third light-emitting elements LE3, and the fourth light-emitting elements LE4, not covered but exposed by the insulating film INS and the reflective film RF, through photolithography.

The contact electrodes CTE may be formed in S170 after the formation of the insulating film INS and the reflective film RF in S150 and S160, but the present disclosure is not limited thereto. Alternatively, the contact electrodes CTE may be formed on the top surfaces of the first light-emitting elements LE1, the second light-emitting elements LE2, the third light-emitting elements LE3, and the fourth light-emitting elements LE4, and then, the insulating film INS and the reflective film RF may be formed.

Figure 27:
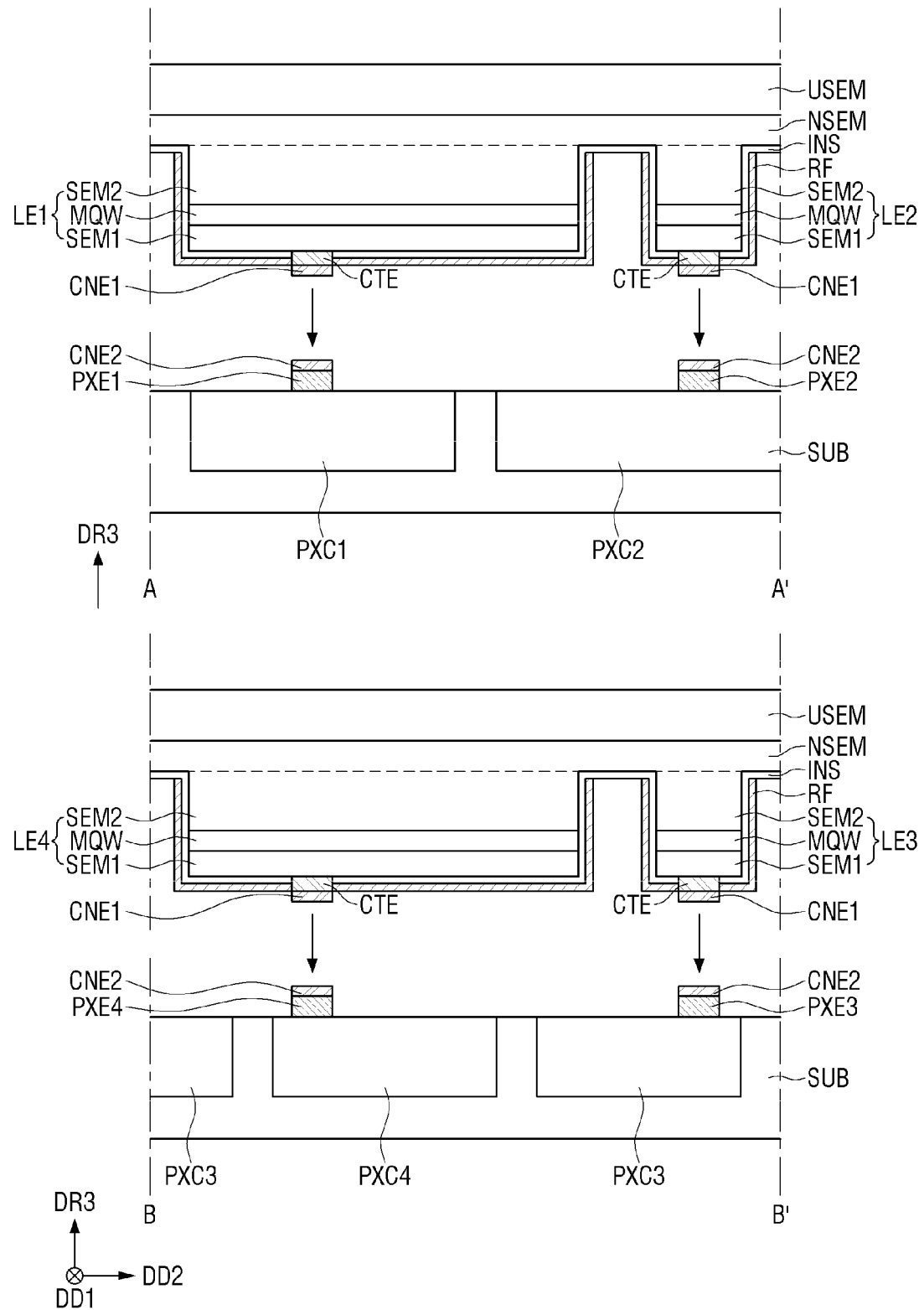

Eighth, referring to FIGS. 19 and 27, first pixel connecting electrodes CNE1 are formed on the contact electrodes CTE, and second pixel connecting electrodes CNE2 are formed on pixel electrodes (PXE1, PXE2, PXE3, and PXE4) of a semiconductor circuit board (S180).

Specifically, the first pixel connecting electrodes CNE1 and the second pixel connecting electrodes CNE2 may be formed by photolithography. The first pixel connecting electrodes CNE1 and the second pixel connecting electrodes CNE2 may include Au, Cu, an alloy of Au and Sn, an alloy of Ag and Sn, or an alloy of Sn, Au, or Cu.

Figure 28:
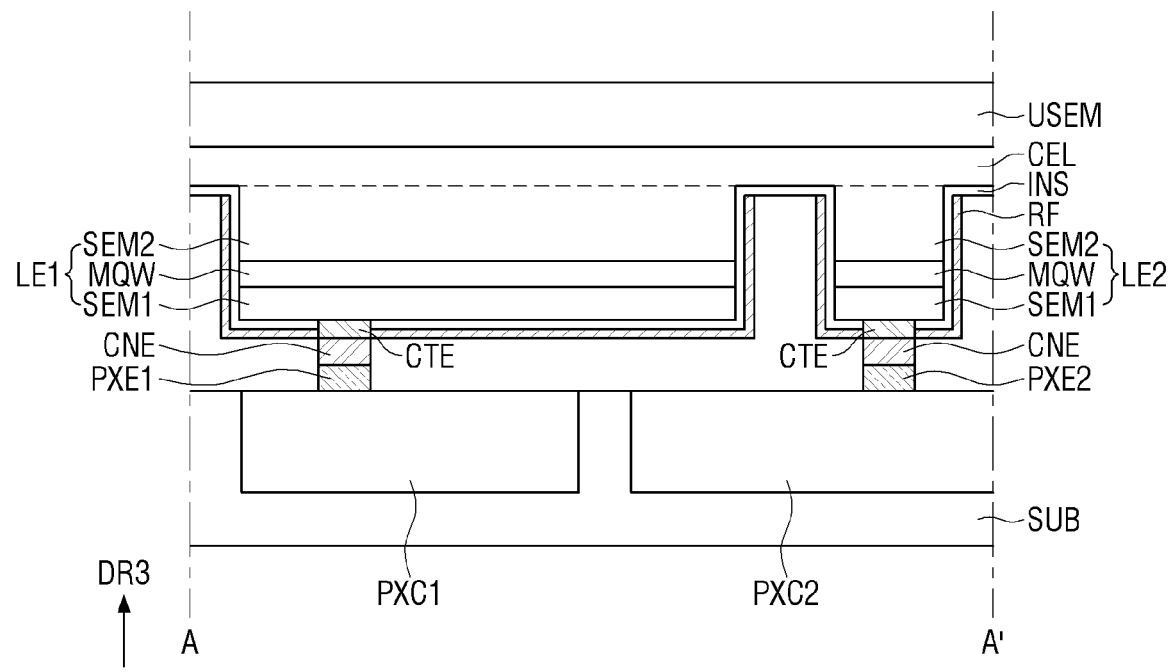
Figure 28:
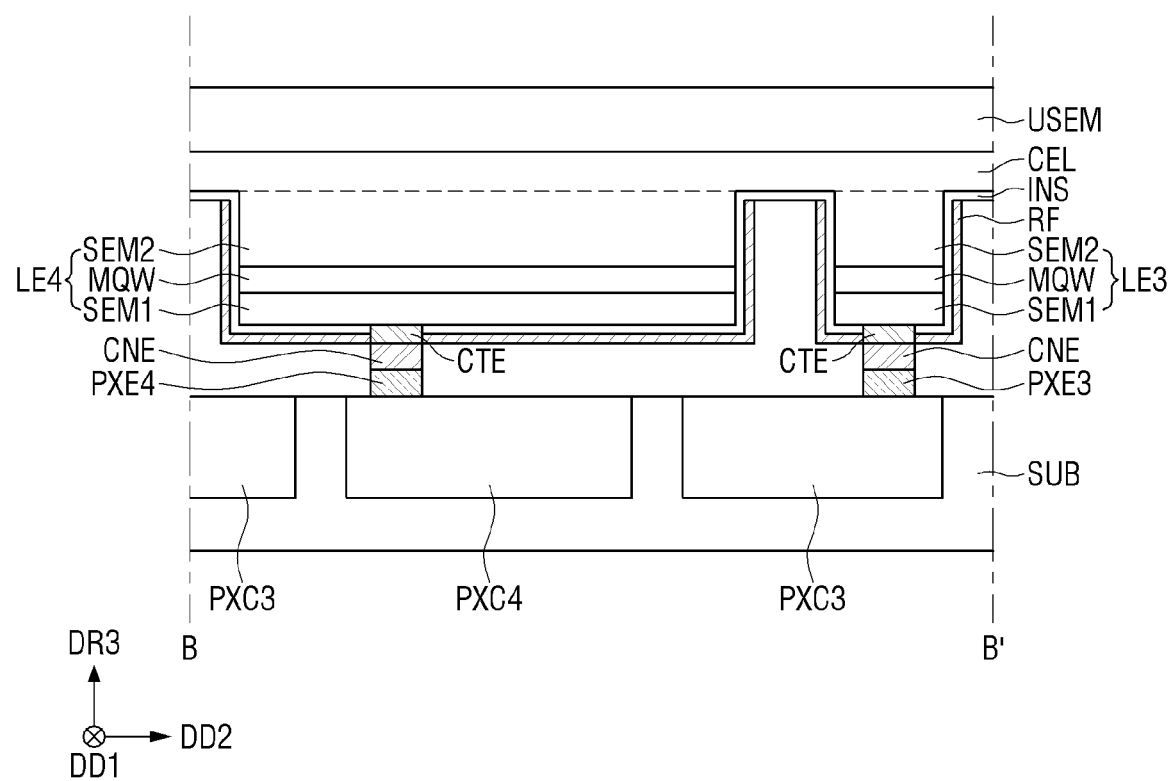

Ninth, referring to FIGS. 19 and 28, a substrate SUB and the light-emitting element substrate are aligned using first alignment marks of the substrate SUB and second alignment marks of the light-emitting element substrate and are then bonded together by bonding the first pixel connecting electrodes CNE1 and the second pixel connecting electrodes CNE2 together (S190).

The first alignment marks may be disposed at the corners of the substrate SUB, and the second alignment marks may be disposed at the corners of the light-emitting element substrate. The alignment between the first alignment marks and the second alignment marks may be identified using an alignment camera (ACAM).

After the alignment of the first alignment marks with the second alignment marks, the first pixel connecting electrodes CNE1 may be placed in contact with the second pixel connecting electrodes CNE2. Thereafter, connecting electrodes CNE may be formed by fusion-bonding the first pixel connecting electrodes CNE1 and the second pixel connecting electrodes CNE2 at a suitable temperature (e.g., a set or predetermined temperature). That is, the connecting electrodes CNE may function as bonding metals for bonding the pixel electrodes (PXE1, PXE2, PXE3, and PXE4) of the substrate SUB and light-emitting elements (LE1, LE2, LE3, and LE4) of the light-emitting element substrate.

Thereafter, the gaps between the pixel electrodes (PXE1, PXE2, PXE3, and PXE4) of the substrate SUB and the light-emitting elements (LE1, LE2, LE3, and LE4) of the light-emitting element substrate may be filled with a filler layer The filler layer may include a non-conductive paste such as, for example, an epoxy-based thermosetting material. Alternatively, the filler layer may include a $SiO_2$ film.

Thereafter, the light-emitting element substrate may be removed. The light-emitting element substrate may be separated from the undoped semiconductor layer USEM by a laser lift-off (LLO) process.

Figure 29:
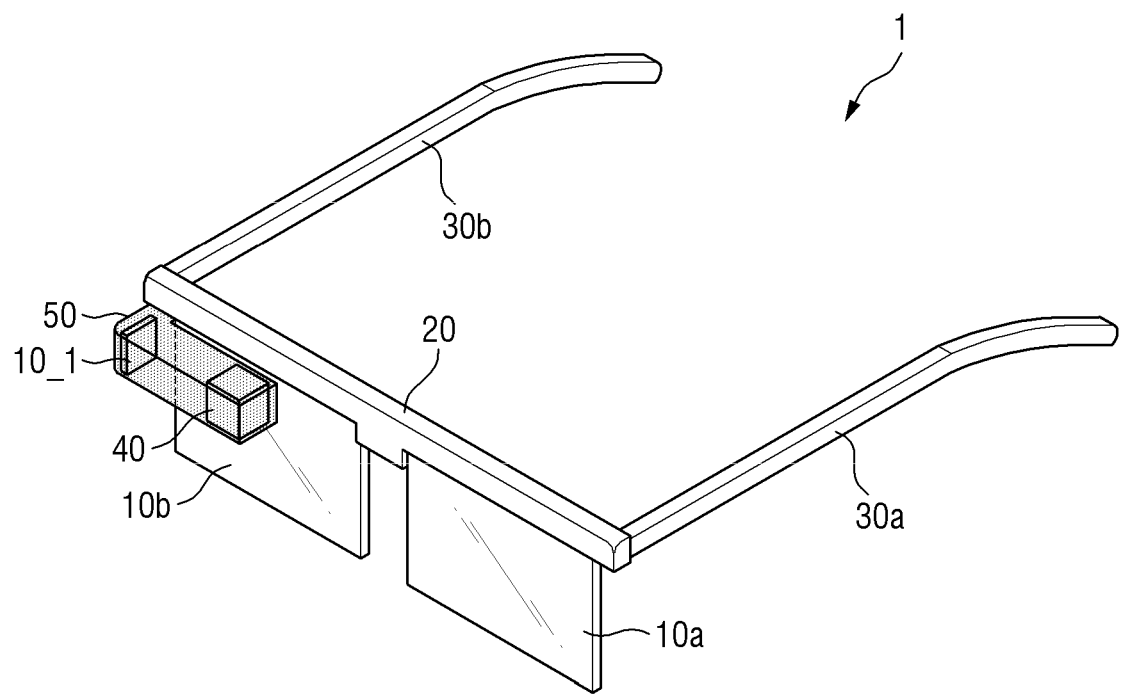
FIG. 29 is a perspective view of a virtual reality (VR) device including a display device according to one or more embodiments of the present disclosure.

FIG. 29 is a perspective view of a virtual reality (VR) device a display device according to one or more embodiments of the present disclosure. FIG. 29 illustrates a VR device 1, to which a display device 10_1 is applied.

Referring to FIG. 29, the VR device 1 may be an eyeglass-type device. The VR device 1 may include the display device 10_1, a left-eye lens 10*a*, a right-eye lens 10*b*, a support frame 20, eyeglass temples 30*a* and 30*b*, a reflective member 40, and a display device storage compartment 50.

FIG. 29 illustrates the VR device 1 including the eyeglass temples 30*a* and 30*b*, but the VR device 1 may also be applicable to a head-mounted display (HMD) including a headband that can be worn on the head, instead of the eyeglass temples 30*a* and 30*b*. That is, the VR device 1 is not particularly limited to that illustrated in FIG. 29 and may be applicable to various types of electronic devices.

The display device storage compartment 50 may include the display device 10_1 and the reflective member 40. An image displayed by the display device 10_1 may be reflected by the reflective member 40 and may thus be provided to the right eye of a user through the right-eye lens 10*b*. Thus, the user may view a VR image, displayed by the display device 10_1, through his or her right eye.

FIG. 29 illustrates that the display device storage compartment 50 is disposed at the right end of the support frame 20, but the present disclosure is not limited thereto. Alternatively, the display device storage compartment 50 may be disposed at the left end of the support frame 20, in which case, an image displayed by the display device 10_1 may be reflected by the reflective member 40 and may thus be provided to the right eye of the user through the left-eye lens 10*a*. Yet alternatively, two display device storage compartments 50 may be disposed at both the left and right ends of the support frame 20, in which case, the user may view a VR image, displayed by the display device 10_1, through both his or her left and right eyes.

Figure 30:
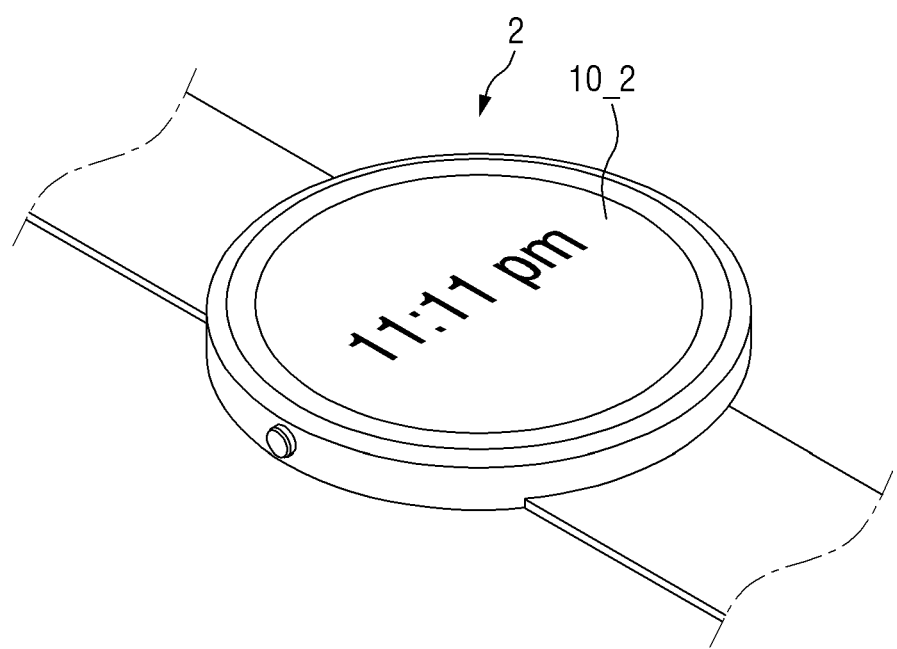
FIG. 30 is a perspective view of a smart device including a display device according to one or more embodiments of the present disclosure.

FIG. 30 is a perspective view of a smart device including a display device according to one or more embodiments of the present disclosure.

Referring to FIG. 30, a display device 10_2 may be applied to a smartwatch 2, which is a type of smart device.

Figure 31:
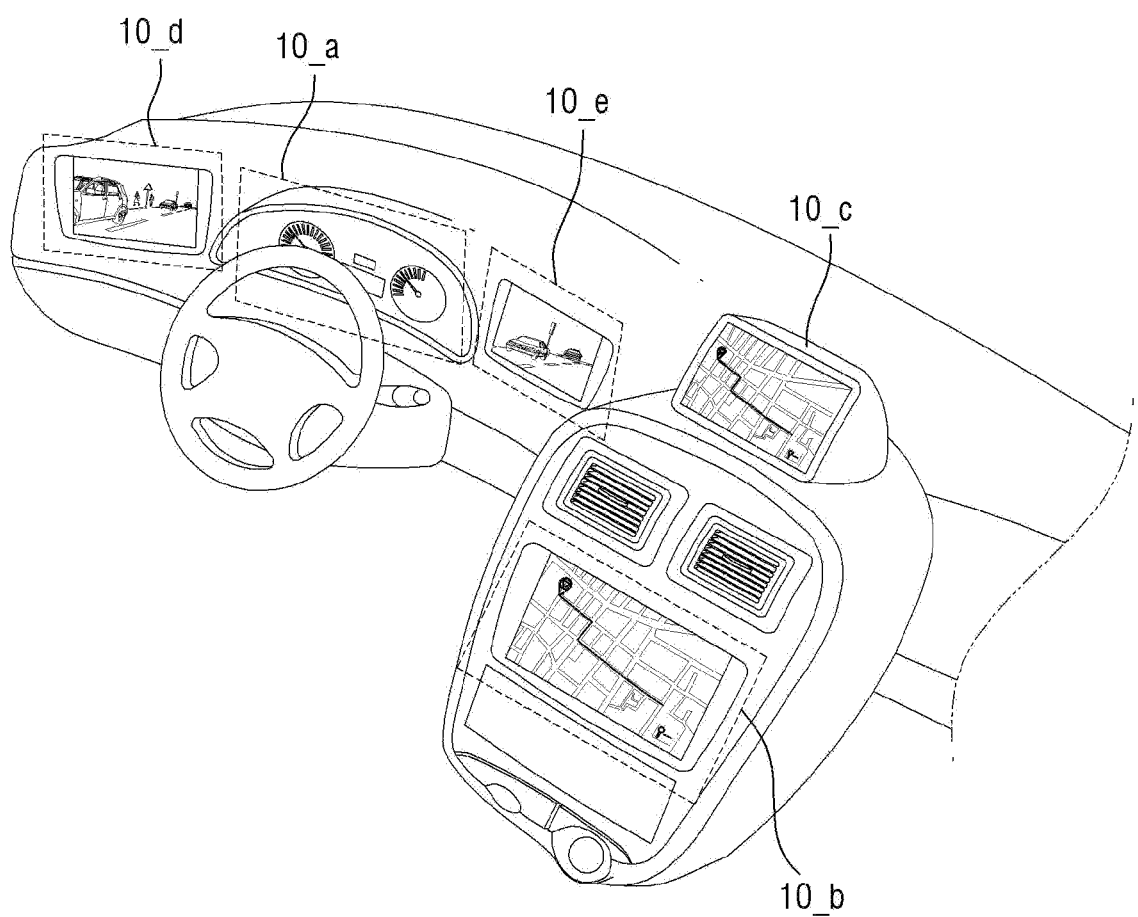
FIG. 31 is a perspective view of a dashboard and a center console of an automobile including display devices according to one or more embodiments of the present disclosure.

FIG. 31 is a perspective view of a dashboard and a center console of an automobile including display devices according to one or more embodiments of the present disclosure. FIG. 31 illustrates an automobile, to which display devices **10_*a*, 10_*b*, 10_*c*, 10_*d*, and 10_*e*** are applied.

Referring to FIG. 31, the display devices **10_*a*, 10_*b*, and 10_*c* may be applied to the dashboard or center console of an automobile or to a center information display (CID) in the dashboard of an automobile. The display devices 10_*d* and 10_*e*** may be applied to room mirror displays that can replace the rear view mirrors of an automobile.

Figure 32:
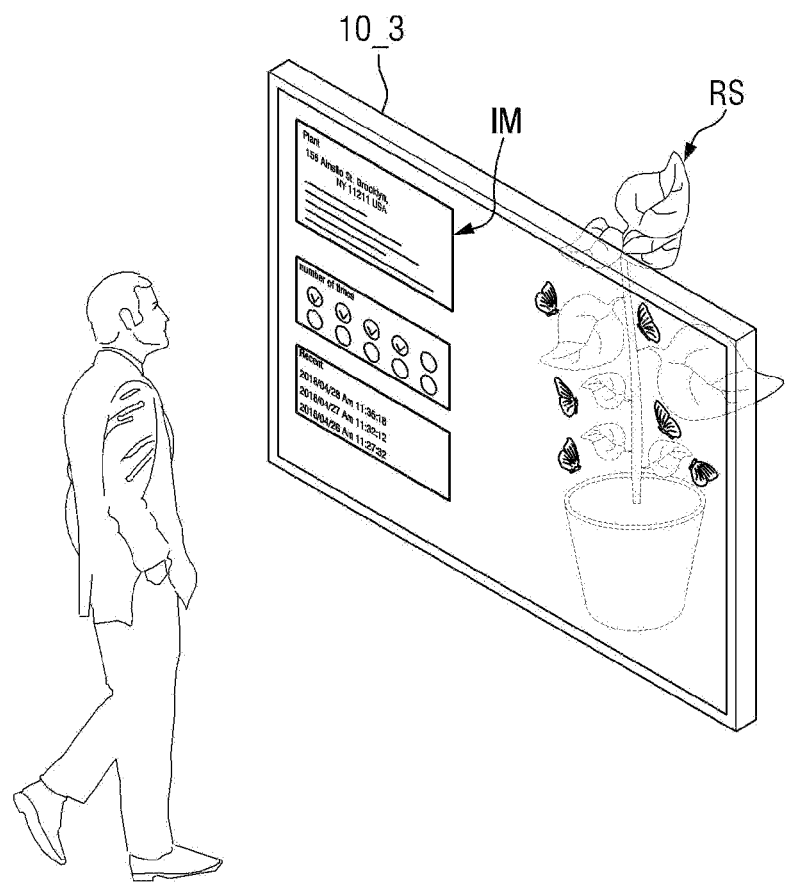
FIG. 32 is a transparent display device including a display device according to one or more embodiments of the present disclosure.

FIG. 32 is a transparent display device including a display device according to one or more embodiments of the present disclosure.

Referring to FIG. 32, a display device 10_3 may be applied to a transparent display device. The transparent display device may display an image IM and at the same time, transmit light therethrough. Thus, a user at the front of the transparent display device may view not only the image IM on the display device 10_3, but also an object RS or the background at the rear of the transparent display device. In a case where the display device 10_3 is applied to the transparent display device, the substrate (SUB of FIG. 8) of the display device 10_3 may include light-transmitting parts capable of transmitting light therethrough or may be formed of a material capable of transmitting light therethrough.

However, the aspects and features of embodiments of the present disclosure are not limited to the one set forth herein. The above and other aspects and features of embodiments of the present disclosure will become more apparent to one of daily skill in the art to which the present disclosure pertains by referencing the claims, with functional equivalents thereof to be included therein.

What is claimed is:

1. A display device comprising:
a first pixel circuit unit, a second pixel circuit unit, a third pixel circuit unit, and a fourth pixel circuit unit spaced from one another;
a first pixel electrode on the first pixel circuit unit;
a second pixel electrode on the second pixel circuit unit;
a third pixel electrode on the third pixel circuit unit;
a fourth pixel electrode on the fourth pixel circuit unit;
a first light-emitting element electrically connected to the first pixel electrode, the first light-emitting element being configured to emit first light;
a second light-emitting element electrically connected to the second pixel electrode, the second light-emitting element being configured to emit second light that has a different color from the first light; and
a third light-emitting element electrically connected to the third pixel electrode, the third light-emitting element being configured to emit third light that has a different color from the first light and the second light, wherein:
a length of the first light-emitting element in a first direction is greater than each of a length of the second light-emitting element and a length of the third light-emitting element in the first direction;
a length of the first light-emitting element in a second direction is greater than a length of the third light-emitting element in the second direction;
the lengths of the second light-emitting element and the third light-emitting element in the first direction are the same as each other and the second light-emitting element and the third light-emitting element are immediately adjacent to each other in the second direction; and
the second direction is orthogonal to the first direction.

2. The display device of claim 1, wherein:
the length of the first light-emitting element in the second direction is the same as a length of the second light-emitting element in the second direction.

3. The display device of claim 1, wherein:
the length of the first light-emitting element in the first direction is 1.5 times or greater each of the length of the second light-emitting element and the length of the third light-emitting element in the first direction; and
the length of the first light-emitting element in the second direction is 1.5 times or greater the length of the third light-emitting element in the second direction.

4. The display device of claim 1, wherein:
the first light is light of a red wavelength range;
the second light is light of a green wavelength range; and
the third light is light of a blue wavelength range.

5. The display device of claim 1, wherein:
the first pixel electrode is located close to a first side of the first pixel circuit unit;
the second pixel electrode is located close to a second side of the second pixel circuit unit; and
the second side of the second pixel circuit unit is opposite to a first side of the second pixel circuit unit that is close to the first side of the first pixel circuit unit.

6. The display device of claim 5, further comprising:
a fourth light-emitting element electrically connected to the fourth pixel electrode, the fourth light-emitting element being configured to emit the second light, wherein:
the third pixel electrode is located close to middle parts of the third pixel circuit unit;
the fourth pixel electrode is located close to a second side of the fourth pixel circuit unit; and
the second side of the fourth pixel circuit unit are opposite to a first side of the fourth pixel circuit unit that is close to the first side of the first pixel circuit unit.

7. The display device of claim 1, further comprising:
a first pixel connecting electrode located between the first pixel electrode and the first light-emitting element; and
a second pixel connecting electrode located between the second pixel electrode and the second light-emitting element.

8. The display device of claim 7, wherein:
the first pixel connecting electrode extends to first side of the first pixel circuit unit;
the second pixel connecting electrode extends to second side of the second pixel circuit unit; and
the second side of the second pixel circuit unit is opposite to first side of the second pixel circuit unit that are close to the first side of the first pixel circuit unit.

9. The display device of claim 7, further comprising:
a fourth light-emitting element electrically connected to the fourth pixel electrode, the fourth light-emitting element being configured to emit the second light;
a third pixel connecting electrode located between the third pixel electrode and the third light-emitting element; and
a fourth pixel connecting electrode located between the fourth pixel electrode and the fourth light-emitting element.

10. The display device of claim 9, wherein:
the third pixel connecting electrode is located close to middle parts of the third pixel circuit unit;
the fourth pixel connecting electrode extends to second side of the fourth pixel circuit unit; and
the second side of the fourth pixel circuit unit is opposite to first side of the fourth pixel circuit unit that is close to first side of the first pixel circuit unit.

11. The display device of claim 9, wherein an area of the first pixel connecting electrode is greater than each an area of the second pixel connecting electrode, an area of the third pixel connecting electrode, and an area of the fourth pixel connecting electrode.

12. The display device of claim 9, wherein an area of the third pixel connecting electrode is smaller than each of an area of the first pixel connecting electrode, an area of the second pixel connecting electrode, and an area of the fourth pixel connecting electrode.

* * * * *